(12) United States Patent
Chang et al.

(10) Patent No.: US 11,823,981 B2
(45) Date of Patent: *Nov. 21, 2023

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Wei-Chung Chang, Hsinchu (TW); Ming-Che Ho, Tainan (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/458,610

(22) Filed: Aug. 27, 2021

(65) Prior Publication Data

US 2023/0069737 A1  Mar. 2, 2023

(51) Int. Cl.
*H01L 23/48* (2006.01)
*H01L 21/768* (2006.01)
*H01L 21/285* (2006.01)
*H01L 23/31* (2006.01)

(52) U.S. Cl.
CPC ........ *H01L 23/481* (2013.01); *H01L 21/2855* (2013.01); *H01L 21/76879* (2013.01); *H01L 23/3157* (2013.01)

(58) Field of Classification Search
CPC ........... H01L 21/2855; H01L 21/76879; H01L 23/3157

USPC ......................................................... 257/774
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2016/0111380 A1* | 4/2016 | Sundaram ......... H01L 23/49822 438/126 |
| 2021/0296211 A1* | 9/2021 | Seo ..................... H01L 23/3128 |

* cited by examiner

*Primary Examiner* — Quoc D Hoang
(74) *Attorney, Agent, or Firm* — JCIPRNET

(57) ABSTRACT

A semiconductor package includes a substrate, a composite seed-barrier layer, a routing via, and a semiconductor die. The substrate has a through hole formed therethrough. The composite seed-barrier layer extends on sidewalls of the through hole and includes a first barrier layer, a seed layer, and a second barrier layer sequentially stacked on the sidewalls of the through hole. The routing via fills the through hole and is separated from the substrate by the composite seed-barrier layer. The semiconductor die is electrically connected to the routing via. Along the sidewalls of the through holes, at a level height corresponding to half of a total thickness of the substrate, the seed layer is present as inclusions of seed material surrounded by barrier material of the first barrier layer and the second barrier layer.

20 Claims, 44 Drawing Sheets

SP14

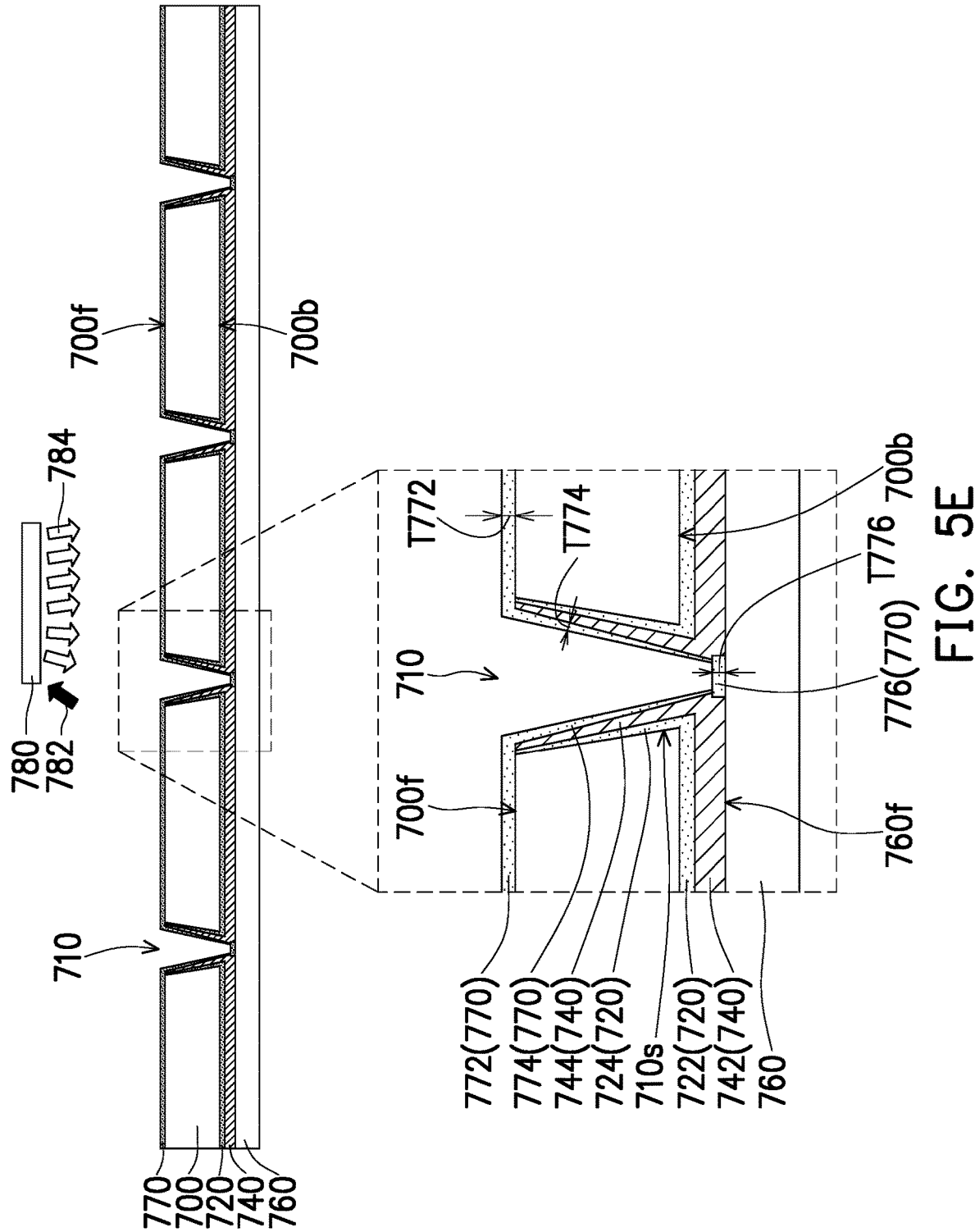

SEMICONDUCTOR PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 5L are schematic cross-sectional views illustrating structures formed during a manufacturing process of a semiconductor package according to some embodiments of the disclosure.

DETAILED DESCRIPTION

Figure 1:
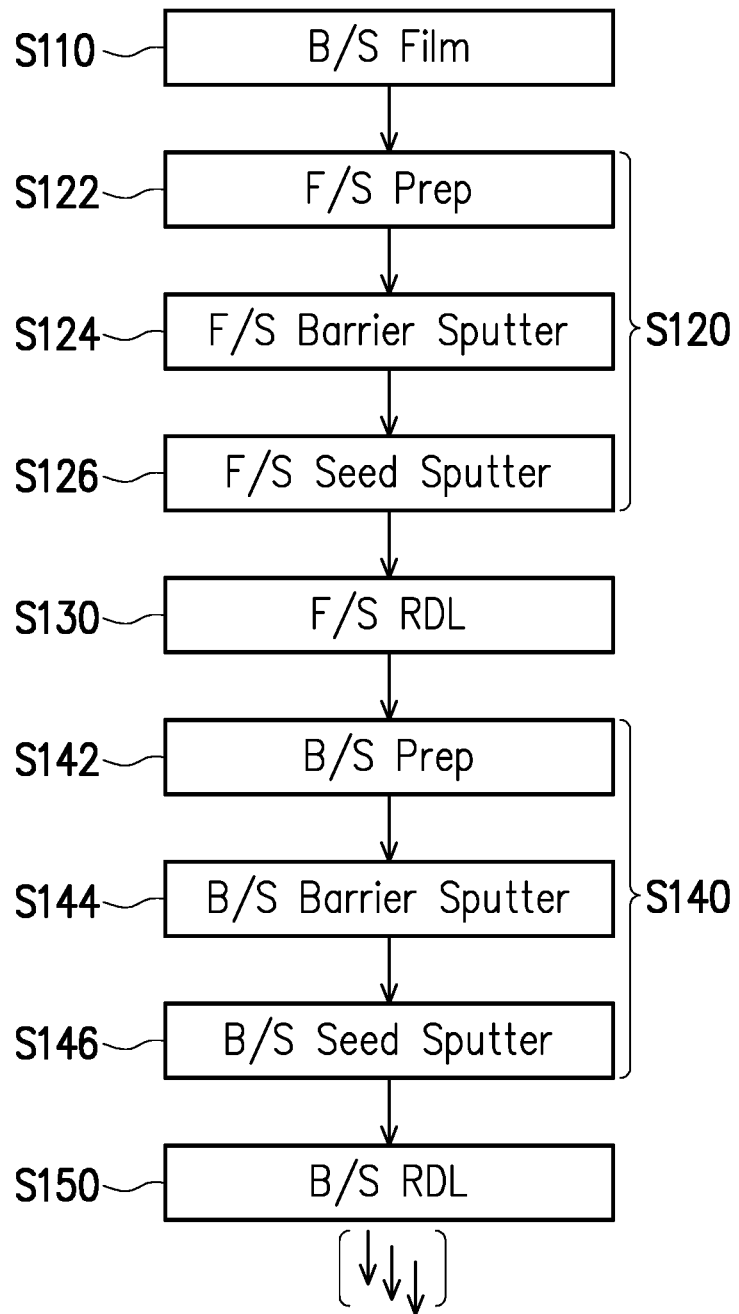
FIG. 1 is a schematic flow chart illustrating some steps of a manufacturing method of a semiconductor package according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
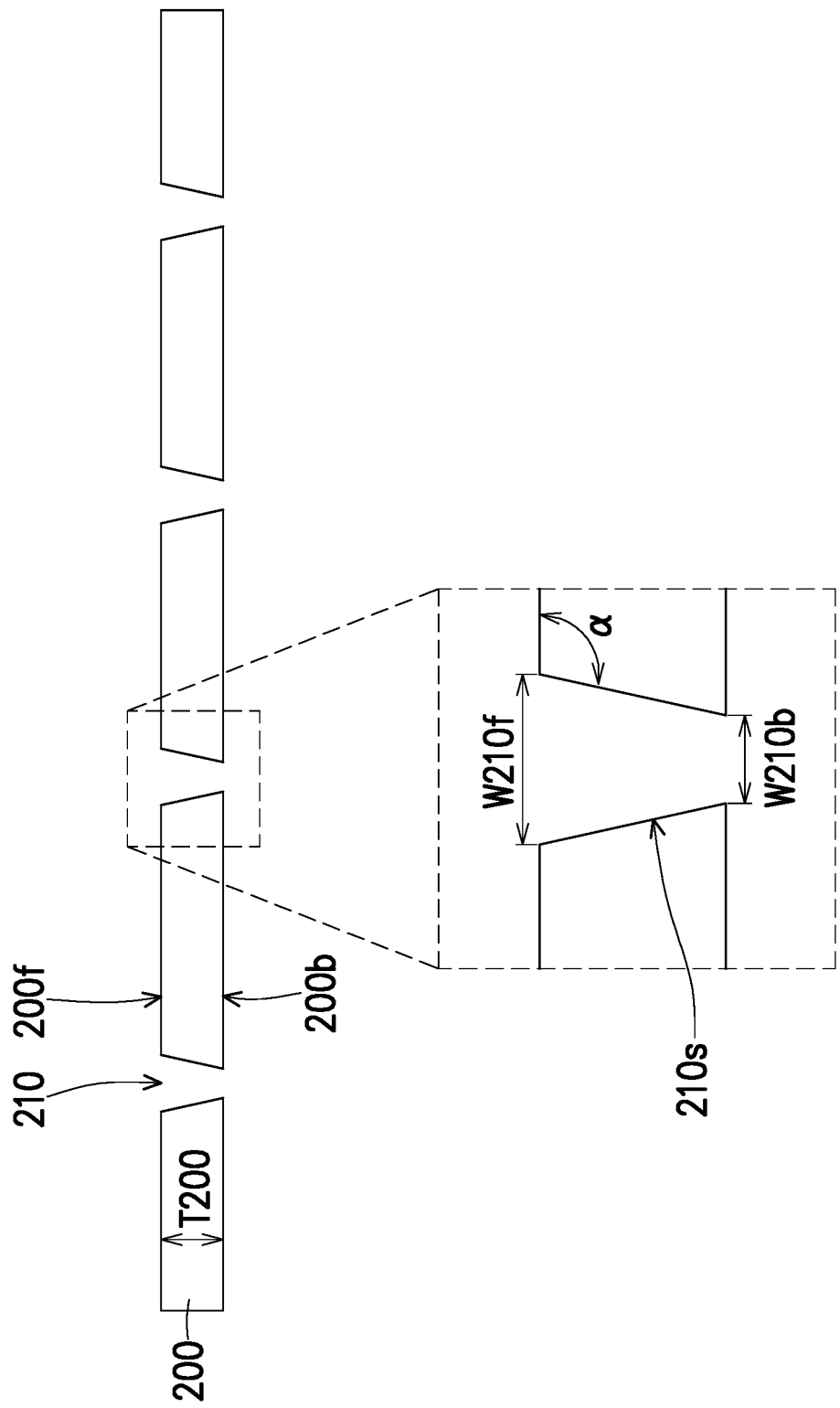
FIG. 2A to FIG. 2T are schematic cross-sectional views illustrating structures formed during a manufacturing process of a semiconductor package according to some embodiments of the disclosure.

FIG. 1 is a schematic flow chart illustrating some steps of a manufacturing method of a semiconductor package SP10 according to some embodiments of the disclosure. FIG. 2A to FIG. 2T are schematic cross-sectional views illustrating structures formed during a manufacturing process of the semiconductor package SP10 according to some embodiments of the disclosure. In FIG. 2A, a substrate 200 (e.g., an interposer) is provided. In some embodiments, the substrate 200 is a wafer of an inorganic material. For example, the substrate 200 may be a wafer including a ceramic material. Examples of ceramic materials include metal oxides such as binary oxides (e.g., silicon oxide, barium oxide, aluminum oxide, zirconium oxide, beryllium oxide, zinc oxide, neodymium oxide, etc.) as well as ternary or higher oxides (e.g., titanates, aluminates, silicates, doped metal oxides, etc.), nitrides (e.g., silicon nitride, aluminum nitride, etc.), carbides (e.g., silicon carbides), etc. These materials may be used alone, or in combinations of two or more. In some embodiments, the substrate 200 includes aluminum nitride.

In some embodiments, through holes 210 are formed in the substrate 200, extending all the way from the frontside surface 200f of the substrate 200 to the opposite backside surface 200b, for the entire thickness T200 of the substrate 200. In some embodiments, the through holes 210 are formed by laser drilling. For example, the material of the substrate 200 may be ablated by firing a laser towards the substrate 200 in the intended locations of the through holes 210 from the side of the frontside surface 200f. This may result in the through holes 210 having tapered sidewalls 210s, so that a width W210f of the through holes 210 at the frontside surface 200f of the substrate 200 is greater than a width W210b of the through holes 210 at the backside surface 200b of the substrate 200. Alternatively stated, the through holes 210 may become narrower proceeding from the frontside surface 200f towards the backside surface 200b along the thickness direction of the substrate 200. The tapering angle α defined by the frontside surface 200f of the substrate 200 and the sidewalls 210s of the through holes 210 may be greater than 90 degrees, for example in the range between 90 degrees and 120 degrees.

Figure 2B:
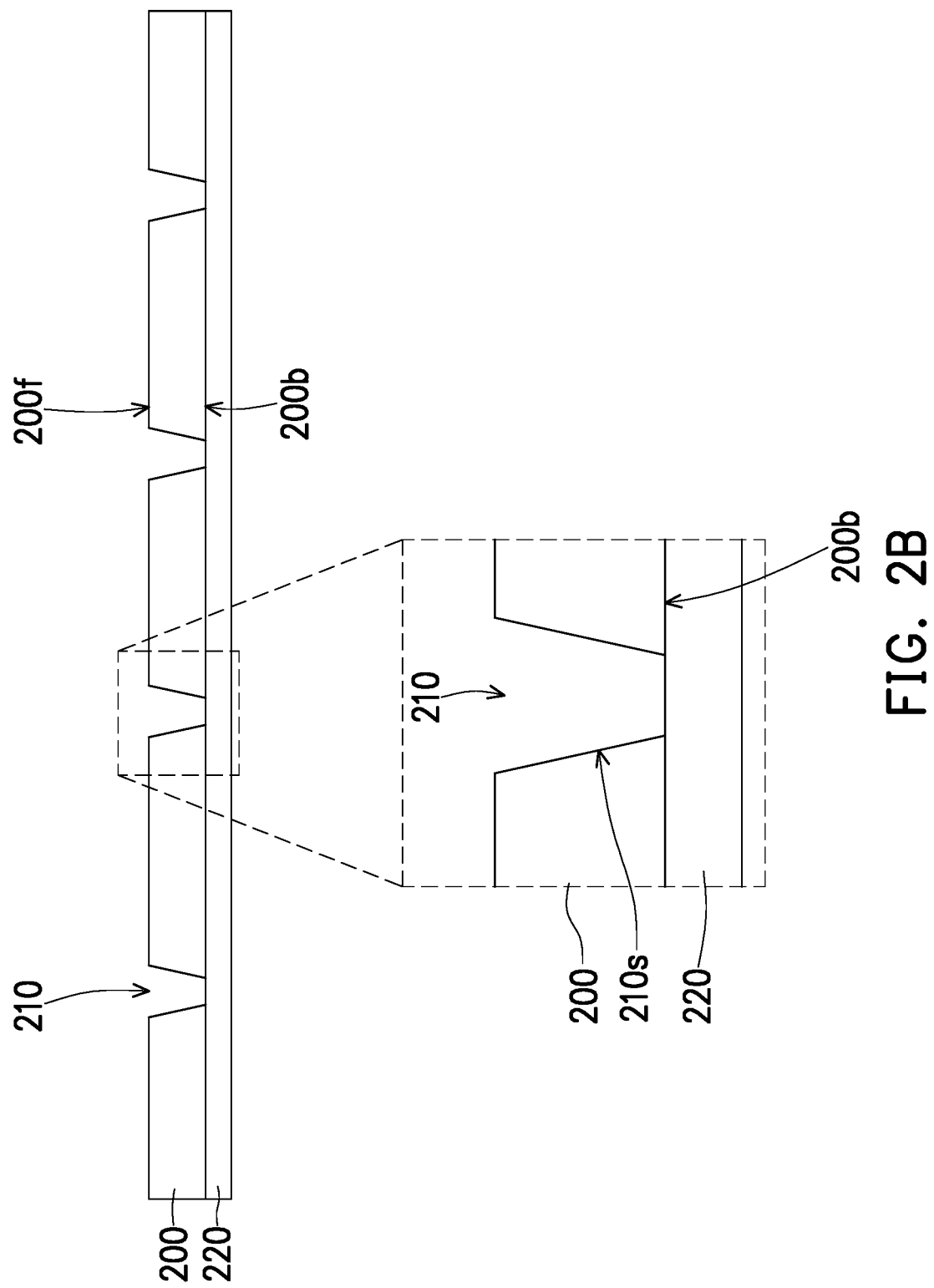

In FIG. 2B, a backside film 220 is bonded to the backside surface 200b of the substrate (step S110 in FIG. 1). The backside film 220 may be or include an organic material, such as an adhesive tape, an organic polymer (e.g., polyimide, epoxy, etc.), a dry photoresist or the like, which is disposed on the substrate 200. In some embodiments, the backside film 220 may include fillers. For example, the backside film may include an epoxy resin with fillers dispersed therein. In some alternative embodiments, the backside film 220 may be a carrier (e.g., a glass carrier) which is removably attached to the substrate 200, for example via a de-bonding layer. In some embodiments, the backside film 220 may be removed, when required, via suitable removal processes such as by irradiation of the de-bonding layer (e.g., in case of LTHC materials), etching (e.g., plasma etching, chemical etching, etc.) or the like. The backside film 220 may cover most or all of the backside surface 200b. Most notably, the backside film 220 extends at the bottom of the through holes 210, so that the through holes 210 are plugged at the side of the backside surface 200b. That is, the through holes 210 may in fact appear as blind holes by way of the backside film 220.

In some embodiments, the substrate 200 with the backside film 220 bonded thereto is introduced in a sputtering chamber to perform a sputtering process from the side of the frontside surface 200f (step S120 in FIG. 1). In some embodiments, the sputtering process S120 includes a surface preparation step S122, a barrier layer sputtering step S124 and a seed layer sputtering step S126. In the preparation step S122, the frontside surface 200f and the sidewalls 210s of the through holes 210 are pre-treated for subsequent material deposition. In some embodiments, a cleaning step, for example via plasma treatment, is performed to remove impurities which may have deposited or otherwise formed on the frontside surface 200f and the sidewalls 210s. After cleaning, the sputtering chamber may be brought to the target temperature and pressure for the subsequent sputtering operations.

Figure 2C:
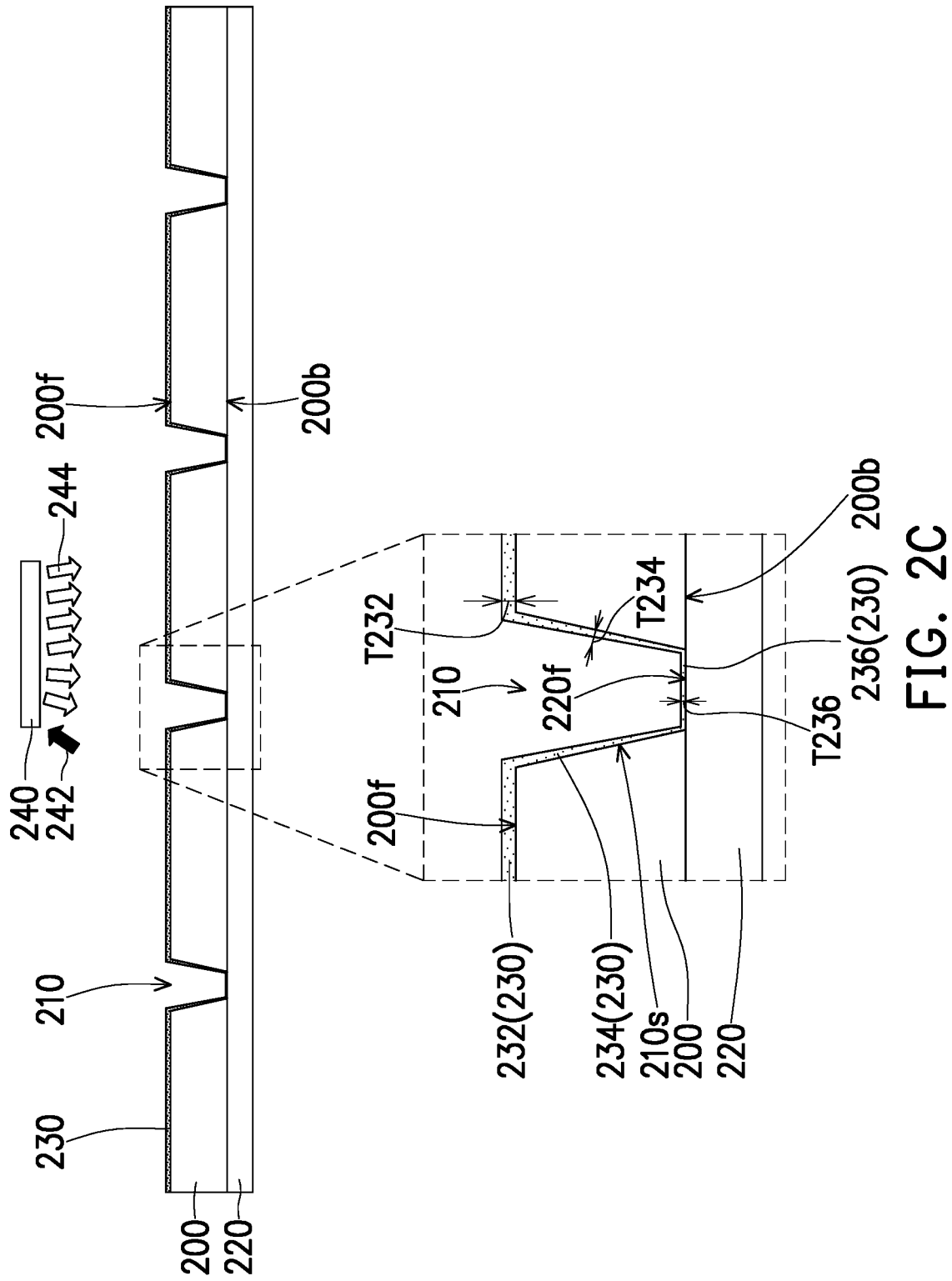

In FIG. 2C, the material of a frontside barrier layer 230 is sputtered on the frontside surface 200f of the substrate 200 and the sidewalls 210s of the through holes 210 (step S124 in FIG. 1). For example, one or more sputtering targets 240 are hit with high energy incident atoms or ions 242 to eject sputtered material 244 which is then deposited on the substrate 200. In some embodiments, the pressure of the sputtering chamber and the energy of the incident atoms or ions 242 are selected so that the mean free path of the sputtered material 244 is sufficiently long to form the frontside barrier layer 230 also on the backside film 220 at the bottom of the through holes 210. It should be noted that while a single target 240 is illustrated in FIG. 2C, the disclosure is not limited thereto. For example, depending on the desired composition of the frontside barrier layer 230, multiple sputtering targets 240 may be used. In some embodiments, the frontside barrier layer 230 includes a metallic material, such as titanium, tantalum, a nitride thereof, or a combination thereof. In some embodiments, the frontside barrier layer 230 is a titanium-containing layer, including a titanium-based material such as titanium, titanium nitride, or a combination thereof. In some embodiments, the frontside barrier layer 230 is a tantalum-containing layer, including a tantalum-based material such as tantalum, tantalum nitride, or a combination thereof.

In some embodiments, the sputtered material 244 reaches the substrate 200 from the side of the frontside surface 200f. The resulting frontside barrier layer 230 may thus include sections 232 extending on the frontside surface 200f of the substrate 200, sections 234 extending on the sidewalls 210s of the through holes 210, and sections 236 extending at the bottom of the through holes 210 on the frontside surface 220f of the backside film 220. In some embodiments, the thicknesses T232, T234, T236 of the individual sections 232, 234, 236 of the frontside barrier layer 230 may become increasingly smaller proceeding from the frontside surface 200f to the backside surface 200b. The thicknesses T232, T234, T236 may be measured along directions normal to the surfaces 200f, 210s, 220f on which the corresponding sections 232, 234, 236 of the frontside barrier layer 230 extend. So, for example, the thicknesses T232, T236 may be measured along a direction normal to the frontside surface 200f, and the thickness T234 may be measured along a direction normal to the sidewalls 210s. The sections 232 located on the frontside surface 200f may have a substantially constant thickness T232 and the sections 234 located on the sidewalls 210s of the through holes 210 may have a decreasing thickness T234 proceeding towards the backside surface 200b. The sections 236 at the bottom of the through holes 210 may have a thickness T236 comparable to the thickness T234 of the sections 234 in proximity of the backside surface 200b. In some embodiments, the thickness T236 of the sections 236 may be slightly larger towards the center of the through holes 210 than closer to the sidewalls 210s. In some embodiments, the frontside barrier layer 230 is formed to have a thickness T232 in the range from 0.5 micrometers to 10 micrometers, such as of about 2 micrometers.

Figure 2D:
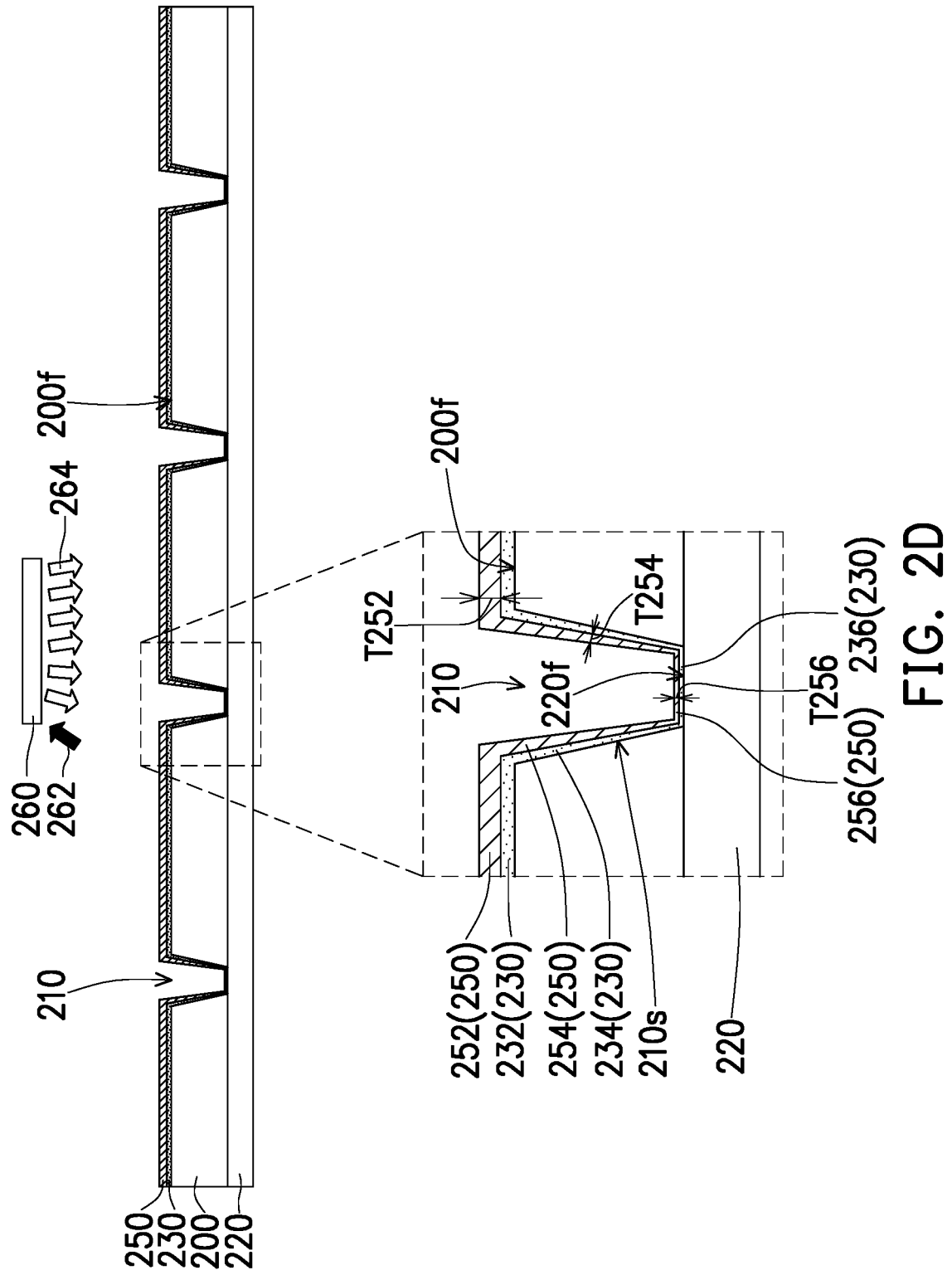

In FIG. 2D, the material of a frontside seed layer 250 is sputtered on the frontside barrier layer 230 (step S126 in FIG. 1). For example, one or more sputtering targets 260 are hit with high energy incident atoms or ions 262 to eject sputtered material 264 which is then deposited on the frontside barrier layer 230. In some embodiments, the pressure of the sputtering chamber and the energy of the incident atoms or ions 262 are selected so that the mean free path of the sputtered material 264 is sufficiently long to form the frontside seed layer 250 also on the section 236 of the frontside barrier layer 230 at the bottom of the through holes 210. It should be noted that while a single target 260 is illustrated in FIG. 2D, the disclosure is not limited thereto. For example, depending on the desired composition of the frontside seed layer 250, multiple sputtering targets 260 may be used. In some embodiments, the frontside seed layer 250 includes a metallic material, such as copper, silver, gold, nickel, titanium, alloys thereof, a combination thereof, or the like. In some embodiments, the frontside seed layer 250 is a copper-containing layer, including copper-based materials such as copper or copper alloys.

In some embodiments, the sputtered material 264 reaches the substrate 200 from the side of the frontside surface 200f. The resulting frontside seed layer 250 may thus have a shape similar to the one described before for the frontside barrier layer 230, including sections 252 extending on the sections 232 over the frontside surface 200f of the substrate 200, sections 254 extending on the sections 234 over the sidewalls 210s of the through holes 210, and sections 256 extending on the sections 236 at the bottom of the through holes 210 over the frontside surface 220f of the backside film 220. In some embodiments, the thicknesses T252, T254, T256 of the individual sections 252, 254, 256 of the frontside seed layer 250 may become increasingly smaller proceeding from the frontside surface 200f to the backside surface 200b, similar to what was previously described with respect to the frontside barrier layer 230. The thicknesses T252, T254, T256 are measured along directions normal to the surfaces 200f, 210s, 220f on which the corresponding sections 252, 254, 256 of the frontside seed layer 250 extend. So, for example, the sections 252 located over the frontside surface 200f may have a substantially constant thickness T252 and the sections 234 located over the sidewalls 210s of the through holes 210 have a decreasing thickness T254 proceeding towards the backside surface 200b. The sections 256 at the bottom of the through holes 210 may have a thickness T256 comparable to the thickness T254 of the sections 254 in proximity of the bottom surface 200b. In some embodiments, the thickness T256 of the sections 256 may be slightly larger towards the center of the through holes 210 than closer to the sidewalls 210s. In some embodiments, the frontside seed layer 250 is formed to have a thickness T236 in the range from 1 micrometers to 10 micrometers, such as of about 5 micrometers. In some embodiments, the frontside barrier layer 230 may decrease or even prevent diffusion of the material of the frontside seed layer 250 into the substrate 200.

Figure 2E:
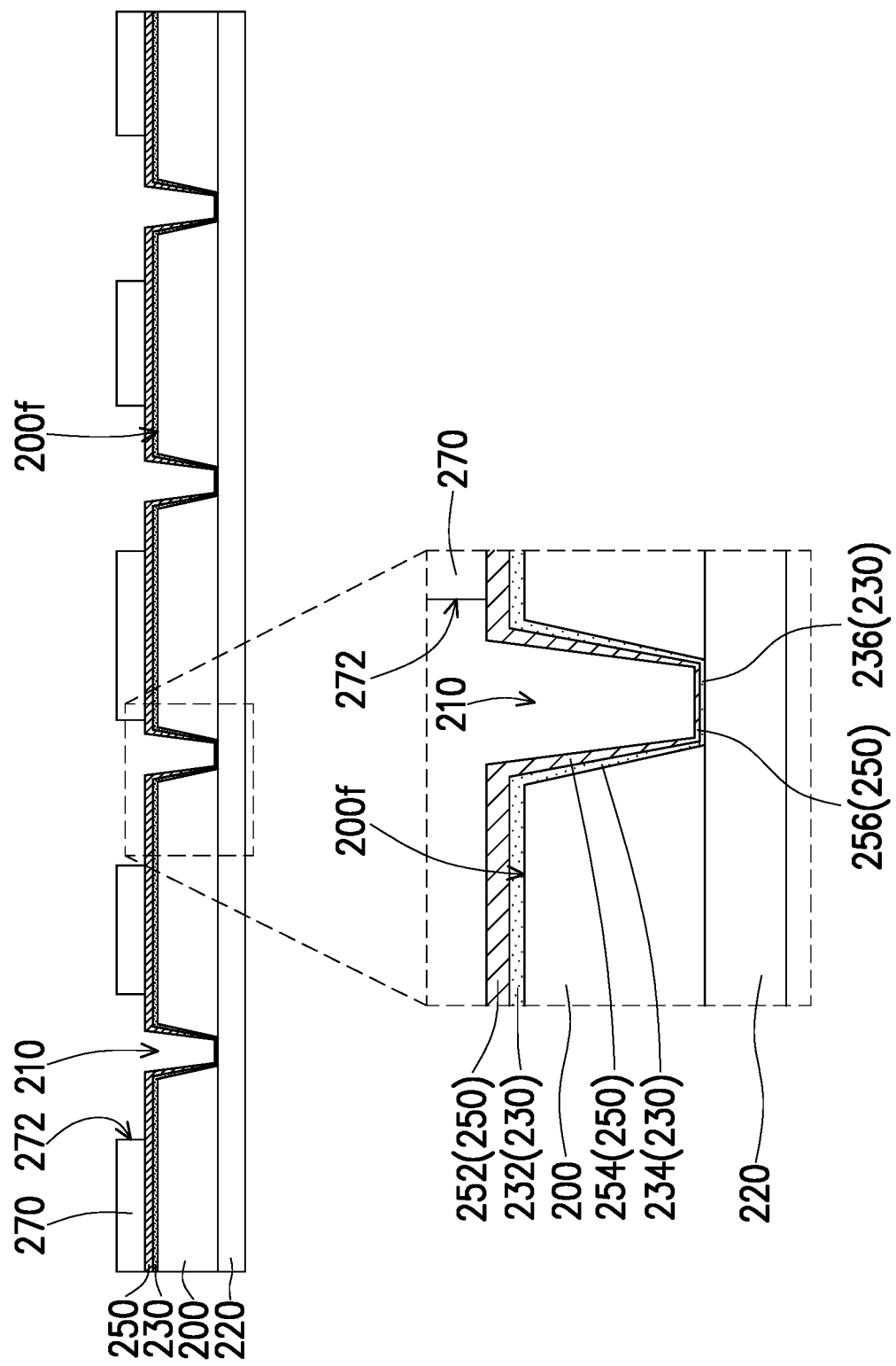

In some embodiments, once the frontside barrier layer 230 and the frontside seed layer 250 are formed, the substrate 200 may be taken out of the sputtering chamber for further processing. For example, as illustrated in FIG. 2E to FIG. 2I, a frontside redistribution layer (RDL) 340 may be formed on the frontside surface 200f (step S130 in FIG. 1). In FIG. 2E, a patterned mask 270 is formed on the frontside seed layer 250, over the frontside surface 200f of the substrate 200. In some embodiments, the patterned mask 270 includes a positive or a negative photoresist, and is formed, for example, through a sequence of deposition (e.g., spin on), exposure, and development steps. In some embodiments, the patterned mask 270 is patterned to include a plurality of openings 272 extending in regions where the through holes 210 are located. That is, the through holes 210 are exposed at the bottom of the openings 272.

Figure 2F:
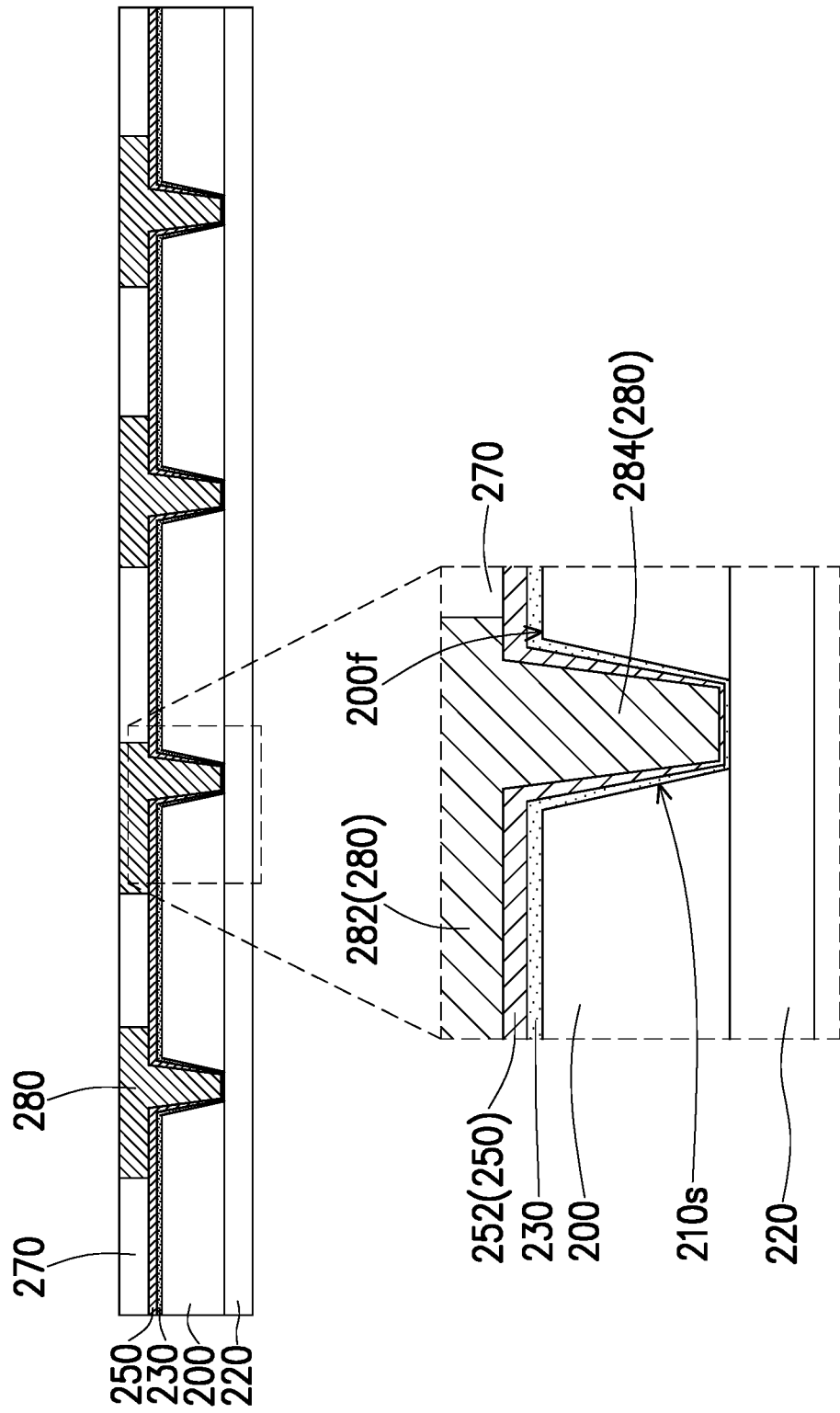
Figure 2G:
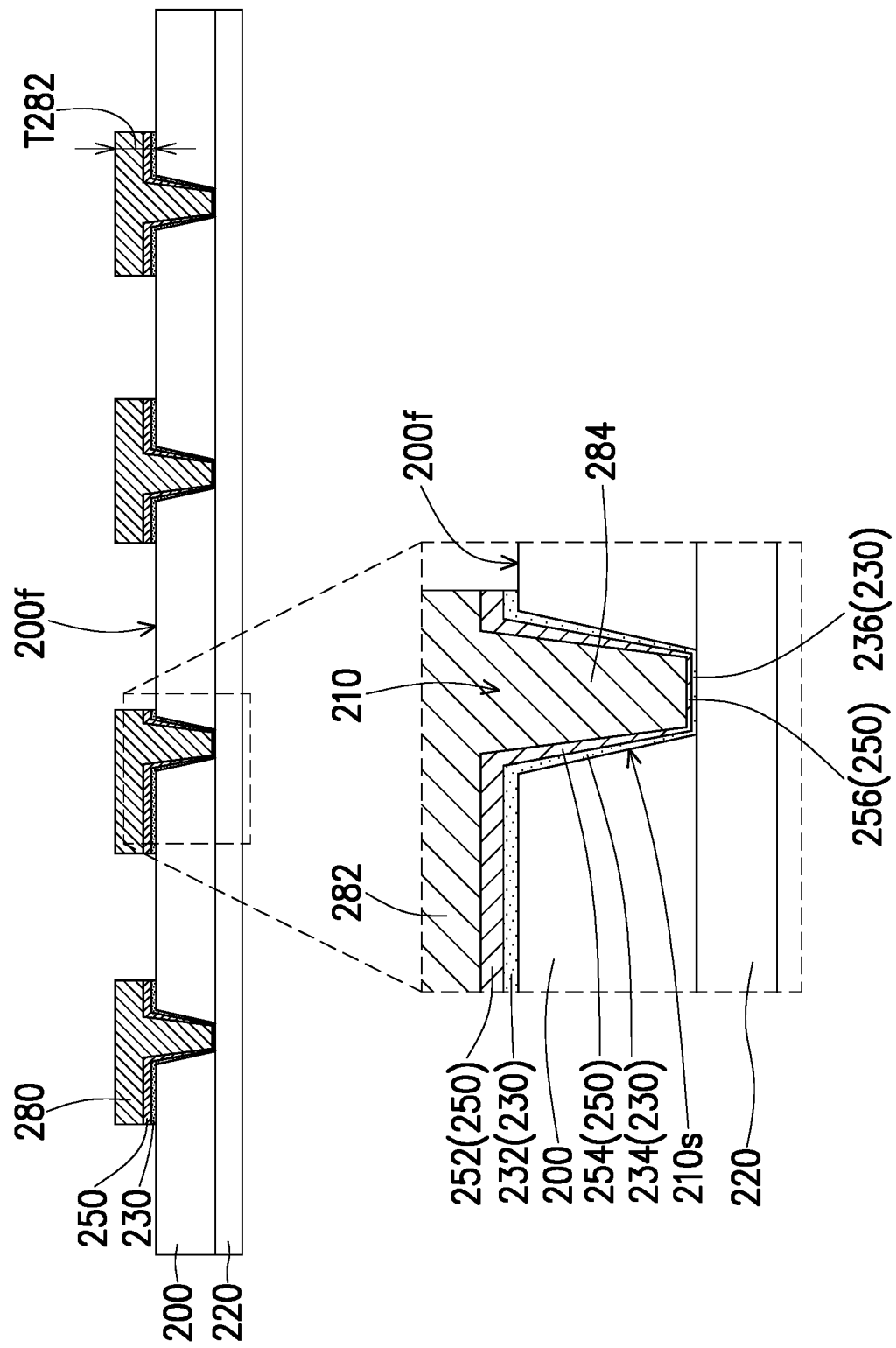

Referring to FIG. 2E and FIG. 2F, a conductive material is deposited in the openings 272 of the patterned mask 270 to form the patterned conductive traces 280. In some embodiments, the patterned conductive traces 280 includes routing patterns 282 extending on the horizontal sections 252 of the frontside seed layer 250, and routing vias 284 filling the through holes 210 in between the sidewalls 210s. The routing vias 284 may extend from the level height of the sections 252 (at the bottom of the routing patterns 282) to the sections 256 of the frontside seed layer 250 extending on the backside film 220. In some embodiments, the conductive material includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be deposited via one or more plating steps. In some embodiments, the routing vias 284 and the routing patterns 282 are integrally formed (e.g., formed as a single piece during a same plating step), so that electrical connection with low resistance is established between the routing vias 284 and the routing patterns 282. Referring to FIG. 2F and FIG. 2G, the patterned mask 270 is removed, for example via ashing or stripping. The portions of the frontside seed layer 250 and the frontside barrier layer 230 originally covered by the patterned mask 270 are also removed, for example via one or more etching steps. Difference in etching rates between the materials of the frontside barrier layer 230 and the frontside seed layer 250 with respect to the conductive material of the patterned conductive traces 280 may be exploited to selectively remove the exposed portions of the frontside seed layer 250 and the frontside barrier layer 230, thus revealing again the frontside surface 200f of the substrate 200. Sections 252 of the frontside seed layer 250 and sections 232 of the frontside barrier layer 230 remain underneath the regions of the routing patterns 282 extending on the frontside surface 200f of the substrate; sections 254 of the frontside seed layer 250 and sections 234 of the frontside barrier layer 230 remain between the routing vias 284 and the sidewalls 210s of the through holes 210; and sections 256 of the frontside seed layer 250 and sections 236 of the frontside barrier layer 230 remains at the bottom of the routing vias 280, separating the routing vias 284 from the backside film 220. In some embodiments, the routing patterns 282 may be formed rather thick, for example with a thickness T282 in the range from 20 micrometers to 60 micrometers.

Figure 2H:
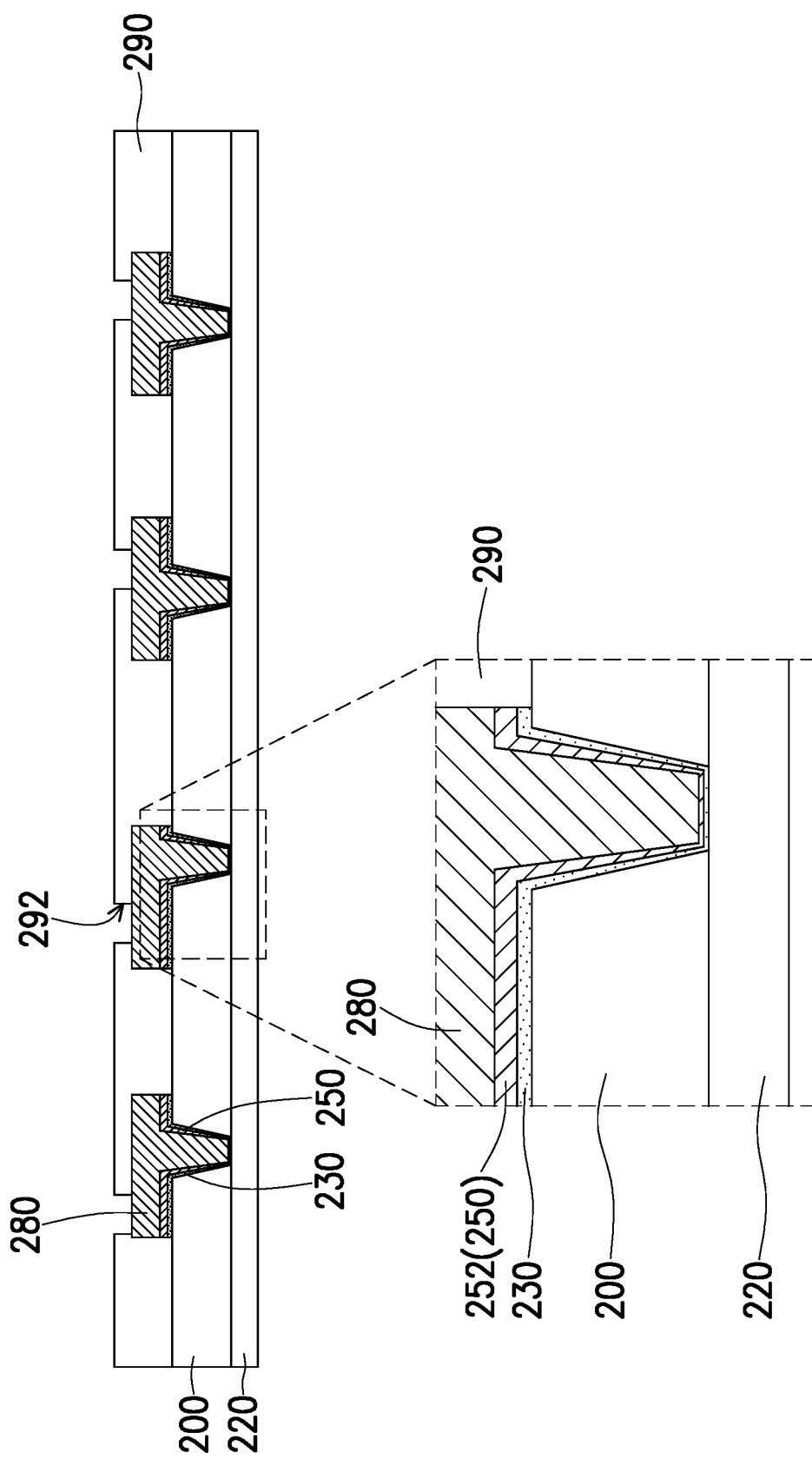
Figure 21:
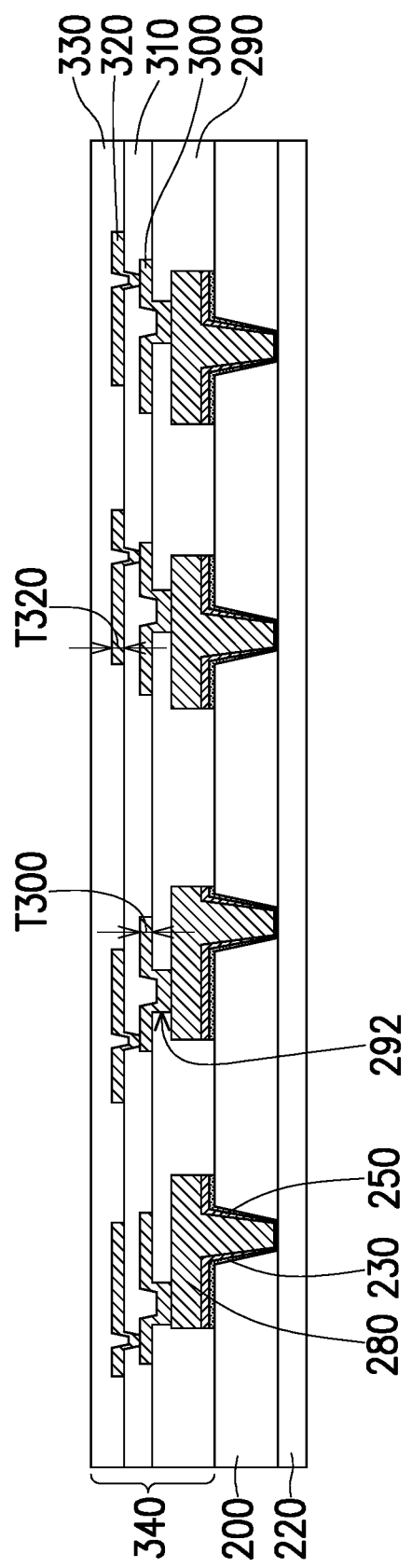

In FIG. 2H, a dielectric layer 290 is formed on the frontside surface 200f of the substrate 200, embedding the conductive traces 280. The dielectric layer 290 may be formed to be thicker than the conductive traces 280, and may be patterned to include openings 292 exposing at their bottom portions of the conducive traces 280. In some embodiments, the dielectric layer 290 includes an organic dielectric, for example a polymer such as polyimide, epoxy resin, acrylic resin, phenol resin, benzocyclobutene (BCB), polybenzoxazole (PBO), a combination thereof, or the like. In some embodiments, the dielectric layer 290 may be formed by spin-on coating, and patterned to include the openings 292. Auxiliary mask (not shown) may be employed to define the positions and shapes of the openings 292.

In FIG. 2I, the upper conductive layers 300, 320 and dielectric layers 310, 330 of the frontside RDL 340 are formed, following similar processes as previously described. For example, the conductive material of the conductive layer 300 is deposited on the dielectric layer 290 to form routing patterns extending on the dielectric layer 290 and routing vias extending in the openings 292 of the dielectric layer 290 to contact the conductive traces 280. The dielectric layer 310 may then be formed to embed the conductive layer 300, and the process may be repeated to form the conductive layer 320 and the dielectric layer 330. In some embodiments, the upper conductive layers 300, 320 are thinner than the conductive traces 280, for example with thicknesses T300, T320 (measured in correspondence of the routing patterns) in the range from 4 micrometers to 7 micrometers. At the manufacturing stage illustrated in FIG. 2I, the outermost dielectric layer 330 may completely cover the uppermost conductive layer 320.

Figure 2J:
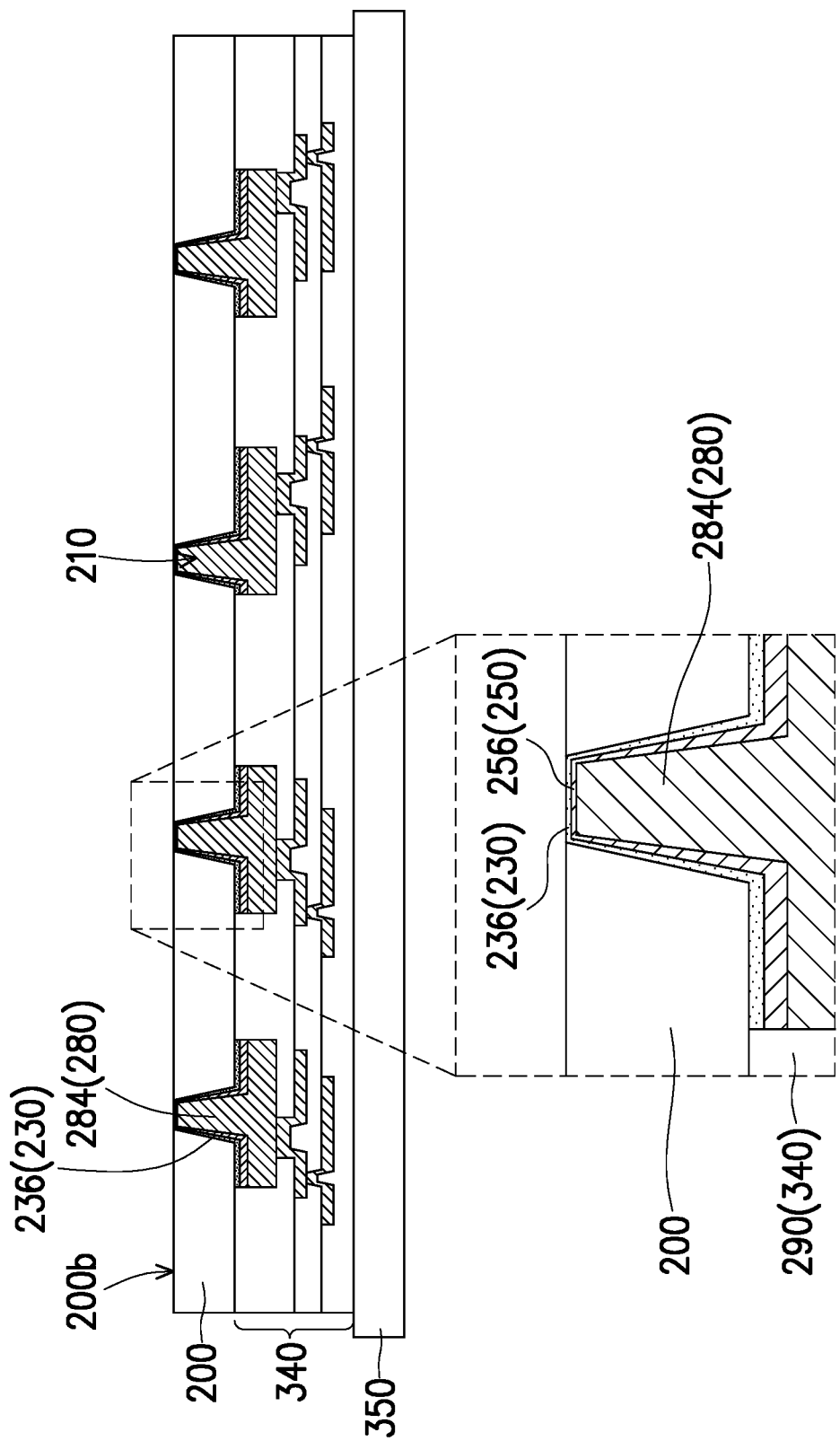

Referring to FIG. 2I and FIG. 2J, in some embodiments a carrier 350 is detachably bonded to the outermost dielectric layer 330 of the frontside RDL 340. In some embodiments, the carrier 350 is a glass substrate, a metal plate, a plastic supporting board, or the like, but other suitable substrate materials may be used as long as the materials are able to withstand the subsequent steps of the process. In some embodiments, a de-bonding layer is provided on the carrier 350 to facilitate peeling the carrier 350 away from the structure when required by the manufacturing process. In some embodiments, the de-bonding layer includes a light-to-heat conversion (LTHC) release layer. The backside film 220 is removed (e.g., peeled) away from the backside surface 200b of the substrate 200, which backside surface 200b is thus exposed. In correspondence of the through holes 210, the sections 236 of the frontside barrier layers 230 are exposed, substantially coplanar with the backside surface 200b.

In some embodiments, the substrate 200 with the carrier 350 bonded thereto is introduced in a sputtering chamber to perform a sputtering process from the side of the backside surface 200b (step S140 in FIG. 1). In some embodiments, the sputtering process S140 includes a surface preparation step S142, a barrier layer sputtering step S144 and a seed layer sputtering step S146. In the preparation step S142, the backside surface 200b is pre-treated for subsequent material deposition. In some embodiments, a cleaning step, for example via plasma treatment, is performed to remove impurities which may have deposited or otherwise formed on the backside surface 200b, including possible oxidation products of the exposed sections 236 of the frontside barrier layer 230 (and, possibly, of the frontside seed layer 250, if any portion of it is also exposed at the level of the backside surface 200b). After cleaning, the sputtering chamber may be brought to the target temperature and pressure for the subsequent sputtering operations, as previously described.

Figure 2K:
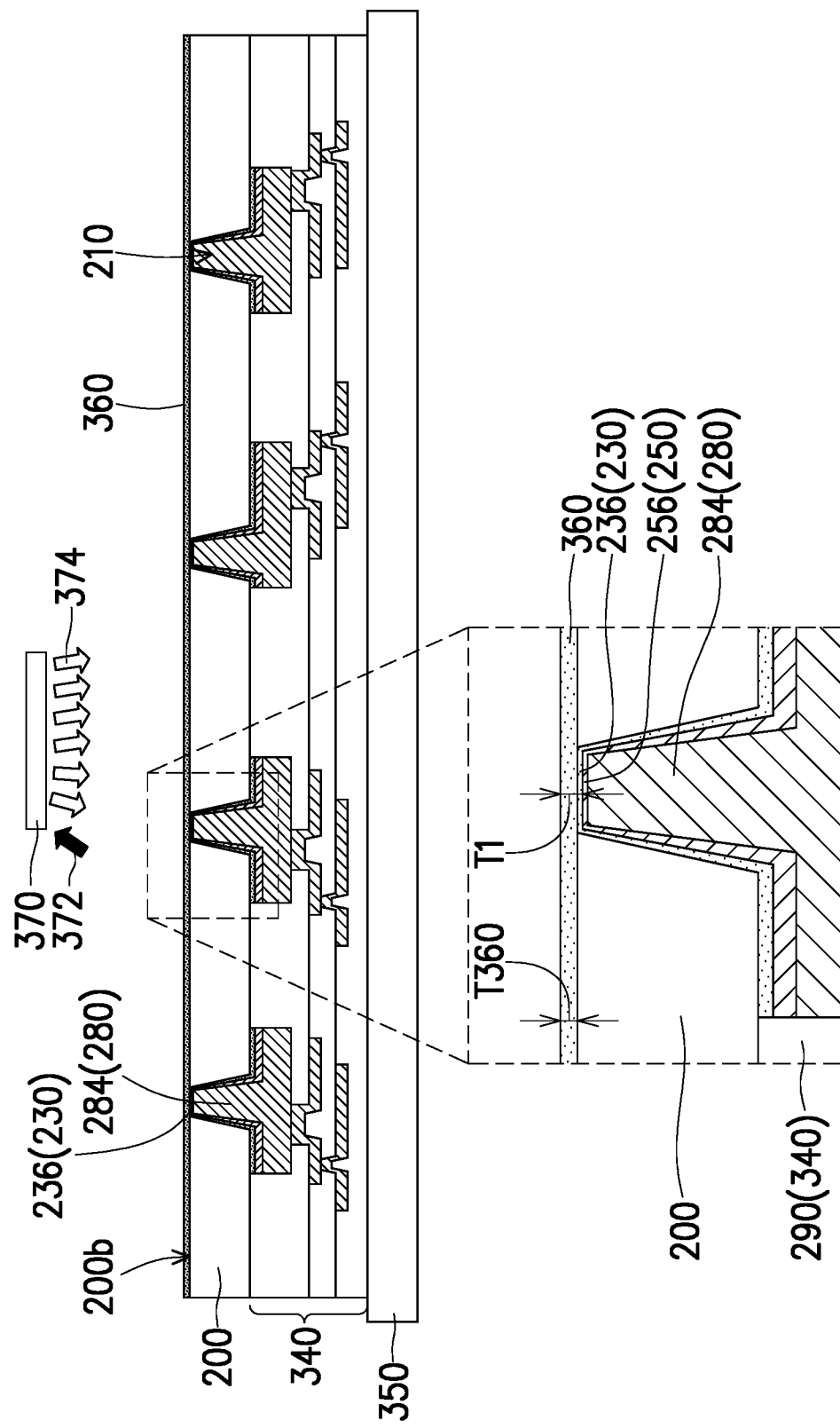

In FIG. 2K, the material of a backside barrier layer 360 is sputtered on the backside surface 200b of the substrate 200, including on the exposed sections 236 of the frontside barrier layer 230 (step S44 of FIG. 1). For example, one or more sputtering targets 370 are hit with high energy incident atoms or ions 372 to eject sputtered material 374 which is then deposited on the substrate 200. It should be noted that while a single target 370 is illustrated in FIG. 2K, the disclosure is not limited thereto. For example, depending on the desired composition of the backside barrier layer 360, multiple sputtering targets 370 may be used. In some embodiments, the backside barrier layer 360 includes a metallic material, such as titanium, tantalum, a nitride thereof, or a combination thereof. In some embodiments, the backside barrier layer 360 is a titanium-containing layer, including a titanium-based material such as titanium, titanium nitride, or a combination thereof. In some embodiments, the backside barrier layer 360 is a tantalum-containing layer, including a tantalum-based material such as tantalum, tantalum nitride, or a combination thereof. In some embodiments, the backside barrier layer 360 and the frontside barrier layer 230 have substantially the same composition. In some embodiments, the sputtered material 374 reaches the substrate 200 from the side of the backside surface 200b. The resulting backside barrier layer 360 is blanketly deposited over the backside surface 200b with a substantially homogeneous thickness T360. In some embodiments, the target thickness T360 may be in the range from 0.02 micrometers to 2 micrometers. In correspondence of the through holes 210, barrier material may be present with a thickness T1 larger than the thickness T360 of the backside barrier layer 360, in correspondence of the sections 236 of the frontside barrier layers 230. In some alternative embodiments, the sections 236 of the frontside barrier layers 230 may be removed before depositing the backside barrier layer 360.

Figure 2L:
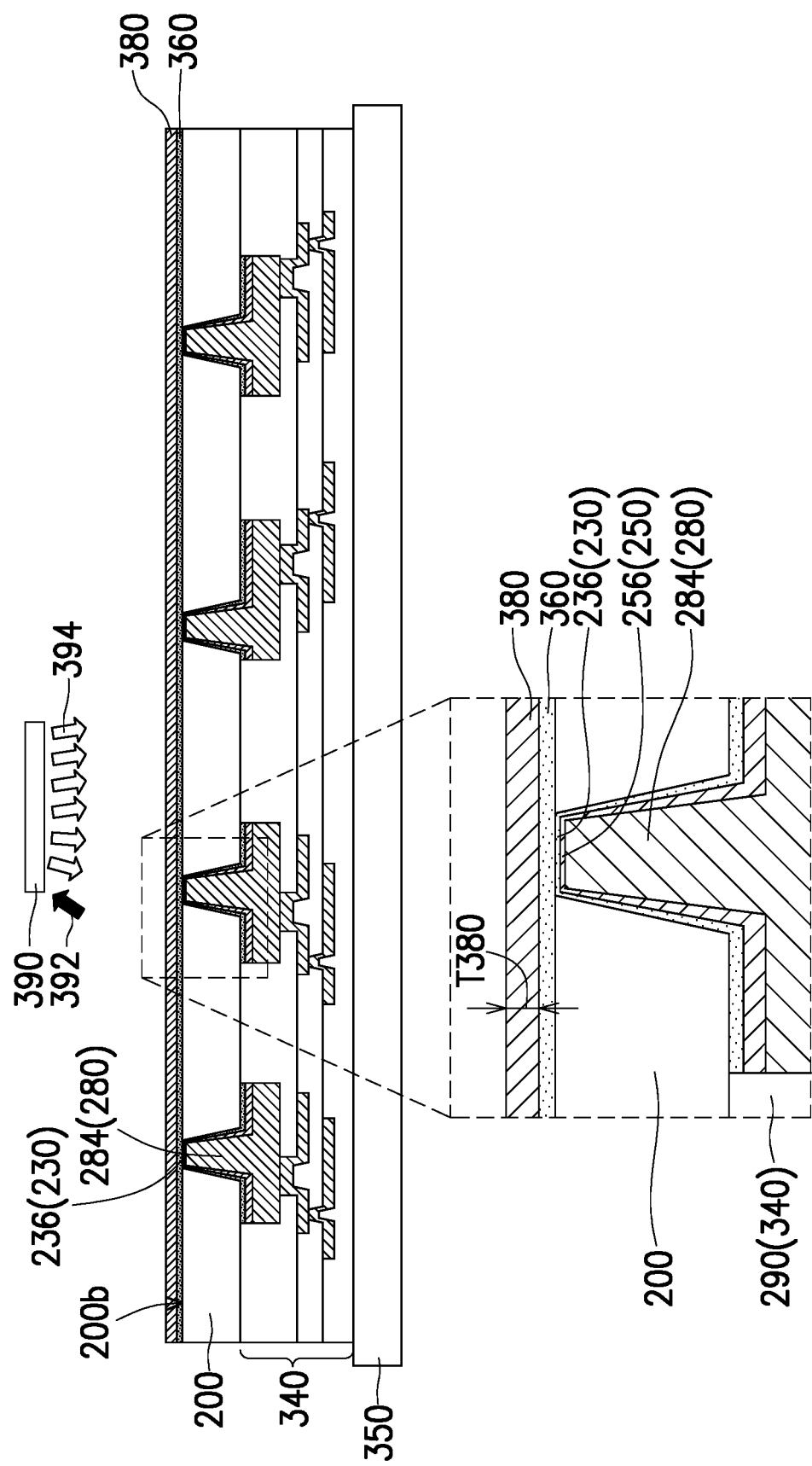

In FIG. 2L, the material of a backside seed layer 380 is sputtered on the backside barrier layer 360 (step S146 in FIG. 1). For example, one or more sputtering targets 390 are hit with high energy incident atoms or ions 392 to eject sputtered material 394 which is then deposited on the backside barrier layer 360. It should be noted that while a single target 390 is illustrated in FIG. 2L, the disclosure is not limited thereto. For example, depending on the desired composition of the backside seed layer 380, multiple sputtering targets 390 may be used. In some embodiments, the backside seed layer 380 includes a metallic material, such as copper, silver, gold, nickel, titanium, alloys thereof, a combination thereof, or the like. In some embodiments, the backside seed layer 380 is a copper-containing layer, including copper-based materials such as copper or copper alloys. In some embodiments, the composition of the backside seed layer 380 may be substantially the same as the composition of the frontside seed layer 250. In some embodiments, the sputtered material 394 reaches the substrate 200 from the side of the backside surface 200b. The resulting backside seed layer 380 is blanketly deposited on the backside barrier layer 360 with a substantially homogeneous thickness T380. In some embodiments, the target thickness T380 may be in the range from 0.05 micrometers to 5 micrometers.

Figure 2M:
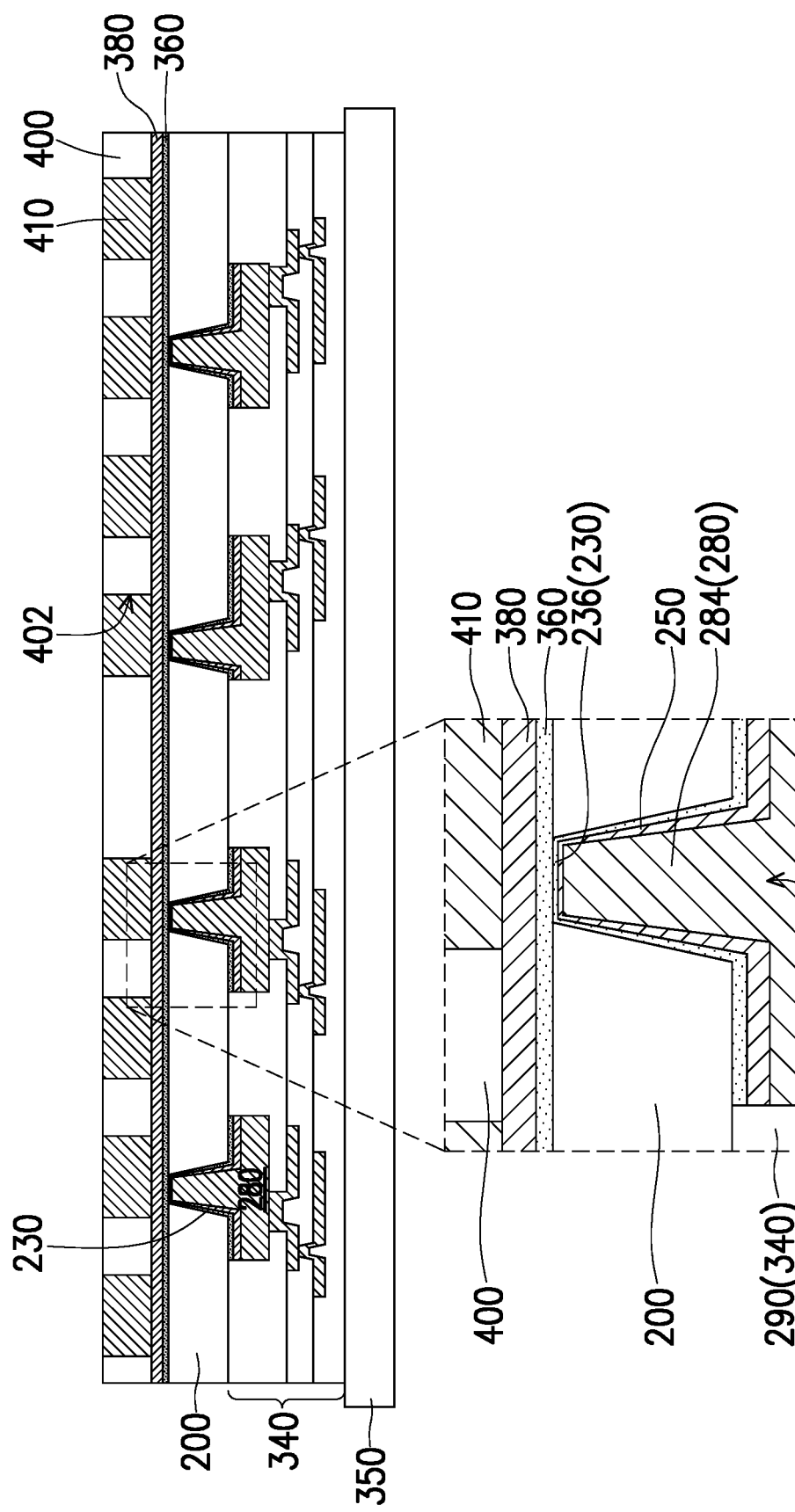
Figure 2N:
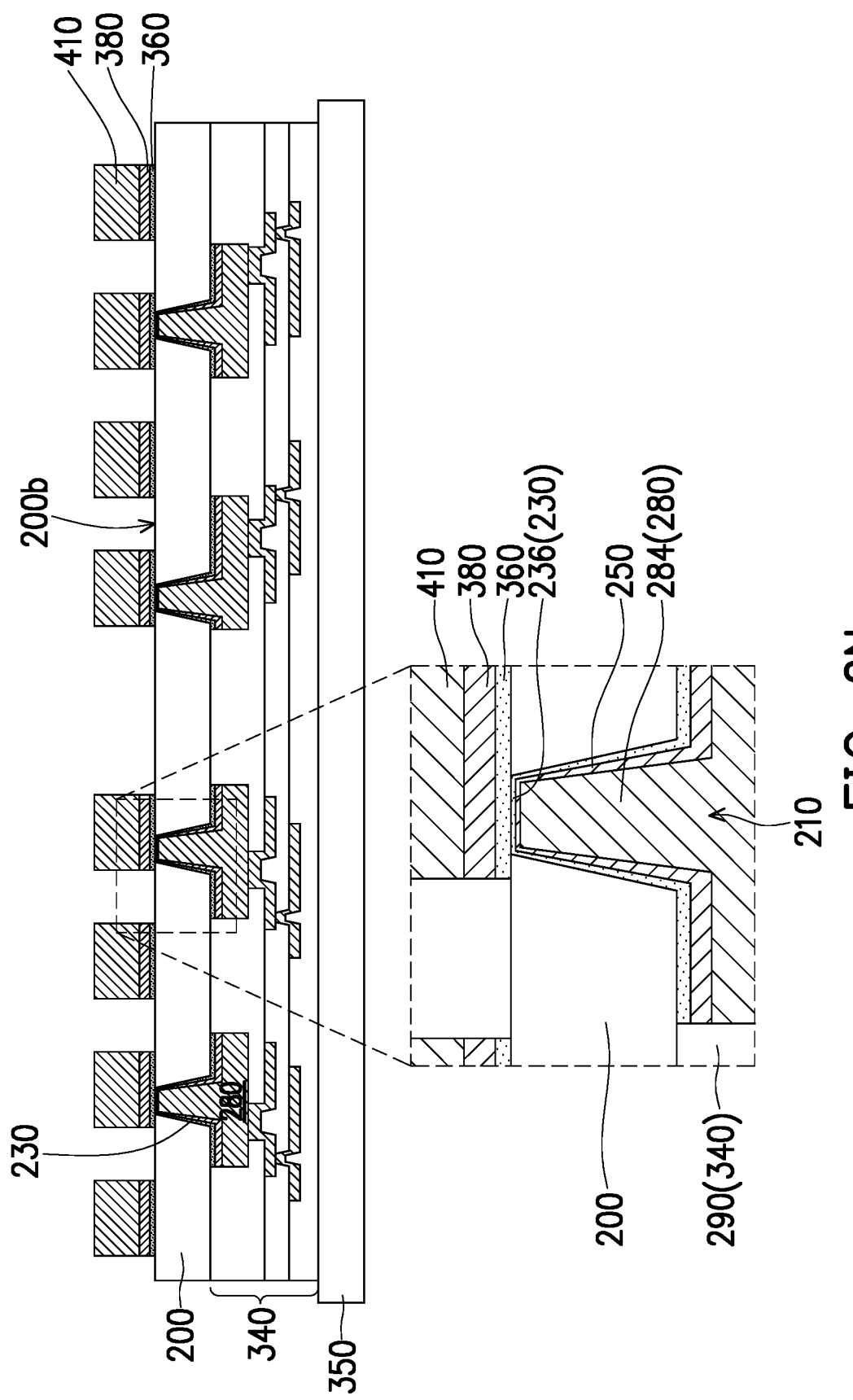
Figure 20:
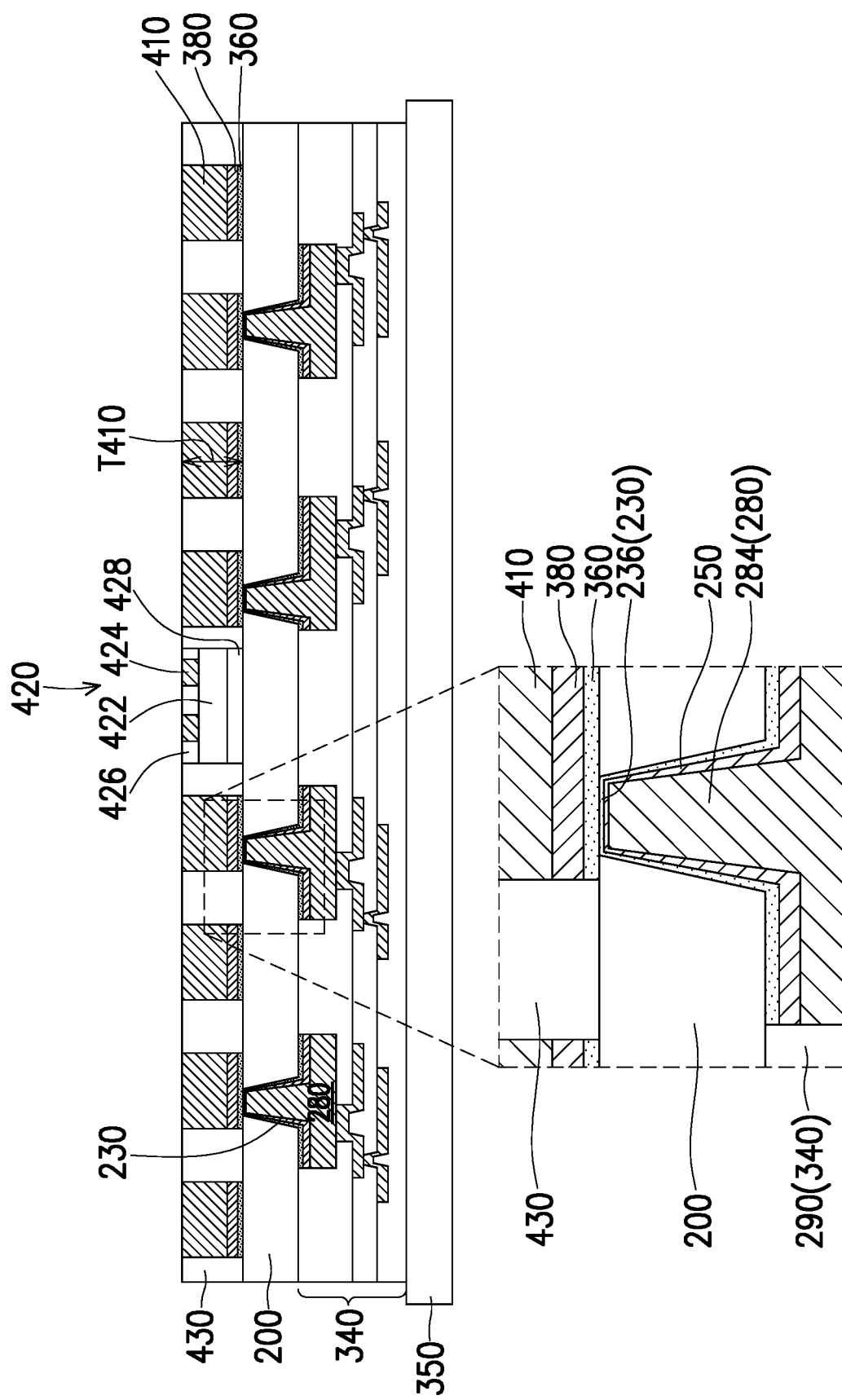

In some embodiments, once the backside barrier layer 360 and the backside seed layer 380 are formed, the substrate 200 may be taken out of the sputtering chamber for further processing. For example, as illustrated in FIG. 2M to FIG. 2P, a backside RDL 440 may be formed on the backside surface 200b (step S150 in FIG. 1). In FIG. 2M, a patterned mask 400 is formed on the backside seed layer 380, with similar materials and process steps as previously described for the patterned mask 270 of FIG. 2E. The patterned mask 400 includes openings 402 exposing at their bottom sections of the backside seed layer 380 extending over the sections 236 of the frontside barrier layer 230 at the bottom of the through holes 210. A conductive material is disposed within the openings 402 to form the conductive blocks 410. The conductive blocks 410 may be routing patterns extending on the backside seed layer 380, electrically connected (via the respective seed layers 250, 380 and barrier layers 230, 360) to the conductive traces 280 filling the through holes 210. Materials and processes to form the conductive blocks 410 may be similar to the ones previously described for the conductive traces 280, with the additional conductive material being formed on the backside seed layer 380 (e.g., without being deposited in the through holes 210, which through holes 210 are already filled by the routing vias 284). Referring to FIG. 2M and FIG. 2N, the patterned mask 400 and the underlying portions of backside seed layer 380 and backside barrier layer 360 are removed to expose the backside surface 200b of the substrate, similar to what was previously described with reference to FIG. 2G. Portions of the backside seed layer 380 and the backside barrier layer 360 remains at the bottom of the conductive blocks 410, between the conductive blocks 410 and the substrate 200.

In FIG. 2O, one or more semiconductor dies 420 are disposed on the substrate 200, amongst the conductive blocks 410. Briefly, a semiconductor die 420 may include a semiconductor substrate 422 in which active and/or passive devices are formed, conductive pads 424 formed on a side of the semiconductor substrate 422 to establish electrical connection to the active and/or passive devices, a protection layer 426 in which the conductive pads 424 are embedded, and an adhesive layer 428 securing the semiconductor substrate 422 to the substrate 200. In some embodiments, the semiconductor die 420 may be a memory die, such as a high-bandwidth memory, a logic die, such as a central processing unit (CPU) die, a graphic processing unit (GPU) die, a micro control unit (MCU) die, an input-output (I/O) die, a baseband (BB) die, or an application processor (AP) die, and so on. In some embodiments, the semiconductor die 420 is a signal processing die.

In some embodiments, an encapsulant 430 is formed on the substrate 200 to laterally encapsulate the semiconductor die 420 and the conductive blocks 410. A material of the encapsulant 430 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, the encapsulant is formed by a sequence of over-molding and planarization steps, whereby the material of the encapsulant 430 is removed until the conductive pads 424 of the semiconductor die 420 and the top surfaces of the conductive blocks 410 are exposed. In some embodiments, the conductive blocks 410 are formed of comparable thickness T410 to the semiconductor die 420, so that the conductive blocks 410 can provide vertical connection through the encapsulant 430. In some embodiments, the thickness T410 of the conductive blocks 410 may be greater than about 100 micrometers, for example in the range from 100 micrometers up to 250 micrometers.

Figure 2P:
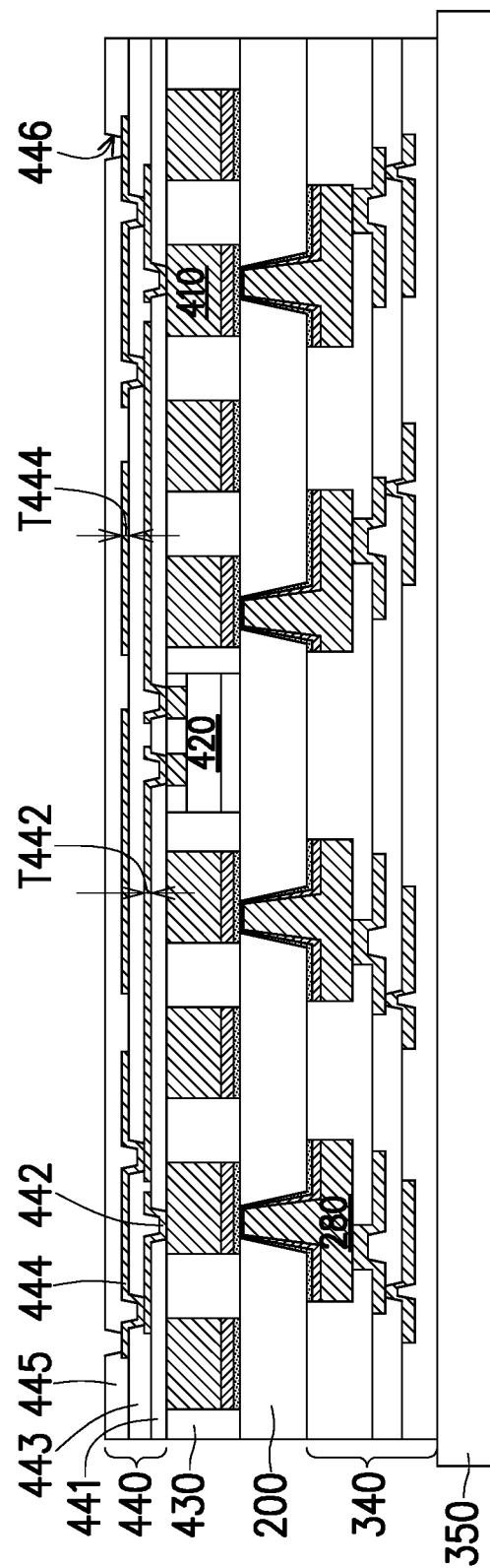

In FIG. 2P, the backside RDL 440 is formed on the encapsulated semiconductor die 420 and the conductive blocks 410, by alternately forming the dielectric layers 441, 443, 445 and the conductive layers 442, 444, following similar processes as previously described for the frontside RDL 340. In some embodiments, the outermost dielectric layer 445 is patterned to include openings 446 exposing portions of the outermost conductive layer 444. In some embodiments, the conducive layers 442, 444 are formed to be thinner than the conductive blocks 410, for example with thicknesses T442, T444 independently in the range from 4 micrometers to 7 micrometers.

Figure 2Q:
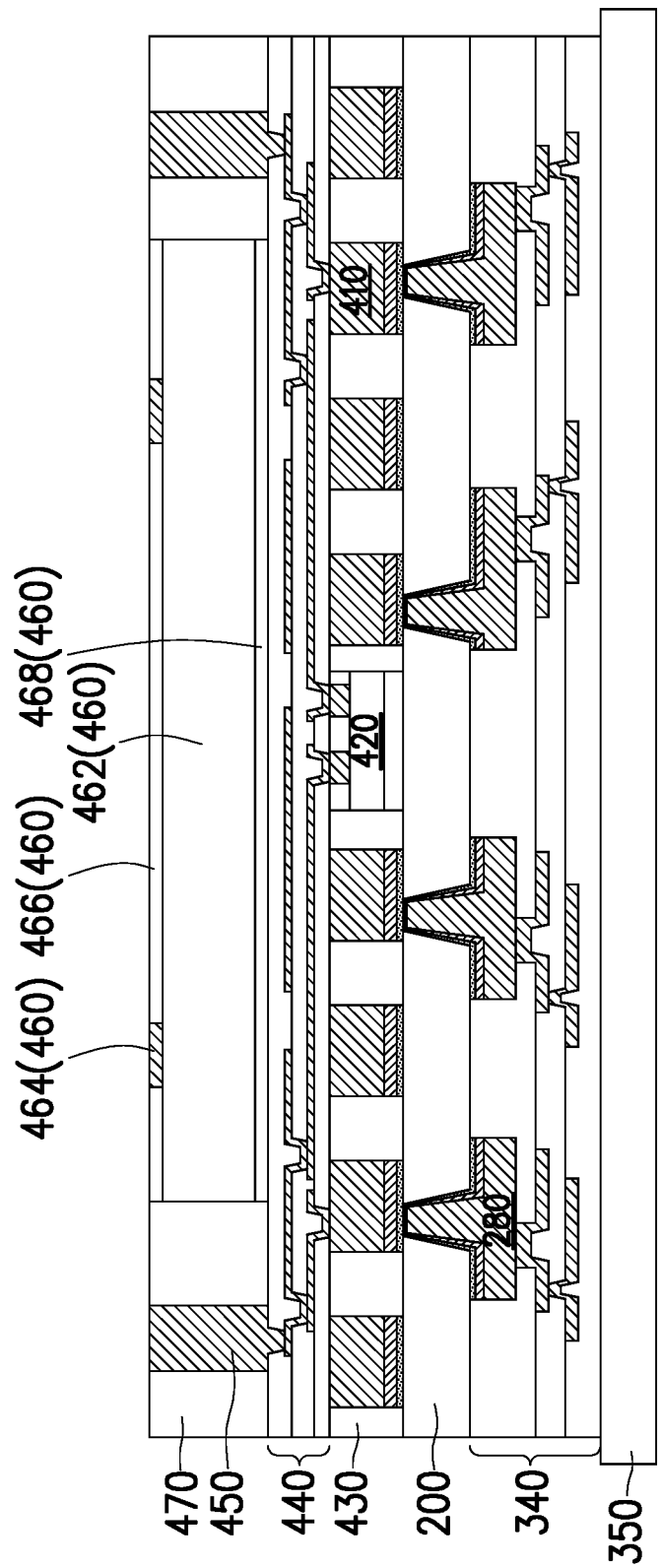

In FIG. 2Q, through insulator vias (TIVs) 450 are formed in correspondence of the openings 446 of the backside RDL 440, to contact the uppermost conductive layer 444. In some embodiments, the TIVs 450 are formed by disposing a conductive material in the openings of a patterned mask (not shown). The conductive material may be disposed by any suitable process, such as a plating step or the like. In some embodiments, a semiconductor die 460 is placed on the backside RDL 440 amongst the TIVs 450. Briefly, the semiconductor die 460 may include a semiconductor substrate 462 in which active and/or passive devices are formed, conductive pads 464 formed on a side of the semiconductor substrate 462 to establish electrical connection to the active and/or passive devices, a protection layer 466 in which the conductive pads 464 are embedded, and an adhesive layer 468 securing the semiconductor substrate 462 to the backside RDL 440. In some embodiments the semiconductor die 460 is a micro-electromechanical system, and may be adapted to sense external stimuli such as radiation, sounds, pressure or the like. In some embodiments, the TIVs 450 and the semiconductor die 460 may be encapsulated in the encapsulant 470, which may be formed with similar materials and processes as previously described for the encapsulant 430.

Figure 2R:
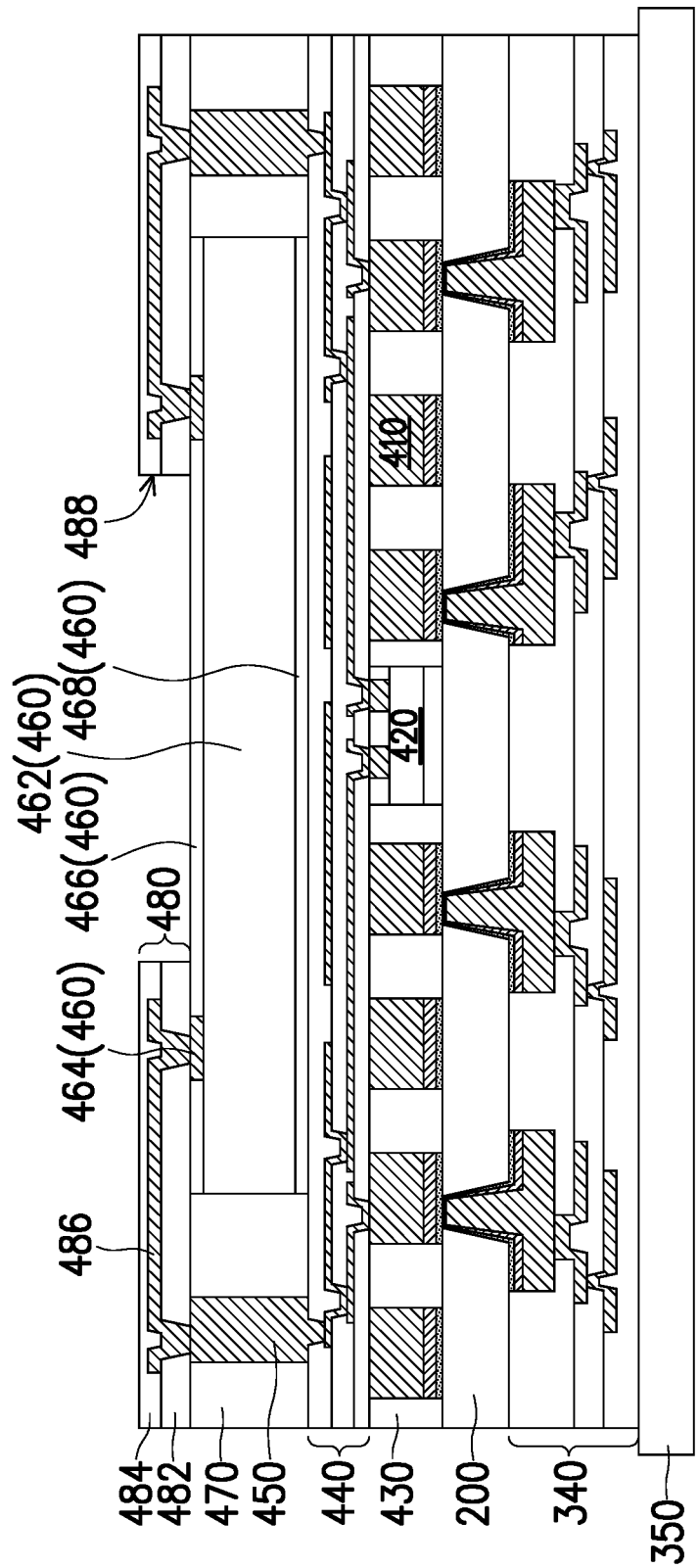

In FIG. 2R, an additional RDL 480 is formed on the encapsulated semiconductor die 460 and the TIVs 450, following similar processes as previously described for the backside RDL 440. In some embodiments, the RDL 480 includes dielectric layers 482, 484 and at least one conductive layer 486 alternately stacked, with the conductive layer 486 interconnecting the conductive pads 464 of the semiconductor die 460 to the TIVs 450. In some embodiments, the RDL 480 may be formed to include at least one opening 488 exposing a sensing area of the semiconductor die 460. For example, a mask (not shown) may be disposed on the sensing area of the semiconductor die 460 to prevent the materials of the RDL 480 being deposited on the sensing area. The mask may then be removed, resulting in the opening 488. In some embodiments, the die 460 may sense an incoming stimulus (e.g., radiation, sound wave, etc.) in correspondence of the opening 488 of the RDL 480, and may generate a signal in response which is then transmitted for further processing to the semiconductor die 420 through the RDLs 480, 440 and the TIVs 450. It will be apparent that, depending on the type of semiconductor die 460 and the type of stimulus to be sensed, the opening 488 (and, more in general, the structure of the RDL 480) may be adapted accordingly.

Figure 2S:
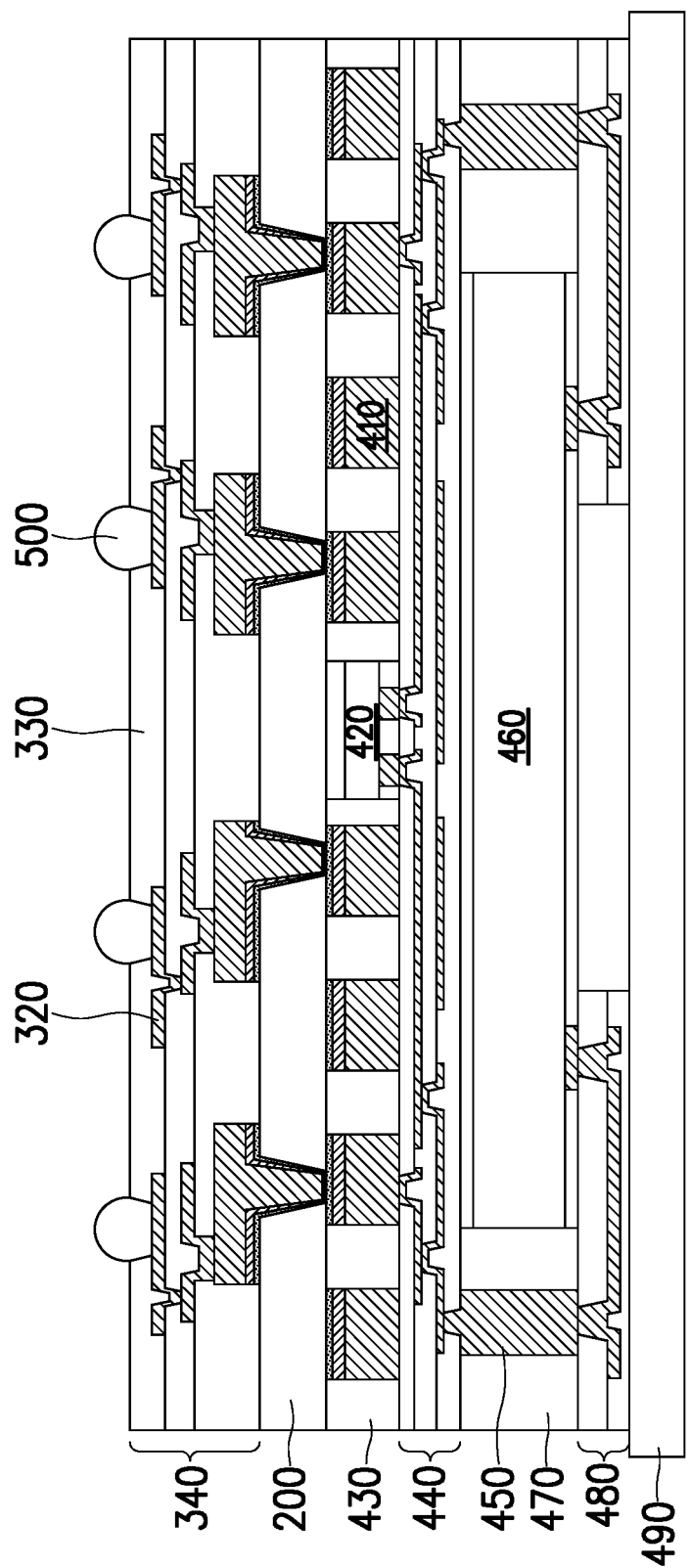
Figure 2T:
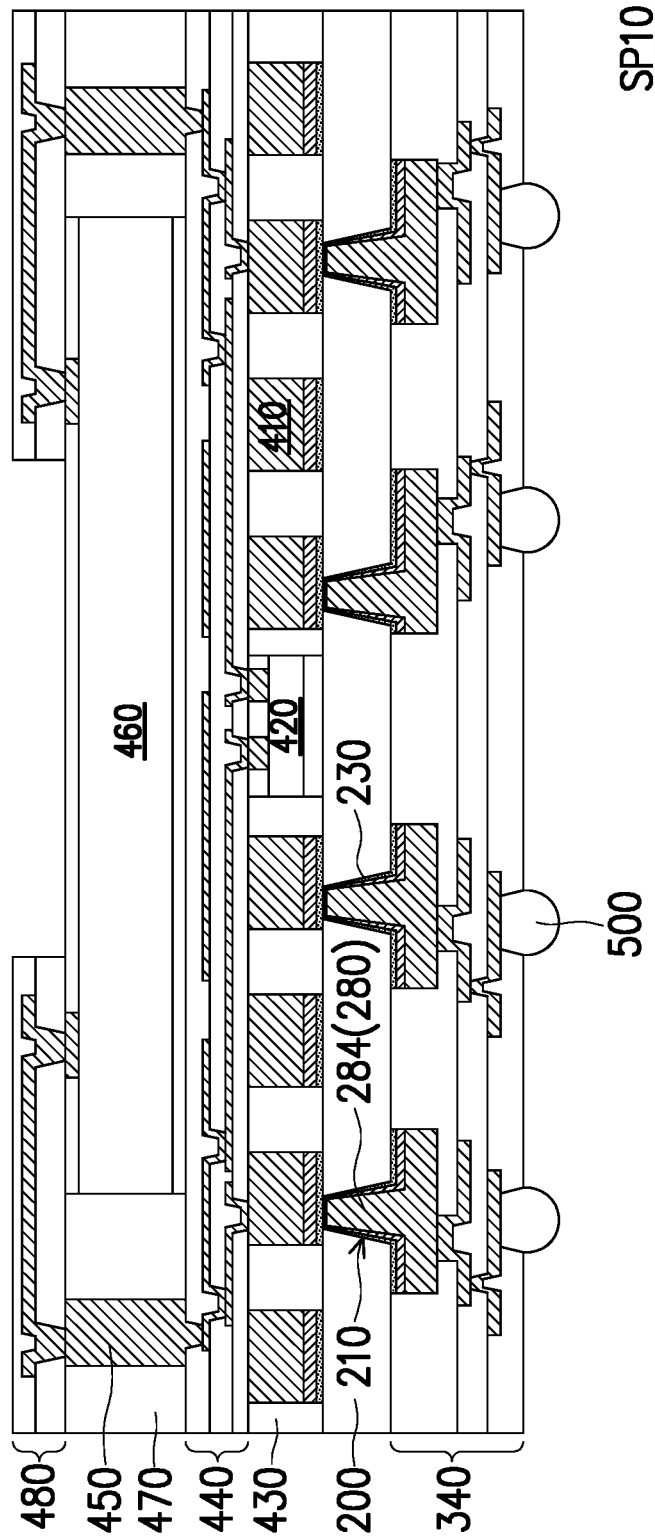

Referring to FIG. 2R and FIG. 2S, an auxiliary carrier 490 may be bonded to the RDL 480, and the carrier 350 may be removed. For example, if an LHTC layer is included in the debonding layer, the LHTC may be irradiated to release the carrier 350. The outermost dielectric layer 330 of the frontside RDL 340 may thus be available for further processing. In some embodiments, openings are formed in the dielectric layer 330, for example via laser drilling, to expose regions of the underlying conductive layer 320. Conductive terminals 500 (optionally with underlying metallurgies, not shown) are formed in the openings to contact the exposed regions of the conductive layer 320. In some embodiments, the conductive terminals 500 include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e. g, a metal pillar with a solder ball attached), or the like.

Referring to FIG. 2S and FIG. 2T, in some embodiments, if the process has been performed at wafer level, a singulation step may be included to separate individual semiconductor packages SP10, and the carrier 490 may then be removed. Based on the process just described, it is possible to form semiconductor packages SP10 in which the redistribution structures (e.g., the frontside RDL 340 and the backside RDL 440 with the conductive blocks 410) at opposite sides of the substrate 200 are interconnected by through substrate vias (e.g., the routing vias 284) formed in through holes 210 of the substrate 200. What is more, by temporarily masking the through holes 210 as blind holes by way of the backside film 220, the plating steps at opposite sides of the substrate 200 may be performed at different manufacturing stages. This allows not only to build asymmetrical redistribution structures at the opposite sides of the substrate 200, but also to use, for example, single-side plating tools rather than double-side plating tools. What is more, at least one the frontside RDL 340 is directly connected to the routing vias 284 without intervening barrier layers, thus lowering the resistance of the electrical connection. In some embodiments, the redistribution structures at opposite side of the substrate 200 may be formed through a simple sequence of steps. In some embodiments, the frontside barrier layer 230 is interposed between the conductive material of the routing vias 284 and the substrate 200, thus enhancing adhesion and preventing or reducing delamination failures. Furthermore, out-diffusion of the conductive material to the substrate 200 may also be prevented or reduced.

Figure 3:
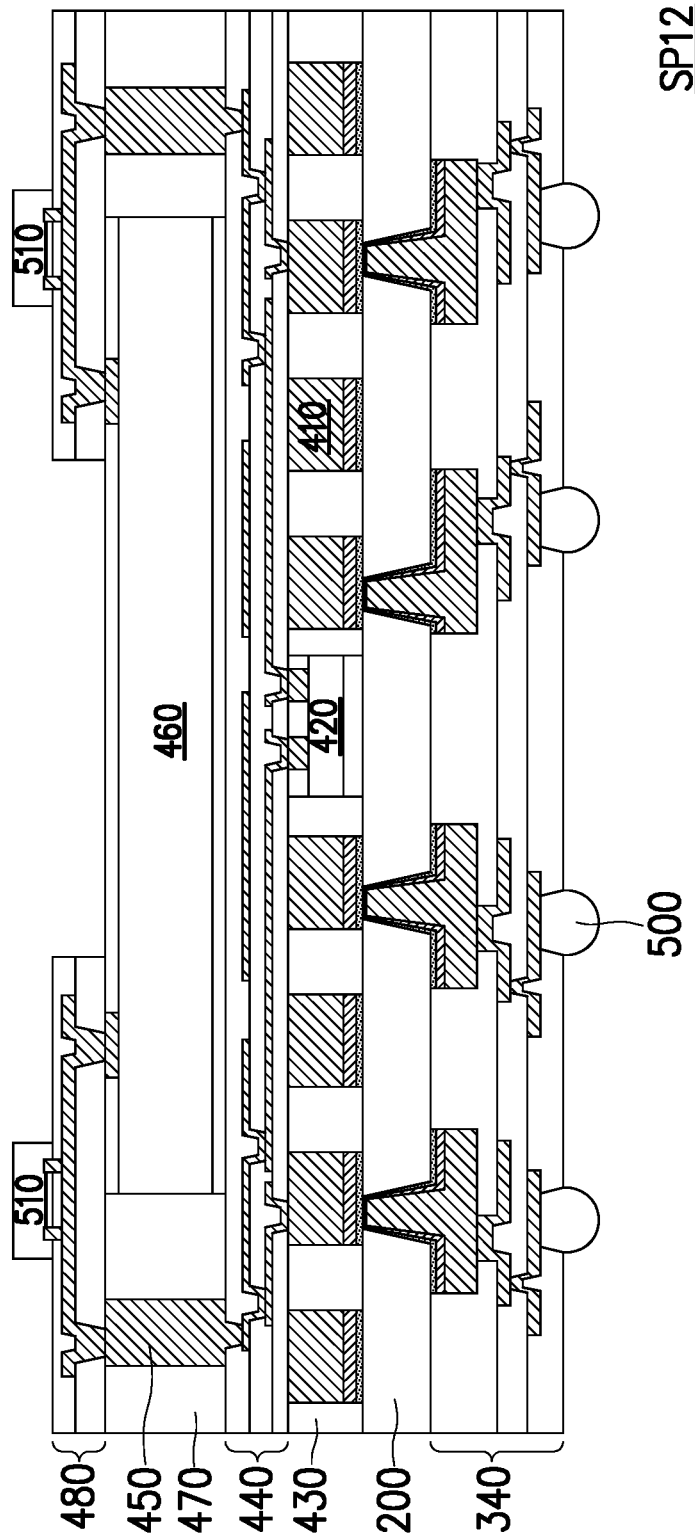
FIG. 3 is a schematic cross-sectional view of a semiconductor package according to some embodiments of the disclosure.

In some embodiments, the semiconductor package SP10 may be integrated with additional components. For example, in FIG. 3, the semiconductor package SP12 has substantially the same structure as the semiconductor package SP10 of FIG. 2T, with additional integrated passive devices 510 connected to the RDL 480, for example in between the semiconductor die 460 and the TIVs 450. In some embodiments, the integrated passive devices 510 may preliminary transform the signal transmitted by the semiconductor die 460 upon detection of an external stimulus. It will be apparent that the structures illustrated for the semiconductor packages SP10, SP12 are only exemplary, and that different components may be formed at the two sides of the substrate 200 (e.g., different types or number of semiconductor dies 420, 460, RDLs 440, 480, etc.). Furthermore, all semiconductor packages disclosed may include additional components (such as the integrated passive devices 510), or may be integrated in larger electronic devices (for example, by connecting to printed circuit boards or the like via the conductive terminals 500).

Figure 4:
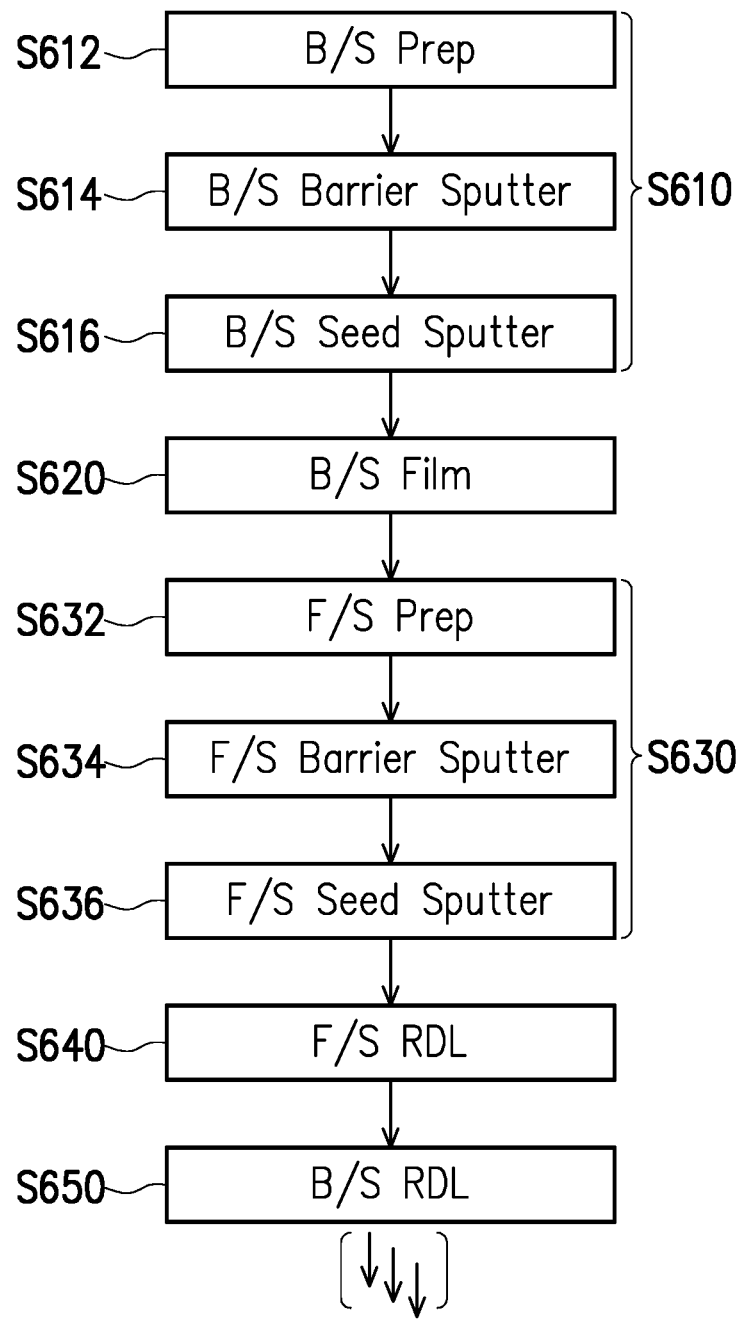
FIG. 4 is a schematic flow chart illustrating some steps of a manufacturing method of a semiconductor package according to some embodiments of the disclosure.
Figure 5A:
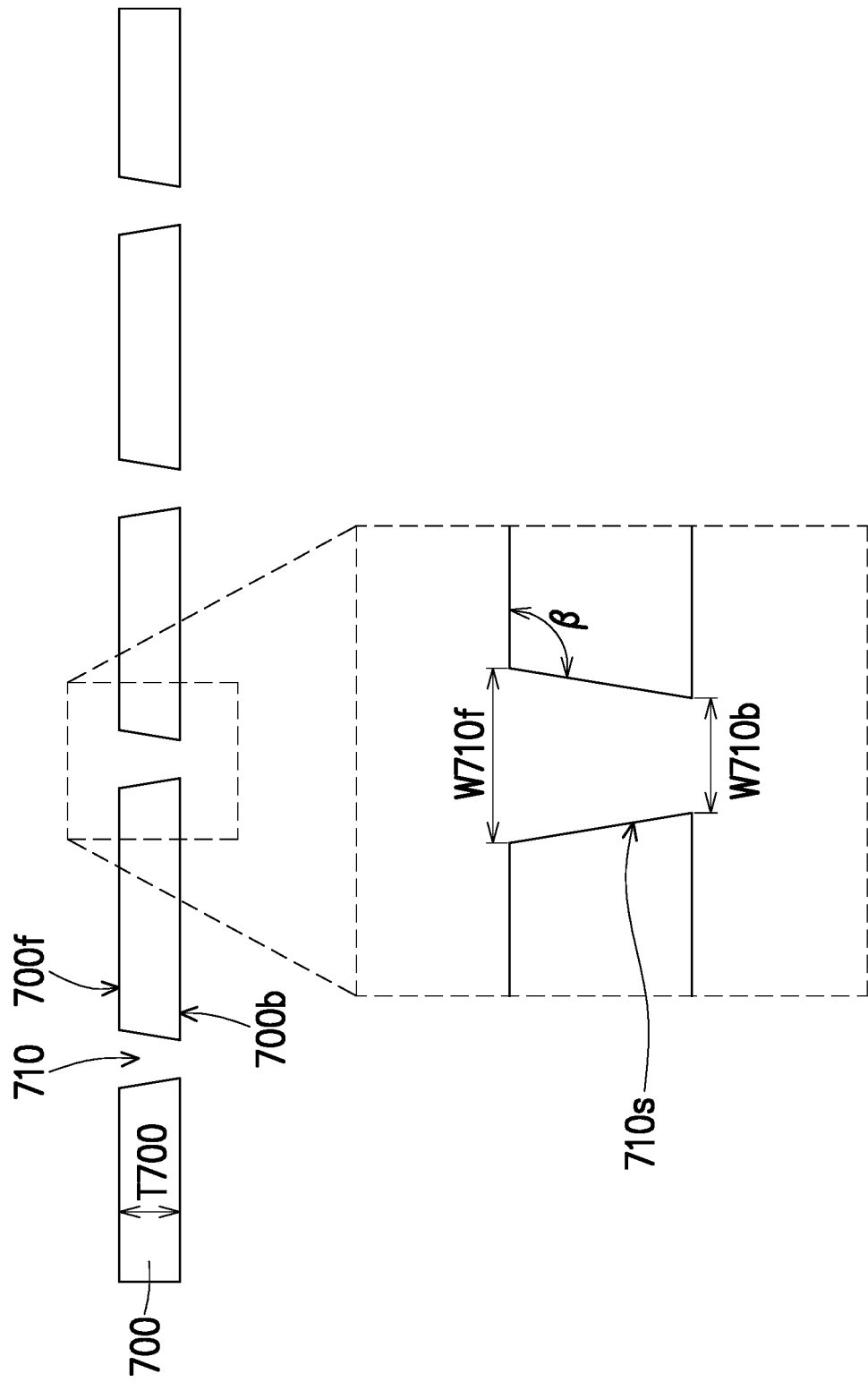

FIG. 4 is a schematic flow chart illustrating some steps of a manufacturing method of a semiconductor package SP14 according to some embodiments of the disclosure. FIG. 5A to FIG. 5L are schematic cross-sectional views illustrating structures formed during a manufacturing process of the semiconductor package SP14 according to some embodiments of the disclosure. In FIG. 5A, a substrate 700 (e.g., an interposer) is provided. In some embodiments, the substrate 700 is a wafer of an inorganic material, and the inorganic material may be selected as described above for the substrate 200 of FIG. 2A.

In some embodiments, through holes 710 are formed in the substrate 700, extending all the way from the frontside surface 700f of the substrate 700 to the opposite backside surface 700b, for the entire thickness T700 of the substrate 700. In some embodiments, the thickness of the substrate 700 is larger than 200 micrometers, 300 micrometers, or even 500 micrometers, for example in the range between 300 micrometers and 1 millimeter. In some embodiments, the through holes 710 are formed by laser drilling, as previously described for the substrate 200 of FIG. 2A, and have tapered sidewalls 710s, so that a width W710f of the through holes 710 at the frontside surface 700f of the substrate 700 is greater than a width W710b of the through holes 710 at the backside surface 700b of the substrate 700. The tapering angle α defined by the frontside surface 700f of the substrate 700 and the sidewalls 710s of the through holes 710 may be greater than 90 degrees, for example in the range between 90 degrees and 120 degrees. In some embodiments, the through holes 710 have a high aspect ratio (e.g., the ratio between the thickness T700 of the substrate and the width W710f of the through holes 710 at the frontside surface 700f of the substrate 700), for example in the range from 1.5 to 5.

In some embodiments, the substrate 700 is introduced in a sputtering chamber to perform a sputtering process from the side of the backside surface 700b (step S610 in FIG. 4). In some embodiments, the sputtering process S610 includes a surface preparation step S612, a barrier layer sputtering step S614 and a seed layer sputtering step S616. In the surface preparation step S612, the backside surface 700b and the sidewalls 710s of the through holes 710 are pre-treated for subsequent material deposition. In some embodiments, a cleaning step, for example via plasma treatment, is performed to remove impurities which may have deposited or otherwise formed on the backside surface 700b and the sidewalls 710s. After cleaning, the sputtering chamber may be brought to the target temperature and pressure for the subsequent sputtering operations.

Figure 5B:
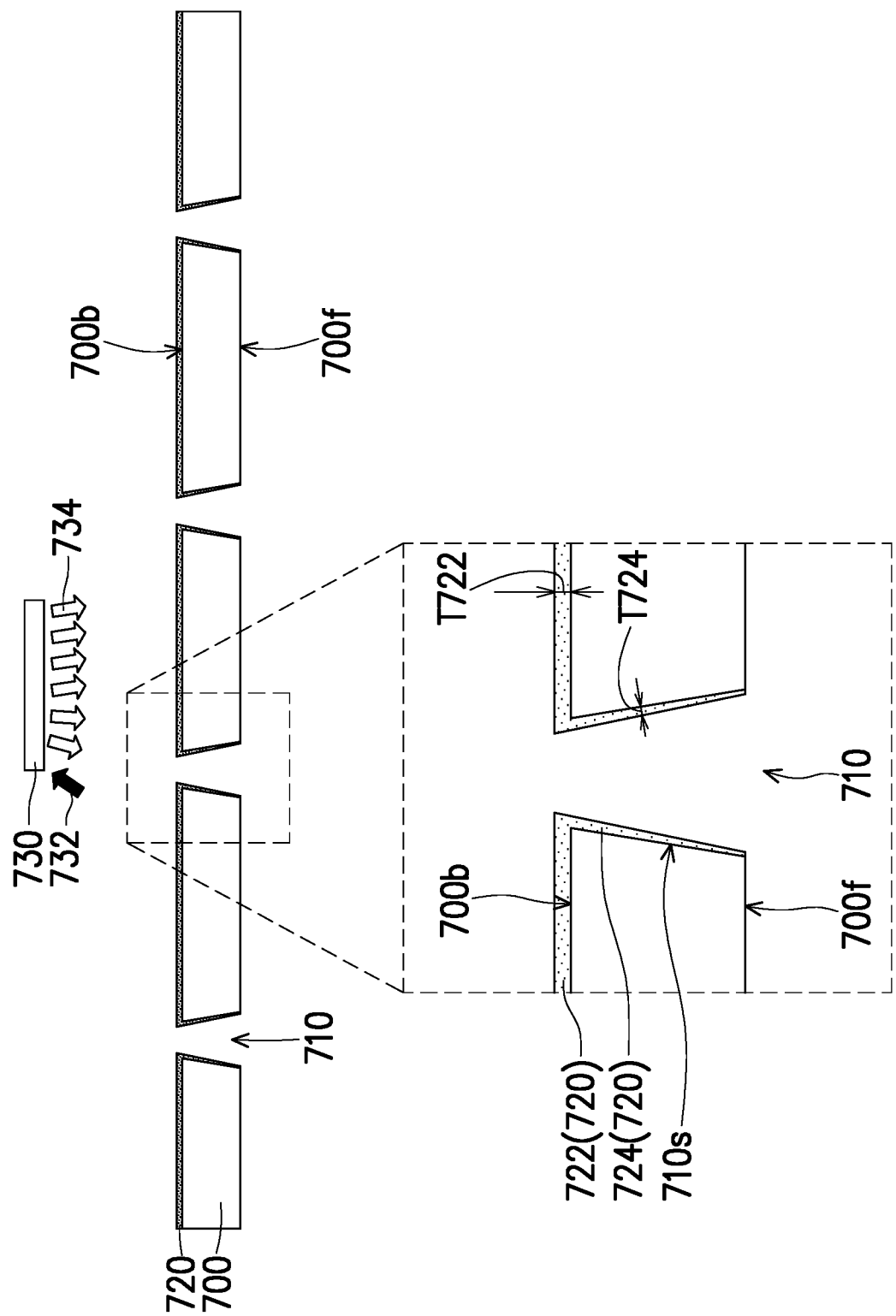

In FIG. 5B, the material of a backside barrier layer 720 is sputtered on the backside surface 700b of the substrate 700 and at least part of the sidewalls 710s of the through holes 710 (step S614 in FIG. 4). For example, one or more sputtering targets 730 are hit with high energy incident atoms or ions 732 to eject sputtered material 734 which is then deposited on the substrate 700. In some embodiments, the pressure of the sputtering chamber and the energy of the incident atoms or ions 732 are selected so that the mean free path of the sputtered material 734 is sufficiently long to deposit on the sidewalls 710s of the through holes 710 close to the frontside surface 700f. It should be noted that while a single target 730 is illustrated in FIG. 5B, the disclosure is not limited thereto. For example, depending on the desired composition of the backside barrier layer 720, multiple sputtering targets 730 may be used. In some embodiments, the backside barrier layer 720 includes a metallic material, such as titanium, tantalum, a nitride thereof, or a combination thereof. In some embodiments, the backside barrier layer 720 is a titanium-containing layer, including a titanium-based material such as titanium, titanium nitride, or a combination thereof. In some embodiments, the backside barrier layer 720 is a tantalum-containing layer, including a tantalum-based material such as tantalum, tantalum nitride, or a combination thereof.

In some embodiments, the sputtered material 734 reaches the substrate 700 from the side of the backside surface 700b. The resulting backside barrier layer 720 may thus include sections 722 extending on the backside surface 700b of the substrate 700 and sections 724 extending on the sidewalls 710s of the through holes 710. The thicknesses T722, T724 may be measured along directions normal to the surfaces 700b, 710s on which the corresponding sections 722, 724 of the frontside barrier layer 720 extend. In some embodiments, the sections 722 located on the backside surface 700b may have a substantially constant thickness T722 and the sections 724 located on the sidewalls 710s of the through holes 710 have a decreasing thickness T724 proceeding towards the frontside surface 700f. In some embodiments, the backside barrier layer 720 is formed to have a thickness T722 in the range from 1 micrometer to 10 micrometers.

Figure 5C:
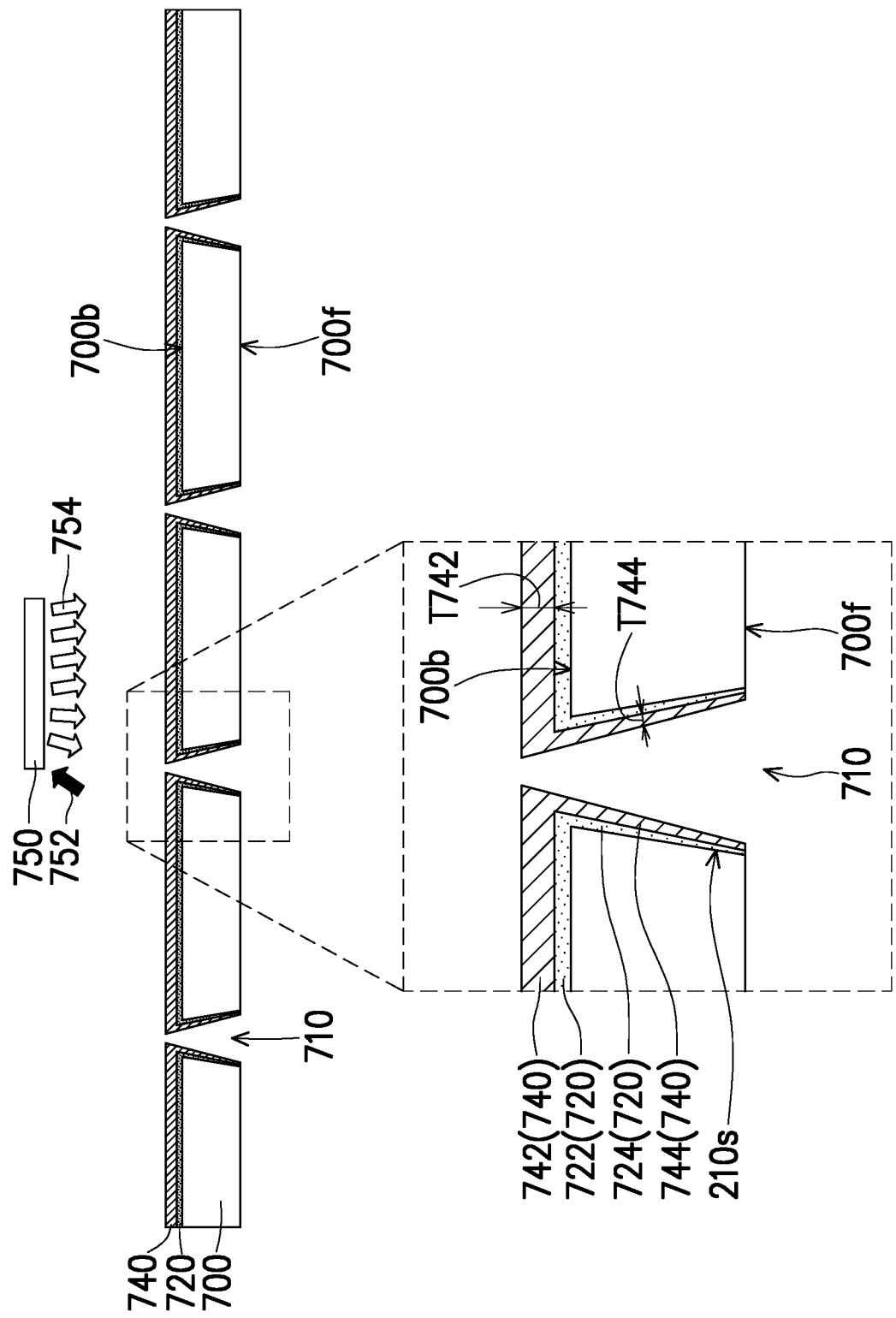

In FIG. 5C, the material of a backside seed layer 740 is sputtered on the backside barrier layer 720 (step S616 in FIG. 4). For example, one or more sputtering targets 750 are hit with high energy incident atoms or ions 752 to eject sputtered material 754 which is then deposited on the backside barrier layer 720. In some embodiments, the pressure of the sputtering chamber and the energy of the incident atoms or ions 752 are selected so that the mean free path of the sputtered material 264 is sufficiently long to form the backside seed layer 740 also on the section 724 of the backside barrier layer 720 on the sidewalls 710s of the through holes 710. It should be noted that while a single target 750 is illustrated in FIG. 5C, the disclosure is not limited thereto. For example, depending on the desired composition of the backside seed layer 740, multiple sputtering targets 750 may be used. In some embodiments, the backside seed layer 740 includes a metallic material, such as copper, silver, gold, nickel, titanium, alloys thereof, a combination thereof, or the like. In some embodiments, the backside seed layer 740 is a copper-containing layer, including copper-based materials such as copper or copper alloys.

In some embodiments, the sputtered material 754 reaches the substrate 700 from the side of the backside surface 700b. The resulting backside seed layer 740 may thus have a shape similar to the one described before for the backside barrier layer 720, including sections 742 extending on the sections 722 over the backside surface 700b of the substrate 700 and sections 744 extending on the sections 724 over the sidewalls 710s of the through holes 710. In some embodiments, the thicknesses T742, T744 of the individual sections 742, 744 of the backside seed layer 740 may become increasingly smaller proceeding from the backside surface 700b to the frontside surface 700f, similar to what was previously described with respect to the backside barrier layer 720. The thicknesses T742, T744 are measured along directions normal to the surfaces 700b, 710s on which the corresponding sections 742, 744 of the backside seed layer 740 extend. So, for example, the sections 742 located over the backside surface 200b may have a substantially constant thickness T742 and the sections 744 located over the sidewalls 710s of the through holes 710 have a decreasing thickness T744 proceeding towards the frontside surface 700f. In some embodiments, the backside seed layer 740 is formed to have a thickness T742 in the range from 1 micrometers to 10 micrometers. In some embodiments, the backside barrier layer 720 may decrease or even prevent diffusion of the material of the backside seed layer 740 into the substrate 700.

Figure 5D:
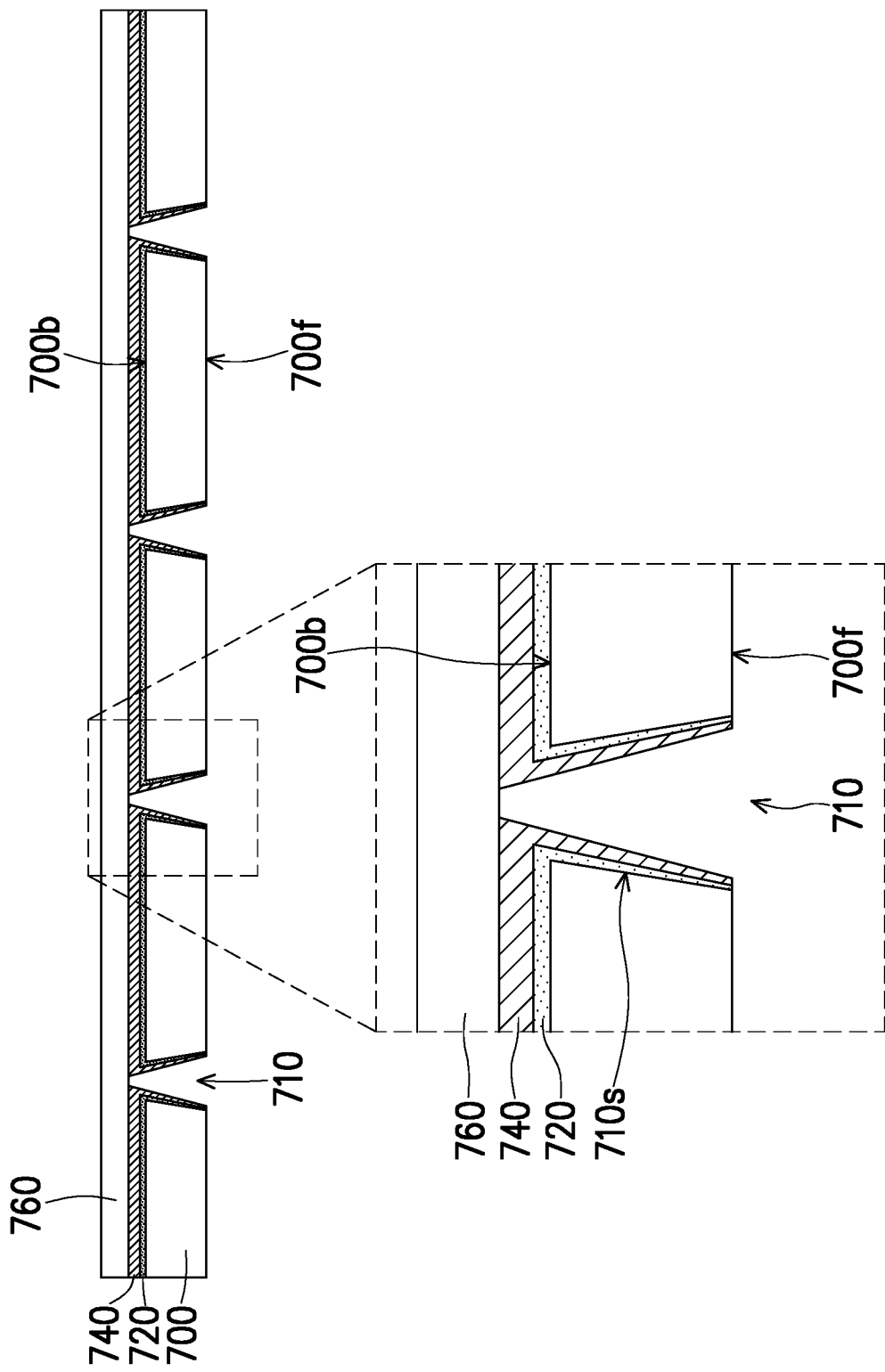

In some embodiments, once the backside barrier layer 720 and the backside seed layer 740 are formed, the substrate 700 may be taken out of the sputtering chamber for further processing. In some embodiments, after the sputtering process S610 is performed on the backside surface 700b of the substrate 700, the through holes 710 may still be open at both ends, i.e., at the side of both the frontside surface 700f and the backside surface 200b. In FIG. 5D, a backside film 760 is bonded to the backside surface 700b of the substrate 700 (step S620 in FIG. 4). The backside film 760 may be selected from similar options as described above for the backside film 220 of FIG. 2B. In some embodiments, the backside film 760 is adhered to the backside seed layer 740, covering most or all of the backside surface 700b. Most notably, the backside film 760 extends at the bottom (the narrower ends) of the through holes 710, so that the through holes 710 are plugged at the side of the backside surface 700b where the backside barrier layer 720 and the backside seed layer 740 have been formed. That is, the through holes 710 may in fact be masked as blind holes by way of the backside film 760.

In some embodiments, the substrate 700 with the backside barrier layer 720 and the backside seed layer 740 formed thereon and the backside film 760 bonded thereto is introduced in a sputtering chamber to perform a sputtering process from the side of the frontside surface 700f (step S630 in FIG. 4). In some embodiments, the sputtering process S630 includes a surface preparation step S632, a barrier layer sputtering step S634, and a seed layer sputtering step S636. In the preparation step S632, the frontside surface 700f of the substrate and the backside seed layer 740 on the sidewalls 710s of the through holes 710 are pretreated for subsequent material deposition. In some embodiments, the preparation step S632 includes a cleaning step, for example via plasma treatment, which cleaning step is performed to remove impurities deposited or otherwise formed, such as oxidation impurities of the material of the backside seed layer 740. After cleaning, the sputtering chamber may be brought to the target temperature and pressure for the subsequent sputtering operations.

In FIG. 5E, the material of a frontside barrier layer 770 is sputtered on the frontside surface 700f of the substrate 700 and on the backside seed layer 740 on the sidewalls 710s of the through holes 710 (step S634 in FIG. 4). For example, one or more sputtering targets 780 are hit with high energy incident atoms or ions 782 to eject sputtered material 784 which is then deposited on the substrate 700. In some embodiments, the pressure of the sputtering chamber and the energy of the incident atoms or ions 782 are selected so that the mean free path of the sputtered material 784 is sufficiently long to form the frontside barrier layer 770 also on the backside film 760 at the bottom of the through holes 710. It should be noted that while a single target 780 is illustrated in FIG. 5E, the disclosure is not limited thereto. For example, depending on the desired composition of the frontside barrier layer 770, multiple sputtering targets 780 may be used. In some embodiments, the frontside barrier layer 770 includes a metallic material, such as titanium, tantalum, a nitride thereof, or a combination thereof. In some embodiments, the frontside barrier layer 770 is a titanium-containing layer, including a titanium-based material such as titanium, titanium nitride, or a combination thereof. In some embodiments, the frontside barrier layer 770 is a tantalum-containing layer, including a tantalum-based material such as tantalum, tantalum nitride, or a combination thereof. In some embodiments, the backside barrier layer 720 and the frontside barrier layer 770 have substantially the same composition.

In some embodiments, the sputtered material 784 reaches the substrate 700 from the side of the frontside surface 700f. The resulting frontside barrier layer 770 may thus include sections 772 extending on the frontside surface 700f of the substrate 700, sections 774 extending on sections 744 of the backside seed layer 740 on the sidewalls 710s of the through holes 710, and sections 776 extending at the bottom of the through holes 710 on the frontside surface 760f of the backside film 760. In some embodiments, the thicknesses T772, T774, T776 of the individual sections 772, 774, 776 of the frontside barrier layer 770 may become increasingly smaller proceeding from the frontside surface 700f to the backside surface 700b. The thicknesses T772, T776 may be measured along a direction normal to the surface 700f, and the thickness T774 may be measured along a direction normal to the surface 710s. So, for example, the sections 772 located on the frontside surface 700f may have a substantially constant thickness T772 and the sections 774 located on the sidewalls 710s of the through holes 710 have a decreasing thickness T774 proceeding towards the backside surface 200b. The sections 776 at the bottom of the through holes 710 may have a thickness T776 comparable to the thickness T774 of the sections 774 in proximity of the bottom surface 700b. In some embodiments, the thickness T776 of the sections 776 may be slightly larger towards the center of the through holes 710 than closer to the sidewalls 710s. In some embodiments, the frontside barrier layer 770 is formed to have a thickness T772 in the range from 1 micrometers to 10 micrometers.

Figure 5F:
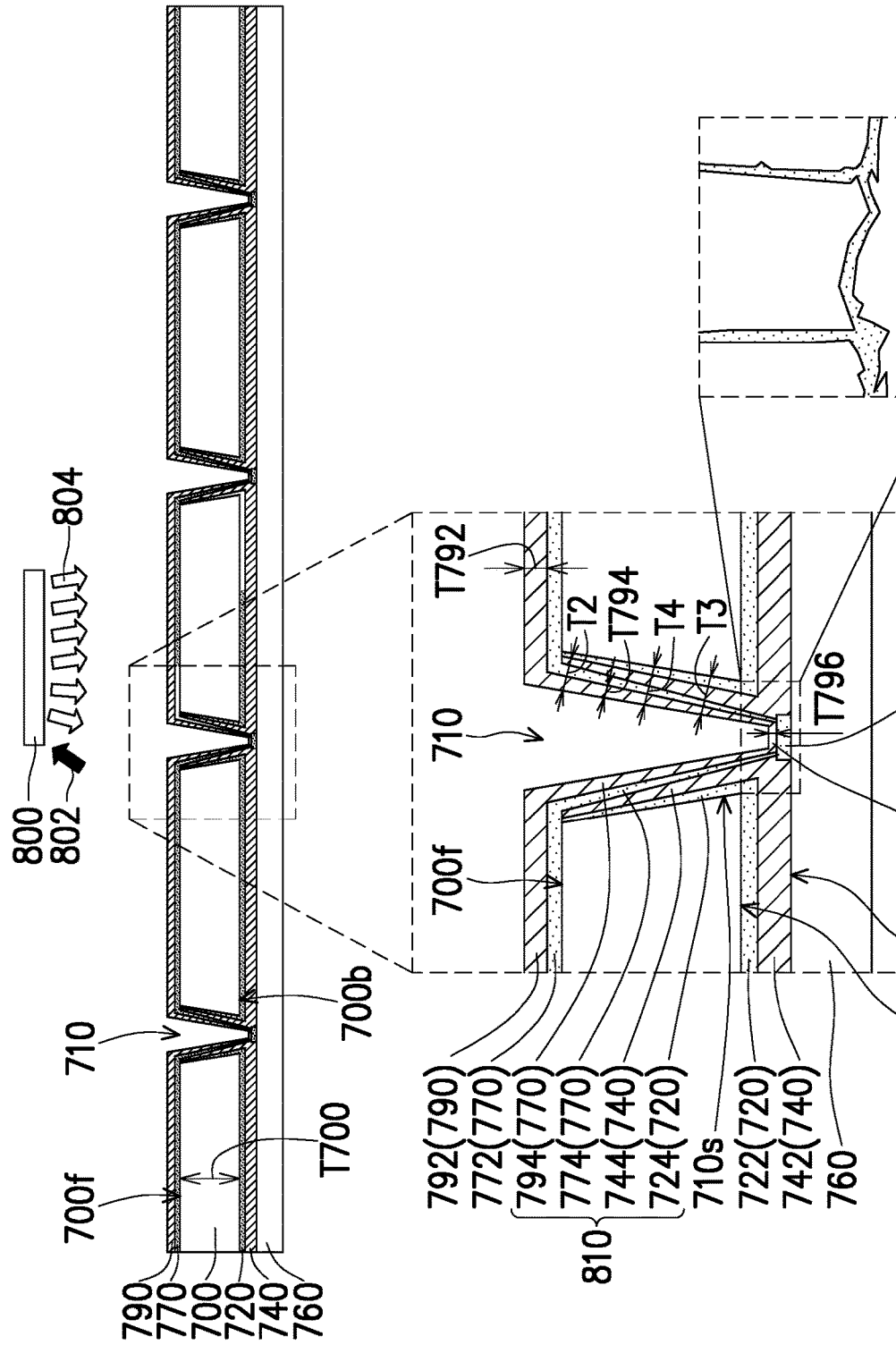

In FIG. 5F, the material of a frontside seed layer 790 is sputtered on the frontside barrier layer 770 (step S636 in FIG. 4). For example, one or more sputtering targets 800 are hit with high energy incident atoms or ions 802 to eject sputtered material 804 which is then deposited on the frontside barrier layer 770. In some embodiments, the pressure of the sputtering chamber and the energy of the incident atoms or ions 802 are selected so that the mean free path of the sputtered material 804 is sufficiently long to form the frontside seed layer 790 also on the section 776 of the frontside barrier layer 770 at the bottom of the through holes 710. It should be noted that while a single target 800 is illustrated in FIG. 5F, the disclosure is not limited thereto. For example, depending on the desired composition of the frontside seed layer 790, multiple sputtering targets 800 may be used. In some embodiments, the frontside seed layer 790 includes a metallic material, such as copper, silver, gold, nickel, titanium, alloys thereof, a combination thereof, or the like. In some embodiments, the frontside seed layer 790 is a copper-containing layer, including copper-based materials such as copper or copper alloys. In some embodiments, the backside seed layer 740 and the frontside seed layer 790 have substantially the same composition.

In some embodiments, the sputtered material 804 reaches the substrate 700 from the side of the frontside surface 700f. The resulting frontside seed layer 790 may thus have a shape similar to the one described before for the frontside barrier layer 770, including sections 792 extending on the sections 772 over the frontside surface 700f of the substrate 700, sections 794 extending on the sections 774 over the sidewalls 710s of the through holes 710, and sections 796 extending on the sections 776 at the bottom of the through holes 710 over the frontside surface 760f of the backside film 760. In some embodiments, the thicknesses T792, T794, T796 of the individual sections 792, 794, 796 of the frontside seed layer 790 may become increasingly smaller proceeding from the frontside surface 700f to the backside surface 700b of the substrate 700, similar to what was previously described with respect to the frontside barrier layer 770. The thicknesses T792, T796 may be measured along a direction normal to the surface 700f, and the thickness T794 may be measured along a direction normal to the surface 710s. So, for example, the sections 792 located over the frontside surface 700f may have a substantially constant thickness T792 and the sections 794 located over the sidewalls 710s of the through holes 710 have a decreasing thickness T794 proceeding towards the backside surface 700b. The sections 796 at the bottom of the through holes 710 may have a thickness T796 comparable to the thickness T794 of the sections 794 in proximity of the bottom surface 700b. In some embodiments, the thickness T796 of the sections 796 may be slightly larger towards the center of the through holes 710 than closer to the sidewalls 710s. In some embodiments, the frontside seed layer 790 is formed to have a thickness T792 in the range from 1 micrometers to 10 micrometers. In some embodiments, the frontside barrier layer 770 may decrease or even prevent diffusion of the material of the frontside seed layer 790 into the substrate 700.

In some embodiments, by sputtering the material of the backside barrier layer 720 and of the backside seed layer 740 from the side of the backside surface 700b and the material of the frontside barrier layer 770 and of the frontside seed layer 790 from the side of the frontside surface 700f, a composite seed-barrier layer 810 is formed along the sidewalls 710s of the through holes 710 by the sections 724, 744, 774, 794 of the barrier layers 720, 770 and the seed layers 740, 790 extending along the sidewalls 710s. In some embodiments, the dual-side sputtering process just described results in good coverage of the surfaces 700b, 700b, 710s of the substrate 700, even when the through holes 710 have a high aspect ratio. In some embodiments, an indication of the degree of the coverage may be obtained by comparing the thicknesses T2-T4 of the composite seed-barrier layer 810 at its thickest (e.g., T2 or T3) and thinnest (e.g., T4) points, where the thicknesses T2-T4 correspond to combined thicknesses of the barrier layers 720, 770 and seed layers 740, 790. For example, at regions closer to the frontside surface 700f or backside surface 700b, the thicknesses T2 and T3 of the composite seed-barrier layer 810 may be greater than the thickness T4 of the composite seed-barrier layer 810 at about the middle of the through holes 710 (e.g., at about half of the thickness T700 of the substrate 700). In some embodiments, the ratio of the thickness T4 to the thickness T2 or T3 (whatever is greater) may be in the range from 0.05 to 0.8 or more, also as a function of the aspect ratio of the through holes 710. By way of example and not of limitation, when the aspect ratio of the through holes 710 is about 1.5, the ratio of the thicknesses T4 to the thickness T2 or T3 may be about in the range from 0.5 to 0.8; when the aspect ratio of the through holes 710 is about 3, the ratio of the thickness T4 to the thickness T2 or T3 may be about in the range from 0.15 to 0.5; and when the aspect ratio of the through holes 710 is about 5, the ratio of the thickness T4 to the thickness T2 or T3 may be about in the range from 0.05 to 0.4.

In some embodiments, because a backside film 760 is installed on the backside surface 700b after depositing the backside barrier layer 720 and the backside seed layer 740, the material of the frontside barrier layer 770 and the frontside seed layer 790 also extends at the bottom of the through holes 710 as if they were blind holes. In the secondary inset in FIG. 5F, is shown a schematic cartoon of the spatial intensity distribution of the energy disperse signal (EDS) of the material of the frontside seed layer 790 at the bottom of the through holes 710. In the example shown in the inset, the frontside seed layer 790 is a copper-containing layer, and the EDS signal observed is the one of copper. As can be seen from the inset of FIG. 5F, a continuous copper signal spanning the distance between opposite sidewalls 710s at the bottom of the through holes 710 can be observed, indicating that the frontside seed layer 790 also extends at the bottom of the through holes 710.

Figure 5G:
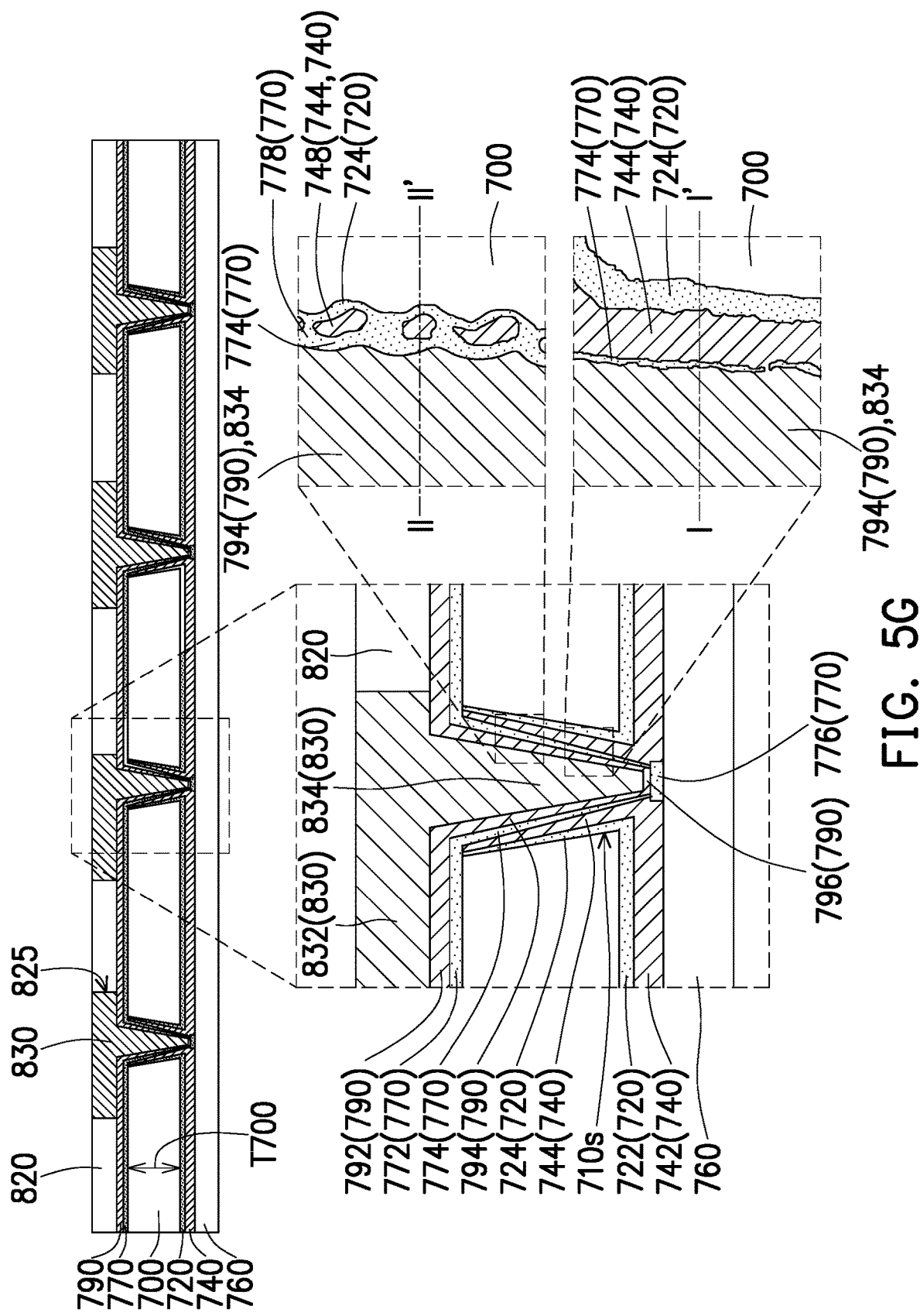
Figure 5H:
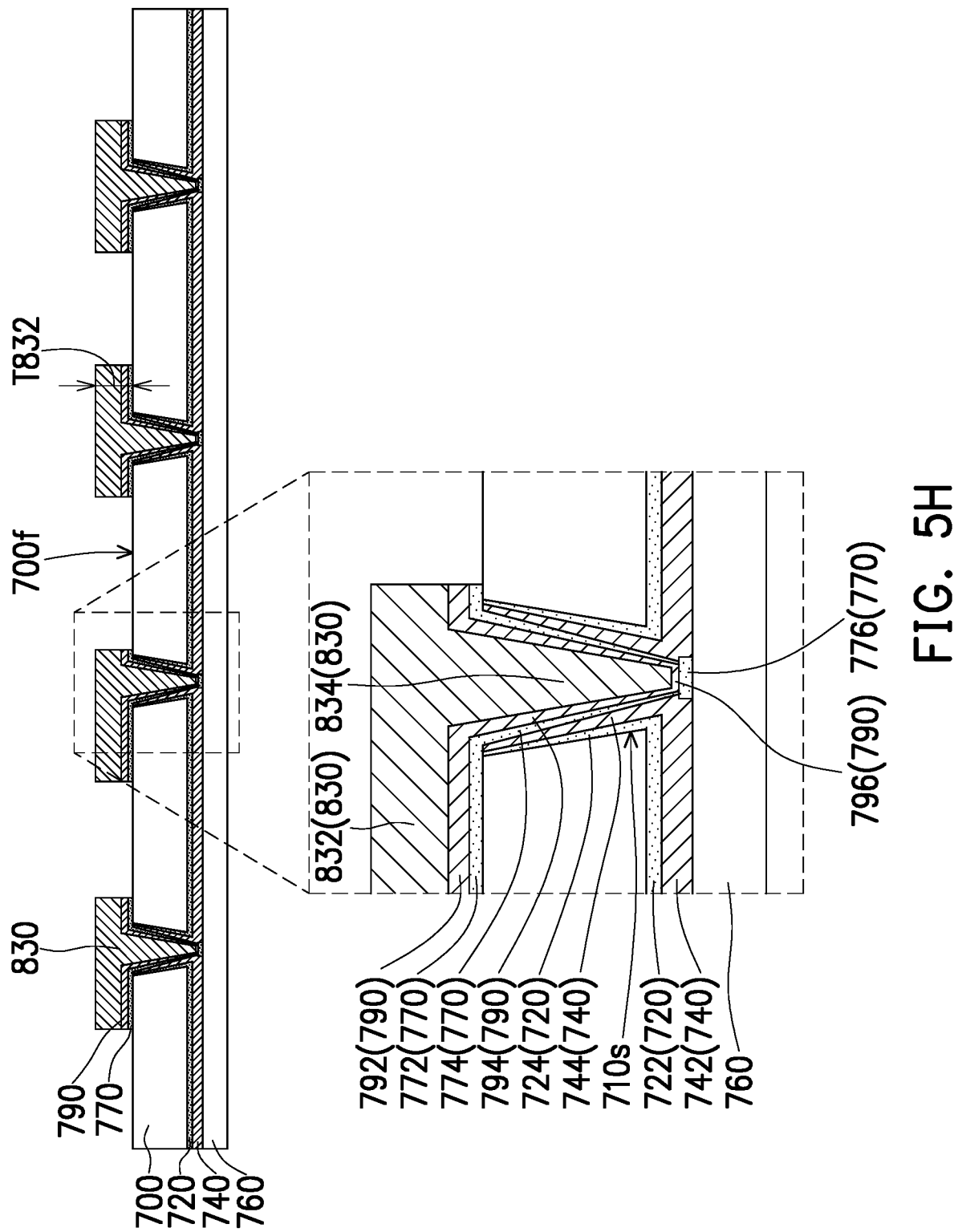
Figure 5I:
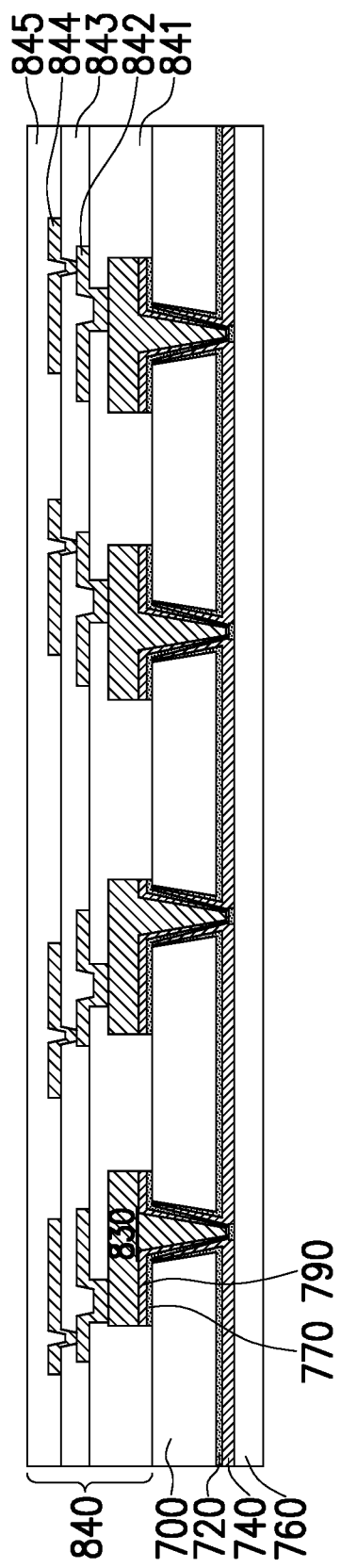
Figure 5J:
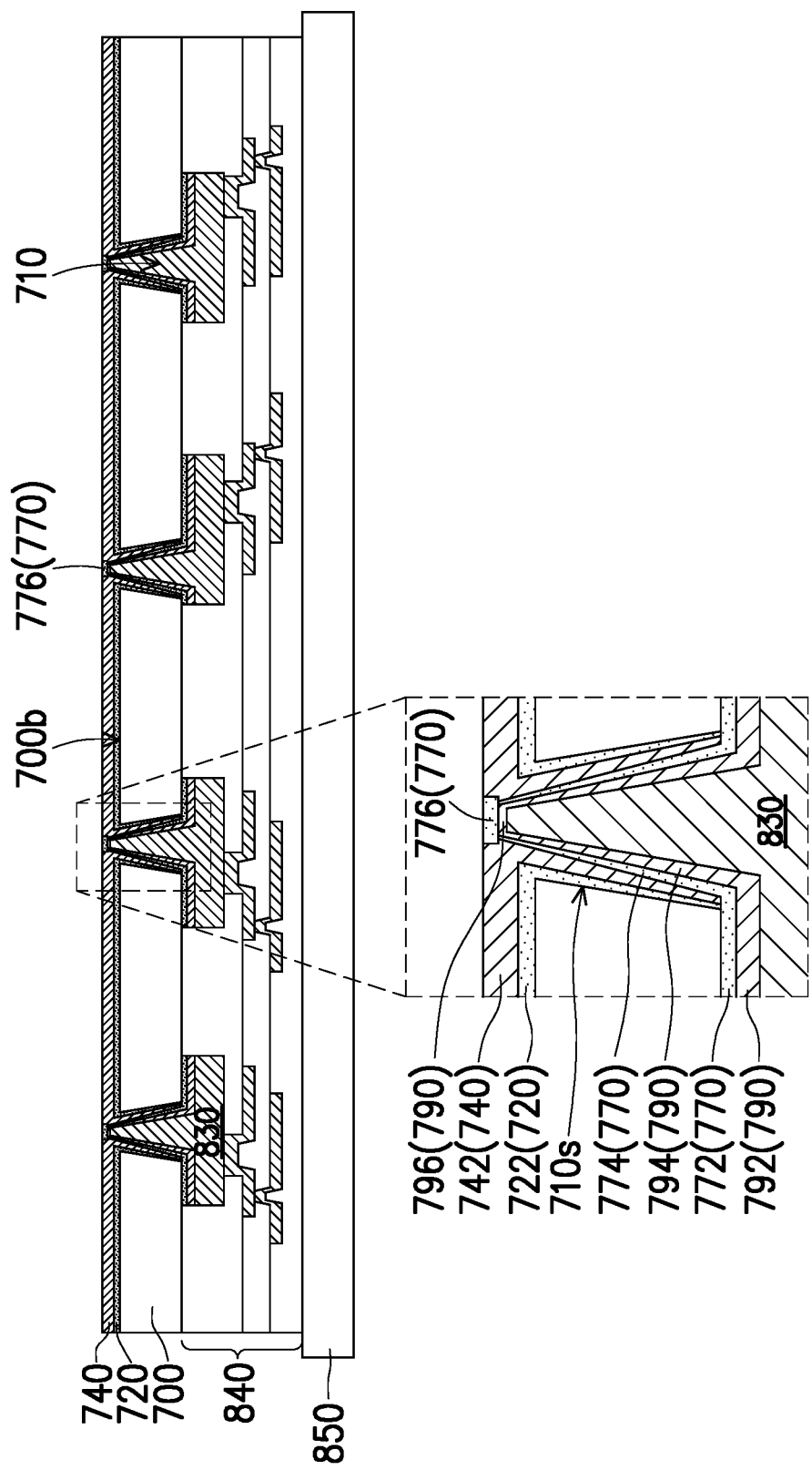

In some embodiments, once the frontside barrier layer 770 and the frontside seed layer 790 are formed, the substrate 700 may be taken out of the sputtering chamber for further processing. For example, as illustrated in FIG. 5G to FIG. 5I, a frontside RDL 840 may be formed on the frontside surface 700f (step S640 in FIG. 4). In FIG. 2G, a patterned mask 820 including openings 825 in correspondence of the through holes 710 is formed on the frontside seed layer 790, with similar material and processes as previously described for the patterned mask 270 with reference to FIG. 2E. Then, a conductive material is filled in the openings 825 and the through holes 710 to form the patterned conductive traces 830, with similar material and processes as previously described for the patterned conductive traces 830 of FIG. 2F. In some embodiments, the patterned conductive traces 830 include routing patterns 832 extending on the horizontal sections 792 of the frontside seed layer 790, and routing vias 834 filling the through holes 710 in between the sidewalls 710s. The routing vias 834 may extend from the level height of the sections 792 (at the bottom of the routing patterns 832) to the sections 796 of the frontside seed layer 790 extending on the backside film 760. The routing vias 834 may be integrally formed with the routing patterns 832.

The secondary insets of FIG. 5G are schematic cartoons of the spatial intensity distributions of the EDSs of the materials of the composite seed-barrier layer 810, the conductive traces 830, and the substrate 700. In the examples shown in the insets, the substrate 700 is an aluminum-containing substrate, the backside seed layer 740 and the frontside seed layer 790 are copper-containing layers, the patterned conductive traces 830 include a copper-containing conductive material, and the backside barrier layer 720 and the frontside barrier layer 770 are titanium-containing layers. The cartoons of the insets show the spatial intensity distribution of the EDSs of copper, aluminum, and titanium. In some embodiments, the composite seed-barrier layer 810 may present different microstructures in regions at different level heights along the direction of the thickness T700 of the substrate 700, which regions are located at different distances from the sputtering targets 730, 750, 780, 800 during the sputtering processes S610, S630. For example, in proximity of the bottom of the through vias 710, the backside barrier layer 720, the backside seed layer 740, the frontside barrier layer 770, and the frontside seed layer 790 are sequentially stacked over each other, resulting in a multi-layered structure as shown in the lower of the two secondary insets. Such multilayered structure may be visible, for example, at a depth corresponding to approximately 95% of the thickness T700 of the substrate 700. For example, if the thickness T700 of the substrate 700 (and hence the depth of the through holes 710) is about 500 micrometers, the multilayered structure of the bottom inset may be visible at about 480 micrometers from the frontside surface 700f. At the level height of the line I-I' illustrated in the inset, the individual layers 720, 740, 770, 790 of the composite seed-barrier layer 810 may have relative thicknesses of 3:6:1:2, respectively, where the thickness ratio of the frontside seed layer 790 and the frontside barrier layer 770 has been obtained from separate measurements (a sample on which single side sputter is performed).

On the other hand, at about halfway along the through holes 710, the composite seed-barrier layer 810 may present a different structure, as illustrated in the upper secondary inset. Halfway along the through holes 710 may correspond, for example, to a depth at about 50% of the thickness T700 of the substrate 700. For example, around the middle of the through holes 710, the section 724 of the backside barrier layer 720 may cover, substantially completely, the substrate 700, while the section 744 of the backside seed layer 740 may be discontinuous, presenting one or more gaps. The section 774 of the frontside barrier layer 770 may then fill the gaps of the backside seed layer 740, contacting the backside barrier layer 720. That is, the backside seed layer 740 may be present in the form of inclusions 748 (completely) surrounded by the material of the backside barrier layer 720 and the material of the frontside barrier layer 770. For example, adjacent inclusions 748 of the backside seed layer 740 may be separated from each other by protrusions 778 of the frontside barrier layer 770, which protrusions 778 contact the backside seed layer 720. The frontside seed layer 790 may continuously extend on the frontside barrier layer 770, to seed the deposition of the conductive material of the patterned conductive traces 830. That is, by forming the composite seed-barrier layer 810 via dual-side sputtering, discontinuities in the seed layer first deposited (e.g., the backside seed layer 740) may be filled by the later deposited barrier layer (e.g., the frontside barrier layer 770), and the seed layer finally deposited (e.g., the frontside seed layer 790) may substantially continuously line the through holes 710 to effectively seed the subsequent deposition of conductive material. In some embodiments, in correspondence of one of the inclusions 748 of the backside seed layer 740, for example at the level height of the line II-II', the individual layers 720, 740, 770, 790 of the composite seed-barrier layer 810 may have relative thicknesses of 1:2:2:4, respectively, where the thickness ratio of the frontside seed layer 790 and the frontside barrier layer 770 has been obtained from separate measurements (a sample on which single side sputter is performed).

Referring to FIG. 5G and FIG. 5H, the patterned mask 820 and the underlying portions of the frontside seed layer 790 and the frontside barrier layer 770 are removed, for example via stripping, ashing, and/or etching, as previously described with reference to FIG. 2G. The frontside seed layer 790 and the frontside barrier layer 770 still remain on the frontside surface 700f of the substrate 700 underneath the patterned conductive traces 830. In some embodiments, the patterned conductive traces 830 may be formed with routing patterns 832 having a thickness T832 in the range from 20 micrometers to 60 micrometers. Elsewhere, the frontside surface 700f of the substrate 700 may be (temporarily) exposed. In FIG. 5I, the dielectric layers 841, 843, 845 and the conductive layers 842, 844 of the frontside RDL 840 are formed as previously described with reference to FIG. 2H and FIG. 2I.

Figure 5K:
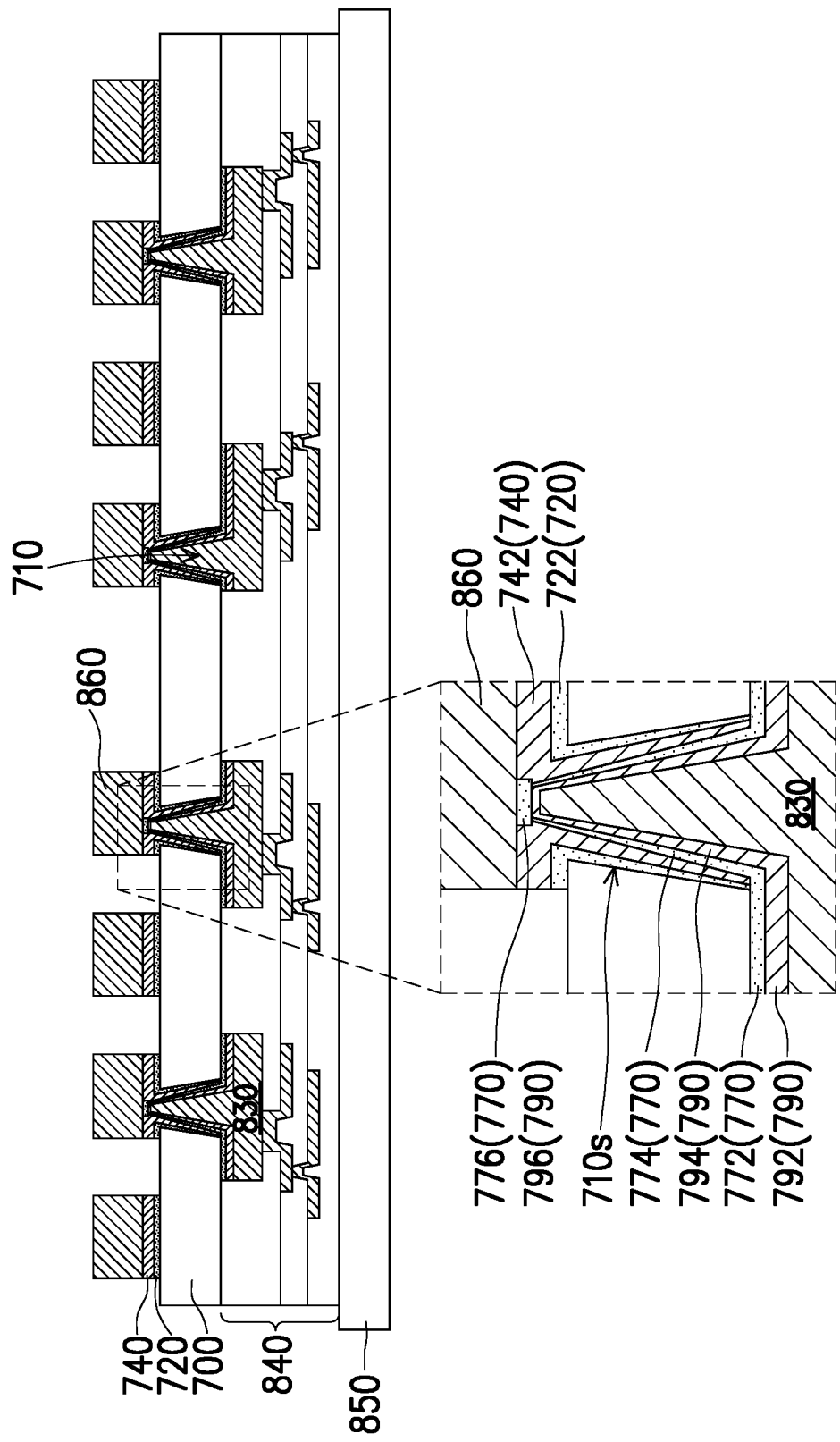
Figure 5L:
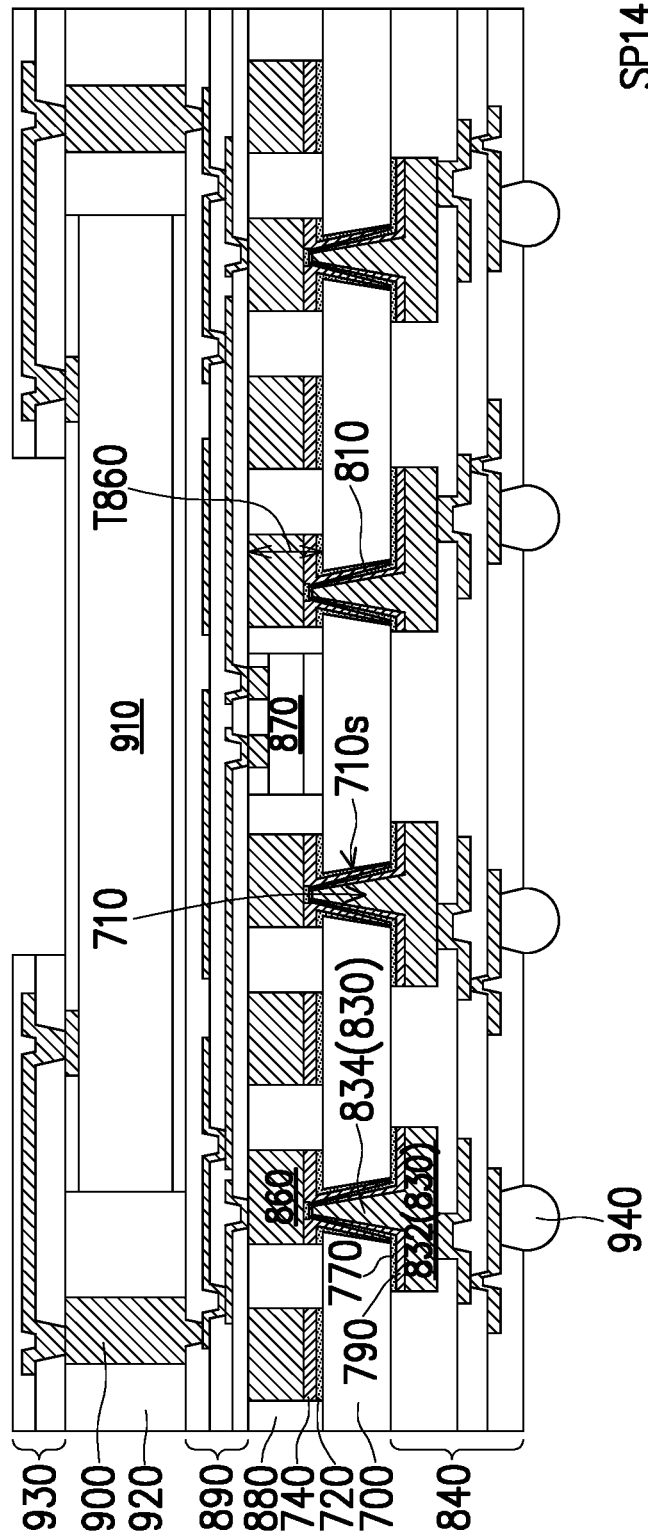

Referring to FIG. 5I and FIG. 5L, in some embodiments, a backside RDL 890 may be formed on the backside surface 700b (step S650 in FIG. 4). For example, referring to FIG. 5J, a carrier 850 is detachably bonded to the uppermost dielectric layer 845 of the frontside RDL 840, with similar material and processes as previously described for the carrier 350 of FIG. 2J. The backside film 760 is removed (e.g., peeled) away from the backside surface 700b of the substrate 700, thus exposing the sections 742 of the backside seed layer 740. In correspondence of the through holes 710, the sections 776 of the frontside barrier layer 770 are exposed in between the sections 742 of the backside seed layer 740, substantially coplanar with the backside seed layer 740.

In FIG. 5K, conductive blocks 860 are formed on the backside seed layer 740 following a similar process as previously described for the conductive blocks 410 with reference to FIGS. 2M and 2N. The conductive blocks 860 may be routing patterns extending on the backside seed layer 740, electrically connected (via the respective seed layers 740, 790 and barrier layers 720, 770) to the conductive traces 830 filling the through holes 710. The portions of backside seed layer 740 and backside barrier layer 720 not covered by the conductive blocks 860 are removed to expose the backside surface 700b of the substrate 700, similar to what was previously described with reference to FIG. 2N, while portions of the backside seed layer 740 and the backside barrier layer 720 remains at the bottom of the conductive blocks 860. As illustrated in the inset of FIG. 5K, the conductive blocks 860 may contact the section 776 of the frontside barrier layer 770, as well as the backside seed layer 740. In some alternative embodiments, the section 776 of the frontside barrier layer 770 may be removed before forming the conductive blocks 860.

In some embodiments, the semiconductor package SP14 of FIG. 5L may be obtained from the structure illustrated in FIG. 5K following similar processes as previously described with reference to FIG. 2O to FIG. 2T. Briefly, a semiconductor die 870 may be disposed on the substrate 700 amongst the conductive blocks 860, as previously described for the semiconductor die 420. In some embodiments, the semiconductor die 870 is a logic die, such as a signal processing die. In some embodiments, the conductive blocks 860 are formed of a thickness T860 comparable to the semiconductor die 870, for example greater than 100 micrometers, such as in the range from 100 micrometers to 250 micrometers. The encapsulant 880 may be formed on the substrate 700 to laterally wrap the conductive blocks 860 and the semiconductor die 870. The backside RDL 890 may then be formed on the encapsulated semiconductor die 870, electrically contacting the semiconductor die 870 and connecting the semiconductor die 870 to the conductive blocks 860. Through insulator vias 900 are then formed on the backside RDL 890, on an opposite side of the backside RDL 890 with respect to the semiconductor die 870 and the conductive blocks 860. A semiconductor die 910 may be bonded on the backside RDL 890 amongst the TIVs 900. The semiconductor die 910 may be a microelectromechanical system, capable of sensing external stimuli such as radiation, sound waves, touch, pressure, or the like. The semiconductor die 910 and the TIVs 900 may be encapsulated in the encapsulant 920, and the additional RDL 930 may then be formed. The RDL 930 may leave exposed a sensing area of the semiconductor die 910. The semiconductor die 910 may be connected to the conductive blocks 860 and the semiconductor die 870 via the RDLs 890, 930 and the TIVs 900, so that signals generated by the semiconductor die 910 in response to detected external stimuli may be transmitted to the semiconductor die 870 for further processing. Conductive terminals 940 may be installed on the frontside RDL 840 at an opposite side with respect to the substrate 700, to integrate the semiconductor package SP14 within larger devices.

Based on the process just described, it is possible to form semiconductor packages SP14 in which the redistribution structures (e.g., the frontside RDL 840 and the backside RDL 890 with the conductive blocks 860) at opposite sides of the substrate 700 are interconnected by through substrate vias (e.g., the routing vias 834) formed in through holes 710 of the substrate 700. In some embodiments, a composite seed-barrier layer 810 is formed on the sidewalls 710s of the through holes 710, by sputtering the backside barrier layer 720 and the backside seed layer 740 from the one side of the substrate 700, and sputtering the frontside barrier layer 770 and the frontside seed layer 790 from the opposite side of the substrate 700. By doing so, adequate coverage may be achieved even when the through holes 710 have a high aspect ratio, so that the composite seed-barrier layer 810 may effectively seed the deposition of the conductive material of the routing vias 834 while enhancing adhesion to the substrate 700. Furthermore, out-diffusion of the conductive material to the substrate 700 may also be prevented or reduced. What is more, by temporarily masking the through holes 710 as blind holes by way of the backside film 760 (illustrated, e.g., in FIG. 5D) after sputtering on one side of the substrate 700, the plating steps at opposite sides of the substrate 700 may be performed at different manufacturing stages. This allows not only to build asymmetrical redistribution structures at the opposite sides of the substrate 700, but also to use, for example, single-side plating tools rather than double-side plating tools. In some embodiments, the routing pattern 832 of the bottommost layer of the frontside RDL 840 are integrally formed with the routing vias 834 (e.g., without an intervening barrier layer), thus lowering the resistance of the electrical connection. In some embodiments, the redistribution structures at opposite sides of the substrate 700 may be formed through a simple sequence of steps.

Figure 6:
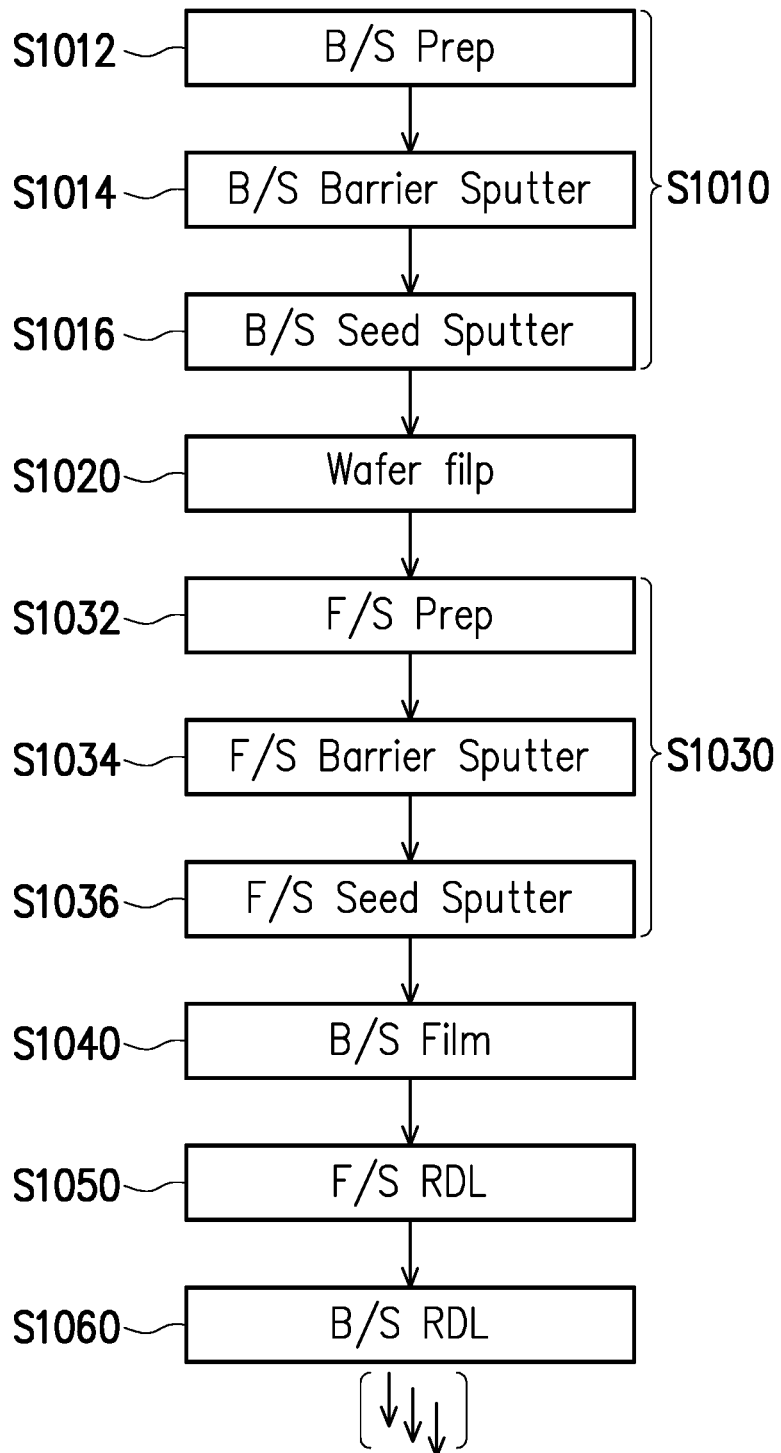
FIG. 6 is a schematic flow chart illustrating some steps of a manufacturing method of a semiconductor package according to some embodiments of the disclosure.

FIG. 6 is a schematic flow chart illustrating some steps of a manufacturing method of a semiconductor package SP16 according to some embodiments of the disclosure. FIG. 7A to FIG. 7H are schematic cross-sectional views illustrating structure s formed during a manufacturing process of the semiconductor package SP14 according to some embodiments of the disclosure. In some embodiments, the structure of FIG. 7A may be obtained following substantially the same steps previously discussed with reference to FIG. 5A to FIG. 5C. Briefly, the substrate 1100 is provided, and the through holes 1110 are formed in the substrate 1100, extending all the way from the frontside surface 1100f of the substrate 1100 to the opposite backside surface 1100b. In some embodiments, the thickness of the substrate 1100 is larger than 200 micrometers, 300 micrometers, or even 500 micrometers, for example in the range between 300 micrometers and 1 millimeter. In some embodiments, the through holes 1110 have a high aspect ratio, for example in the range from 1.5 to 5.

In some embodiments, the substrate 1100 is introduced in a sputtering chamber to perform a sputtering process from the side of the backside surface 1100b (step S1010 in FIG. 6). In some embodiments, the sputtering process S1010 includes preparing the backside surface 1100b (e.g., step S1012 in FIG. 6), and then sputtering the backside barrier layer 1120 (step S1014 in FIG. 6) and the backside seed layer 1130 (step S1016 in FIG. 6) from the side of the backside surface 100b. The backside barrier layer 1120 thus includes sections 1122 extending on the backside surface 1100b and sections 1124 extending on the sidewalls 1110s of the through holes 1110, and the backside seed layer 1130 includes sections 1132 extending on the sections 1122 and sections 1134 extending on the sections 1124. In some embodiments, the backside barrier layer 1120 includes a metallic material, such as titanium, tantalum, a nitride thereof, or a combination thereof. In some embodiments, the backside barrier layer 1120 is a titanium-containing layer, including a titanium-based material such as titanium, titanium nitride, or a combination thereof. In some embodiments, the backside barrier layer 1120 is a tantalum-containing layer, including a tantalum-based material such as tantalum, tantalum nitride, or a combination thereof. In some embodiments, the backside seed layer 1130 includes a metallic material, such as copper, silver, gold, nickel, titanium, alloys thereof, a combination thereof, or the like. In some embodiments, the backside seed layer 1130 is a copper-containing layer, including copper-based materials such as copper or copper alloys. In some embodiments, once the backside barrier layer 1120 and the backside seed layer 1130 are formed, the substrate 1100 may be flipped (step S1020 in FIG. 6), and a sputtering process S1030 may be performed from the side of the frontside surface 1100f. For example, the frontside surface 1100b may be prepared (e.g., plasma cleaned; step S1032 in FIG. 6) for subsequent deposition of material.

Figure 7A:
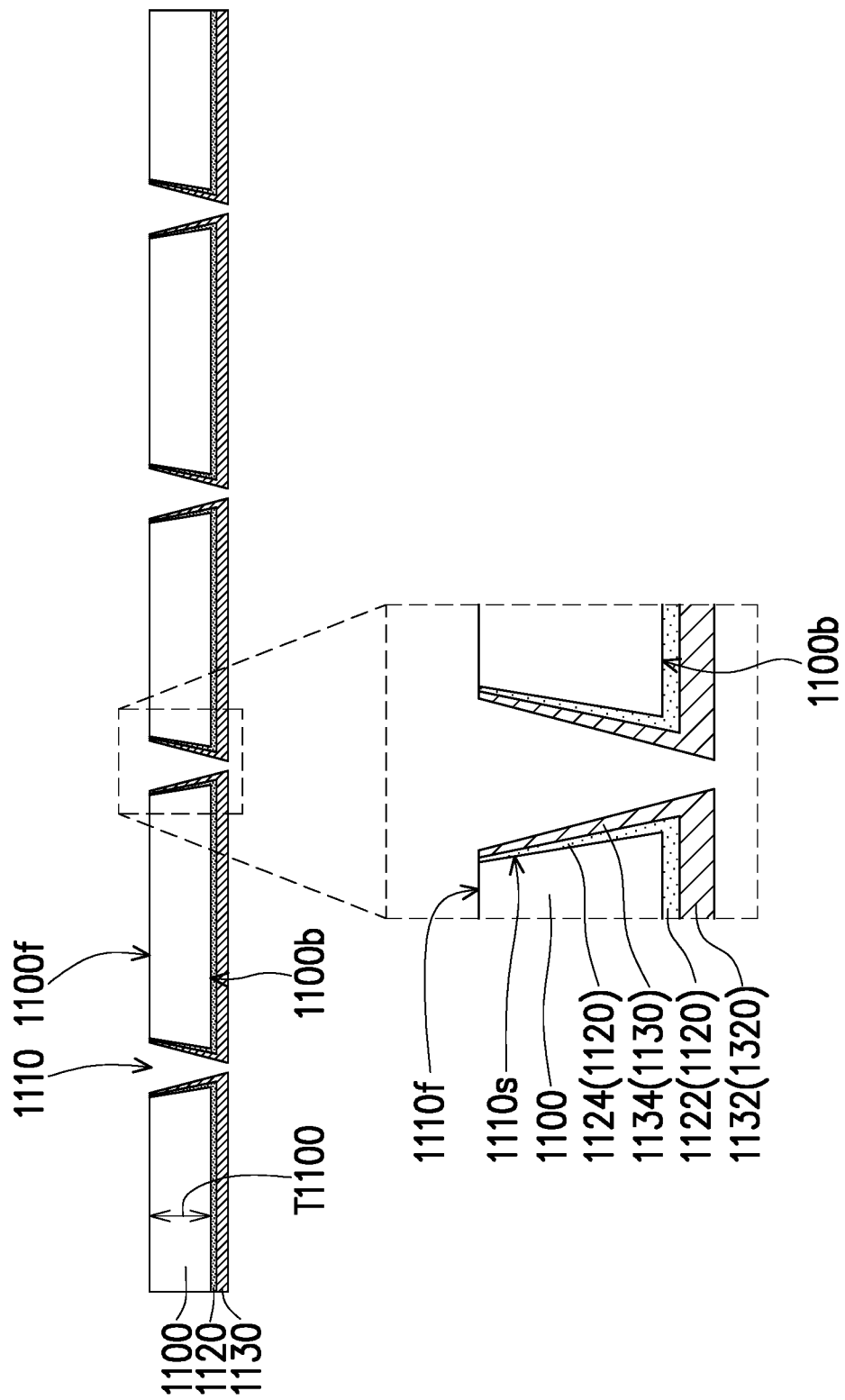
FIG. 7A to FIG. 7H are schematic cross-sectional views illustrating structures formed during a manufacturing process of a semiconductor package according to some embodiments of the disclosure.
Figure 7B:
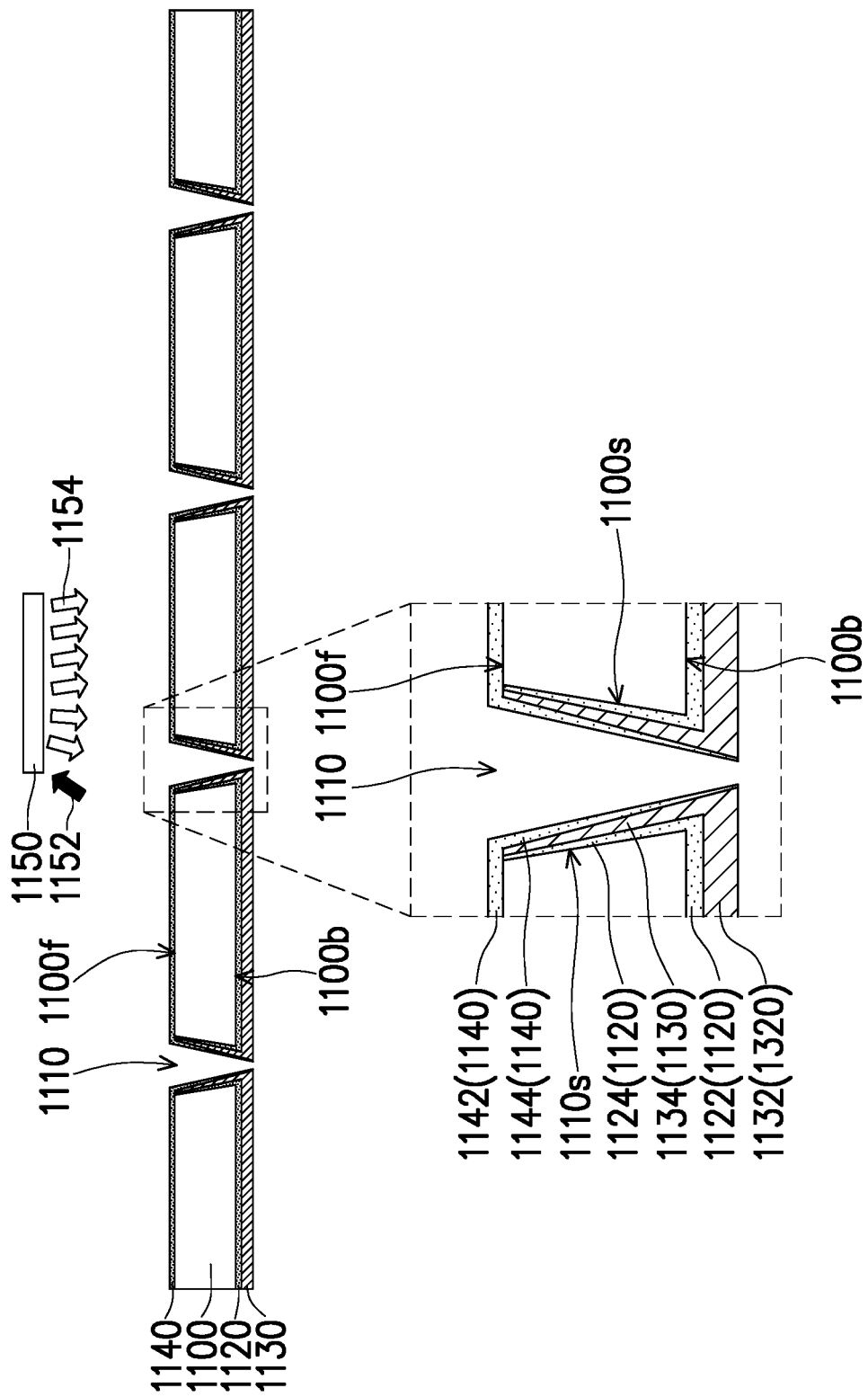

In FIG. 7B, the material of a frontside barrier layer 1140 is sputtered on the frontside surface 1100f of the substrate 1100 and on the backside seed layer 1130 on the sidewalls 1110s of the through holes 1110 (step S1034 in FIG. 6). For example, one or more sputtering targets 1150 are hit with high energy incident atoms or ions 1152 to eject sputtered material 1154 which is then deposited on the substrate 1100. It should be noted that while a single target 1150 is illustrated in FIG. 7B, the disclosure is not limited thereto. For example, depending on the desired composition of the frontside barrier layer 1140, multiple sputtering targets 1150 may be used. In some embodiments, the frontside barrier layer 1140 includes a metallic material, such as titanium, tantalum, a nitride thereof, or a combination thereof. In some embodiments, the frontside barrier layer 1140 is a titanium-containing layer, including a titanium-based material such as titanium, titanium nitride, or a combination thereof. In some embodiments, the frontside barrier layer 1140 is a tantalum-containing layer, including a tantalum-based material such as tantalum, tantalum nitride, or a combination thereof. In some embodiments, the backside barrier layer 1120 and the frontside barrier layer 1140 have substantially the same composition.

In some embodiments, the sputtered material 1154 reaches the substrate 1100 from the side of the frontside surface 1100f. The resulting frontside barrier layer 1140 may thus include sections 1142 extending on the frontside surface 1100f of the substrate 1100 and sections 1144 extending on sections 1134 of the backside seed layer 1130 on the sidewalls 1110s of the through holes 1110. In some embodiments, a difference between the present embodiment and the embodiment of FIG. 5E lies in that the through holes 1110 have not been plugged (e.g., by the backside film 760) when the frontside barrier layer 1140 is deposited. Therefore, the frontside barrier layer 1140 may not include a section extending approximately parallel to the backside surface 1100b of the substrate 1100 to contact the backside seed layer 1130 on opposite sidewalls 1110s of the through holes 1110. That is, during the frontside sputtering process S1030, the through holes 1110 may still be at least partially open at both ends. Other aspects of the frontside barrier layer 1140 may be the same as what was previously described for the frontside barrier layer 770 of FIG. 5E.

Figure 7C:
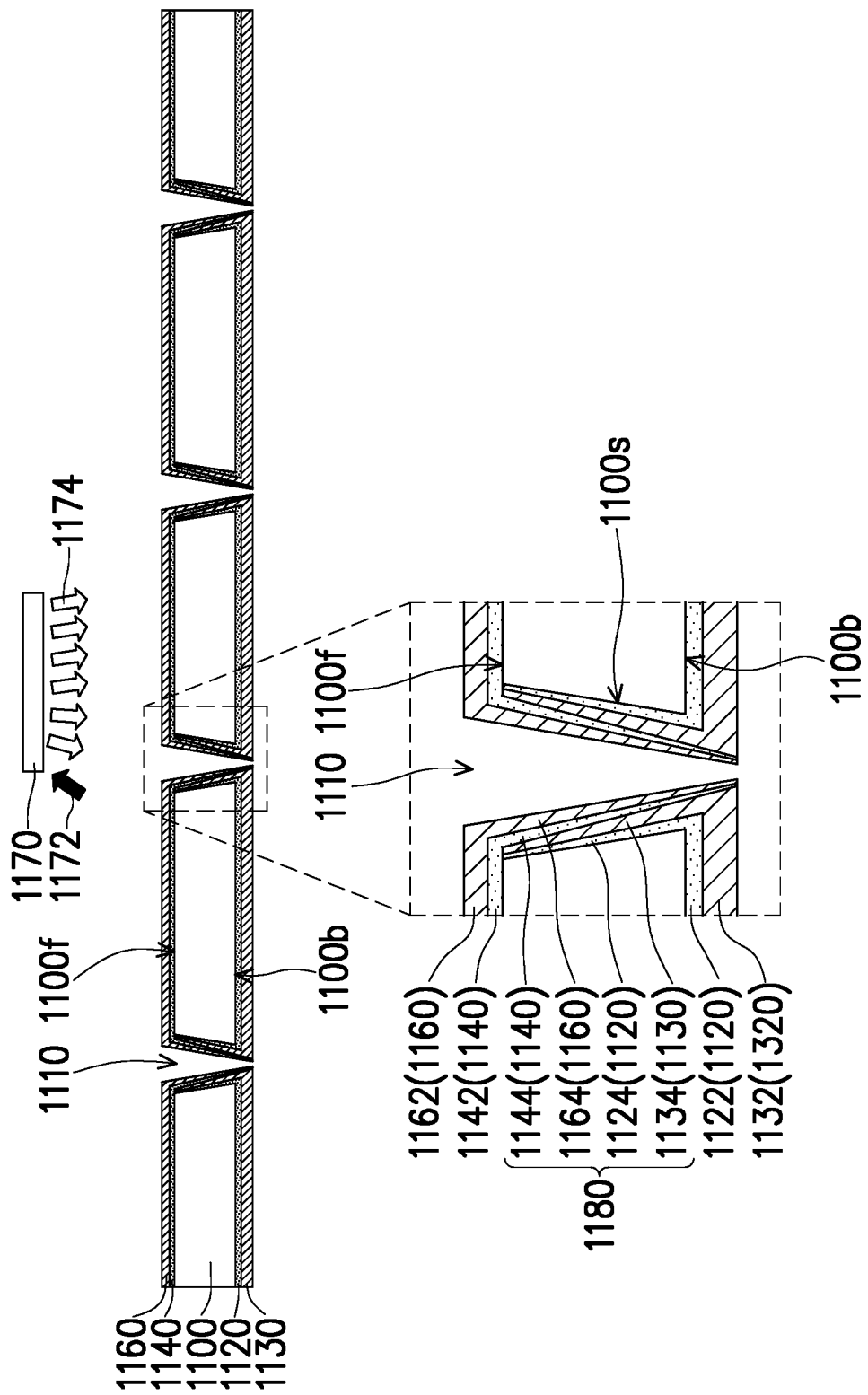

In FIG. 7C, the material of a frontside seed layer 1160 is sputtered on the frontside barrier layer 1140 (step S1036 in FIG. 6). For example, one or more sputtering targets 1170 are hit with high energy incident atoms or ions 1172 to eject sputtered material 1174 which is then deposited on the frontside barrier layer 1140. It should be noted that while a single target 1170 is illustrated in FIG. 7C, the disclosure is not limited thereto. For example, depending on the desired composition of the frontside seed layer 1160, multiple sputtering targets 1170 may be used. In some embodiments, the frontside seed layer 1160 includes a metallic material, such as copper, silver, gold, nickel, titanium, alloys thereof, a combination thereof, or the like. In some embodiments, the frontside seed layer 1160 is a copper-containing layer, including copper-based materials such as copper or copper alloys. In some embodiments, the backside seed layer 1130 and the frontside seed layer 1160 have substantially the same composition.

In some embodiments, the sputtered material 1174 reaches the substrate 1100 from the side of the frontside surface 1100f. The resulting frontside seed layer 1160 may thus include sections 1162 extending on the sections 1142 of the frontside barrier layer 1140 on the frontside surface 1100f of the substrate 1100 and sections 1164 extending on sections 1144 of the frontside barrier layer 1140 on the sidewalls 1110s of the through holes 1110. In some embodiments, a composite seed-barrier layer 1180 is thus formed along the sidewalls 1110s of the through holes 1110, similar to what was previously described for the composite seed-barrier layer 810 of FIG. 5F. In some embodiments, similar degrees of coverage as previously described for the composite seed-barrier layer 810 may be achieved also for the composite seed-barrier layer 1180. In some embodiments, a difference between the present embodiment and the embodiment of FIG. 5F lies in that the through holes 1110 have not been plugged (e.g., by the backside film 760) when the frontside seed layer 1160 is deposited. Therefore, the frontside seed layer 1160 may not include a section extending approximately parallel to the backside surface 1100b of the substrate 1100 to contact the frontside barrier layer 1140 on opposite sidewalls 1110s of the through holes 1110. That is, even after the frontside sputtering process S1030, the through holes 1110 may still be at least partially open at both ends. Other aspects of the frontside seed layer 1160 may be the same as what was previously described for the frontside seed layer 790 of FIG. 5F.

Figure 7D:
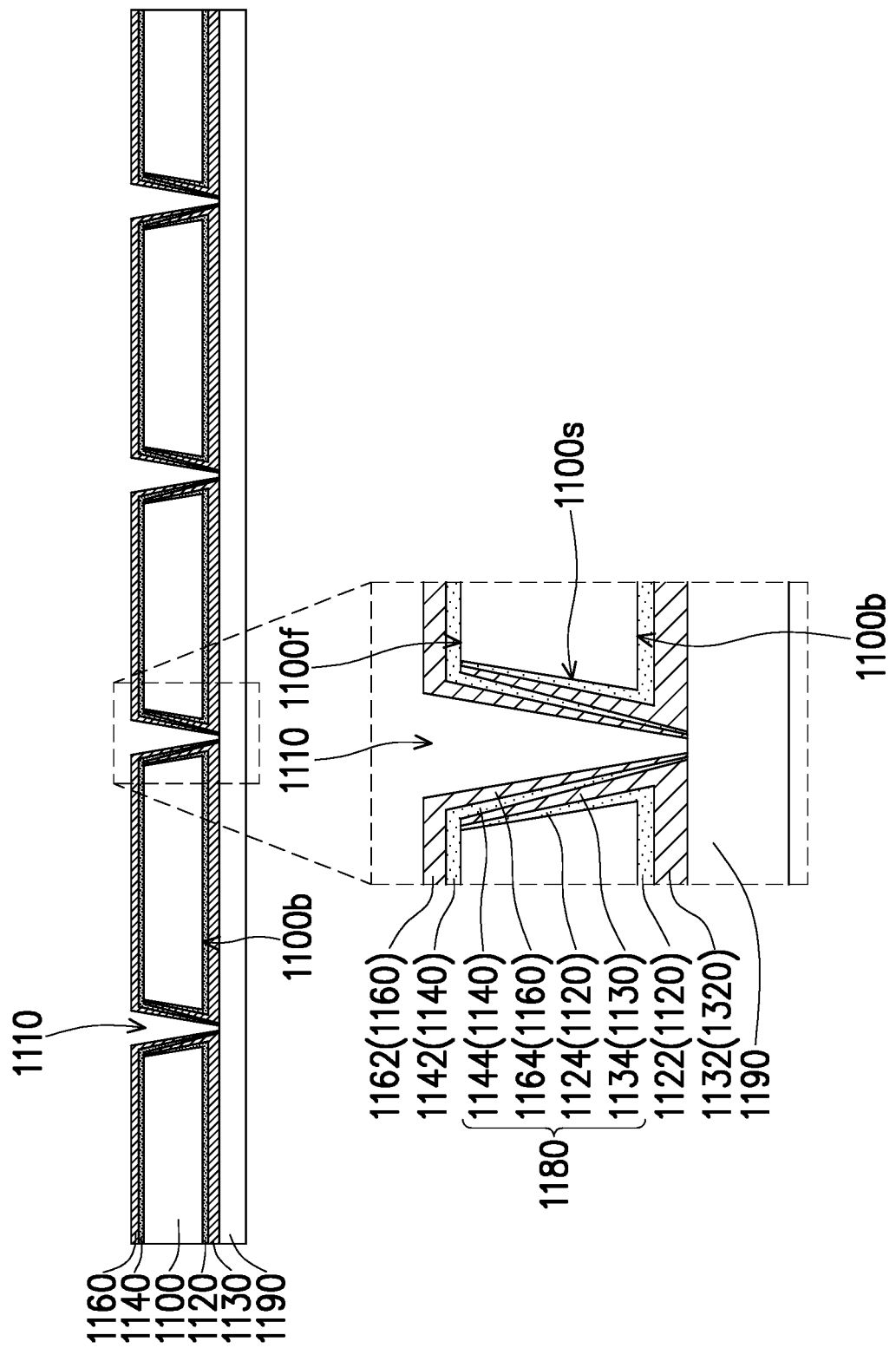

In some embodiments, after the backside sputtering process S1010 and the frontside sputtering process S1030, the substrate 1100 may be taken out of the sputtering chamber for further processing. In FIG. 7D, a backside film 1190 is bonded to the backside surface 1110b of the substrate 1100 (step S1040 in FIG. 6). The backside film 1190 may be selected from similar options as described above for the backside film 220 of FIG. 2B. In some embodiments, the backside film 1190 is adhered to the backside seed layer 1130, covering most or all of the backside surface 1100b. Most notably, the backside film 1190 extends at the bottom (the narrower ends) of the through holes 1110, so that the through holes 1110 are plugged at the side of the backside surface 1100b were the backside barrier layer 1120 and the backside seed layer 1130 have been formed. That is, the through holes 1110 may in fact be masked as blind holes by way of the backside film 1190.

Figure 7E:
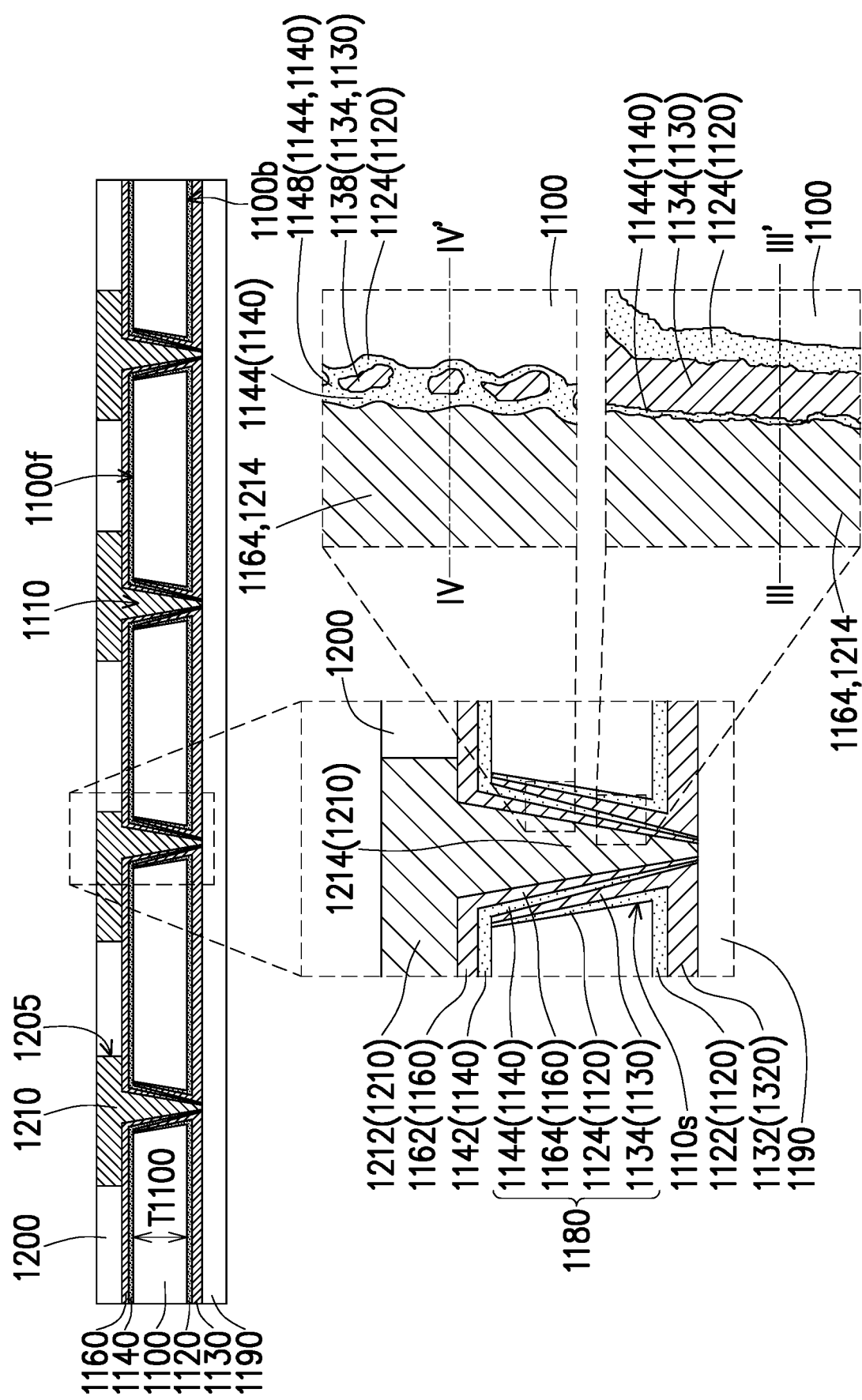
Figure 7F:
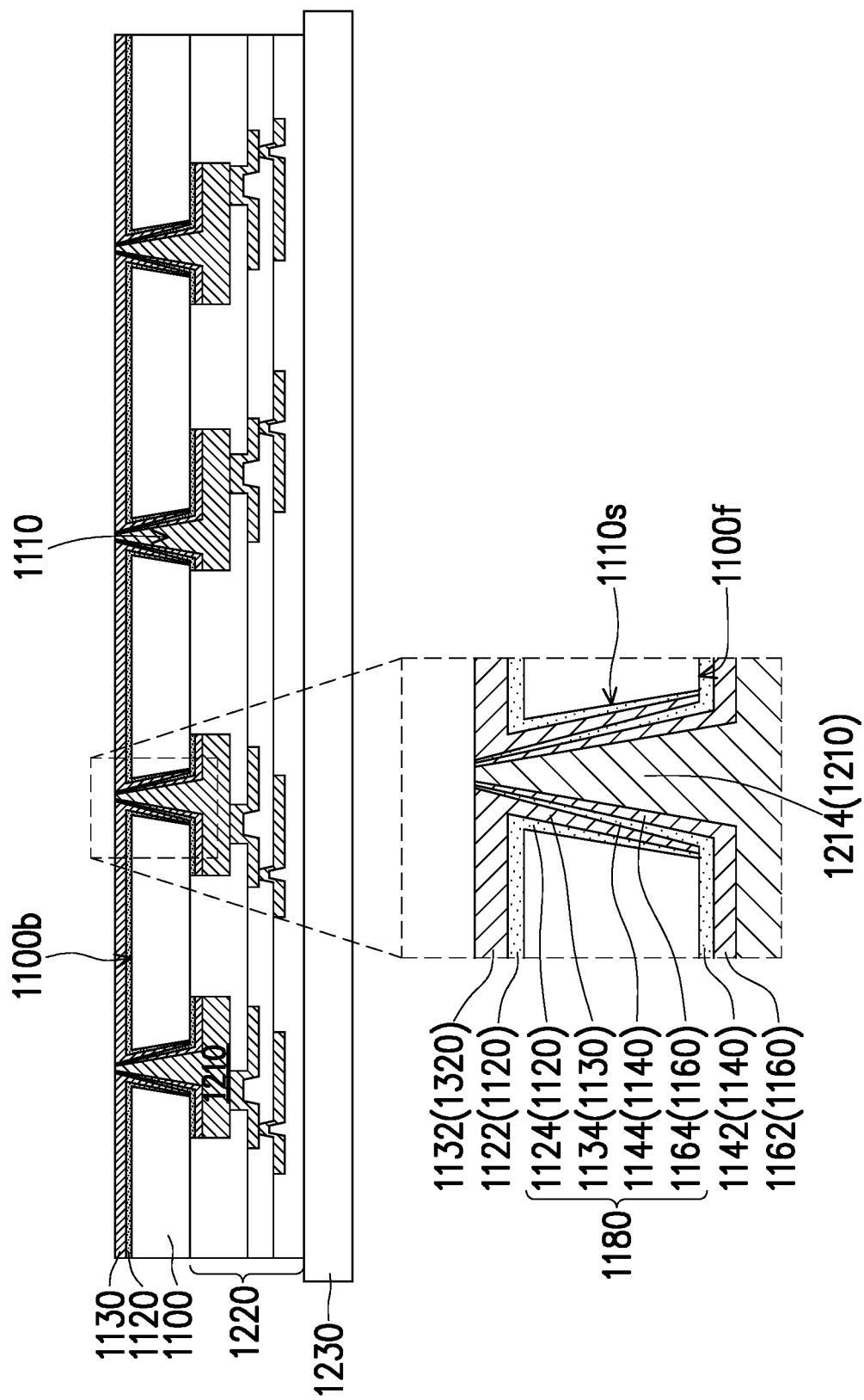

Referring to FIG. 7E and FIG. 7F, after the backside film 1190 is bonded to the substrate 1110, the frontside RDL 1220 may be formed (step S1050 in FIG. 6), for example with similar materials and processes as previously described. In FIG. 7E, a patterned mask 1200 including openings 1205 in correspondence of the through holes 1110 is formed on the frontside seed layer 1160, with similar material and processes as previously described for the patterned mask 270 with reference to FIG. 2E. Then, a conductive material is filled in the openings 1205 and the through holes 1110 to form the patterned conductive traces 1210, with similar material and processes as previously described for the patterned conductive traces 830 of FIG. 2F. In some embodiments, the patterned conductive traces 1210 include routing patterns 1212 extending on the horizontal sections 1162 of the frontside seed layer 1160, and routing vias 1214 filling the through holes 1110 in between the sidewalls 1110s. The routing vias 1214 may extend from the level height of the sections 1162 (at the bottom of the routing patterns 1212) all the way to the backside film 1190, in between the sections 1132 of the backside seed layer 1130. The routing vias 1214 and the routing patterns 1212 may be integrally formed.

The secondary insets of FIG. 7E are schematic cartoons of the spatial intensity distributions of the EDSs of the materials of the composite seed-barrier layer 1180, the conductive traces 1210, and the substrate 1100. In the examples shown in the secondary insets, the substrate 1100 is an aluminum-containing substrate, the backside seed layer 1130 and the frontside seed layer 1160 are copper-containing layers, the patterned conductive traces 1210 include copper-containing material, and the backside barrier layer 1120 and the frontside barrier layer 1140 are titanium-containing layers. The cartoons of the insets show the spatial intensity distribution of the EDSs of copper, aluminum, and titanium. In some embodiments, the composite seed-barrier layer 1110 may present different microstructures in regions at different level heights along the direction of the thickness T1100 of the substrate 1100, as previously described for the composite seed-barrier layer 810 of FIG. 5G. For example, in proximity of the bottom of the through vias 1110, the backside barrier layer 1120, the backside seed layer 1130, the frontside barrier layer 1140, and the frontside seed layer 1160 are sequentially stacked over each other, resulting in a multilayered structure as shown in the lower of the two secondary insets. Such multilayered structure may be visible, for example, at a depth corresponding to approximately 95% of the thickness T1100 of the substrate 1100. For example, if the thickness T1100 of the substrate 1100 (and hence the depth of the through holes 1110) is about 500 micrometers, the multilayered structure of the bottom inset may be visible at about 480 micrometers from the frontside surface 1100f. At the level height of the line III-III' illustrated in the lower secondary inset, the individual layers 1120, 1130, 1140, 1160 of the composite seed-barrier layer 1180 may have relative thicknesses of 3:6:1:2, respectively, where the thickness of the frontside seed layer 1160 has been obtained before depositing the conductive material of the patterned conductive traces 1210.

On the other hand, at about halfway along the through holes 1110, the composite seed-barrier layer 1180 may present a different structure, as illustrated in the upper secondary inset. Halfway along the through holes 1110 may correspond, for example, to a depth at about 50% of the thickness T1100 of the substrate 1100. For example, around the middle of the through holes 1110, the section 1124 of the backside barrier layer 1120 may cover, substantially completely, the substrate 1100, while the section 1134 of the backside seed layer 1130 may be discontinuous, presenting one or more gaps. The section 1144 of the frontside barrier layer 1140 may then fill the gaps of the backside seed layer 1130, contacting the backside barrier layer 1120. That is, the backside seed layer 1130 may be present in the form of inclusions 1138 (completely) surrounded by the material of the backside barrier layer 1120 and the material of the frontside barrier layer 1140. For example, adjacent inclusions 1138 of the backside seed layer 1130 may be separated from each other by protrusions 1148 of the frontside barrier layer 1140, which protrusions 1148 contact the backside barrier layer 1120. The frontside seed layer 1160 may continuously extend on the frontside barrier layer 1140, to seed the deposition of the conductive material of the patterned conductive traces 1210. That is, by forming the composite seed-barrier layer 1180 via dual-side sputtering, discontinuities in the seed layer first deposited (e.g., the backside seed layer 1130) may be filled by the later deposited barrier layer (e.g., the frontside barrier layer 1140), and the seed layer finally deposited (e.g., the frontside seed layer 1160) may substantially continuously line the through holes 1110 to effectively seed the subsequent deposition of conductive material. In some embodiments, in correspondence of one of the inclusions 1138 of the backside seed layer 1130, for example at the level height of the line IV-IV', the individual layers 1120, 1130, 1140, 1160 of the composite seed-barrier layer 1180 may have relative thicknesses of 1:2:2:4, respectively, where the thickness of the frontside seed layer 1160 has been obtained before depositing the conductive material of the patterned conductive traces 1210.

Referring to FIG. 7E and FIG. 7F, the patterned mask 1200 and the underlying portions of the frontside seed layer 1160 and the frontside barrier layer 1140 are removed, for example via stripping, ashing, and/or etching, as previously described with reference to FIG. 2G. The frontside seed layer 1160 and the frontside barrier layer 1140 still remain on the frontside surface 1100f of the substrate 1100 underneath the patterned conductive traces 1210. Then, the dielectric layers and the conductive layers of the frontside RDL 1220 are formed as previously described with reference to FIG. 2H and FIG. 2I. After the frontside RDL 1220 is formed, a carrier 1230 is detachably bonded to the frontside RDL 1220 at an opposite side with respect to the substrate 1100, with similar material and processes as previously described for the carrier 350 of FIG. 2J. The backside film 1190 is removed (e.g., peeled) away from the backside surface 1100b of the substrate 1100, thus exposing the sections 1162 of the backside seed layer 1162. In correspondence of the through holes 1110, the routing vias 1214 of the patterned conductive traces 1210 are exposed in between the sections 1162 of the backside seed layer 1160, substantially coplanar with the backside seed layer 1160.

Figure 7G:
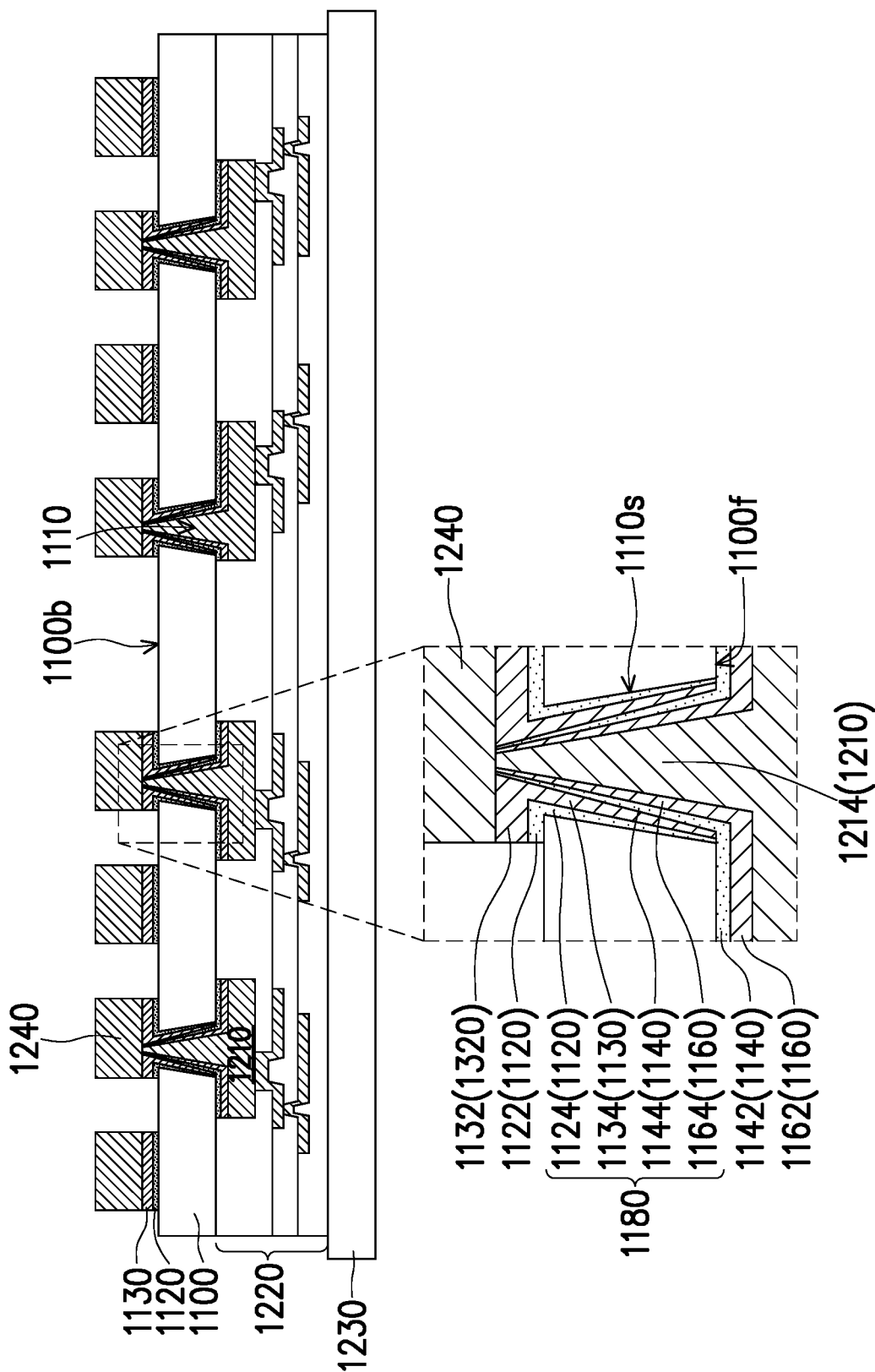
Figure 7H:
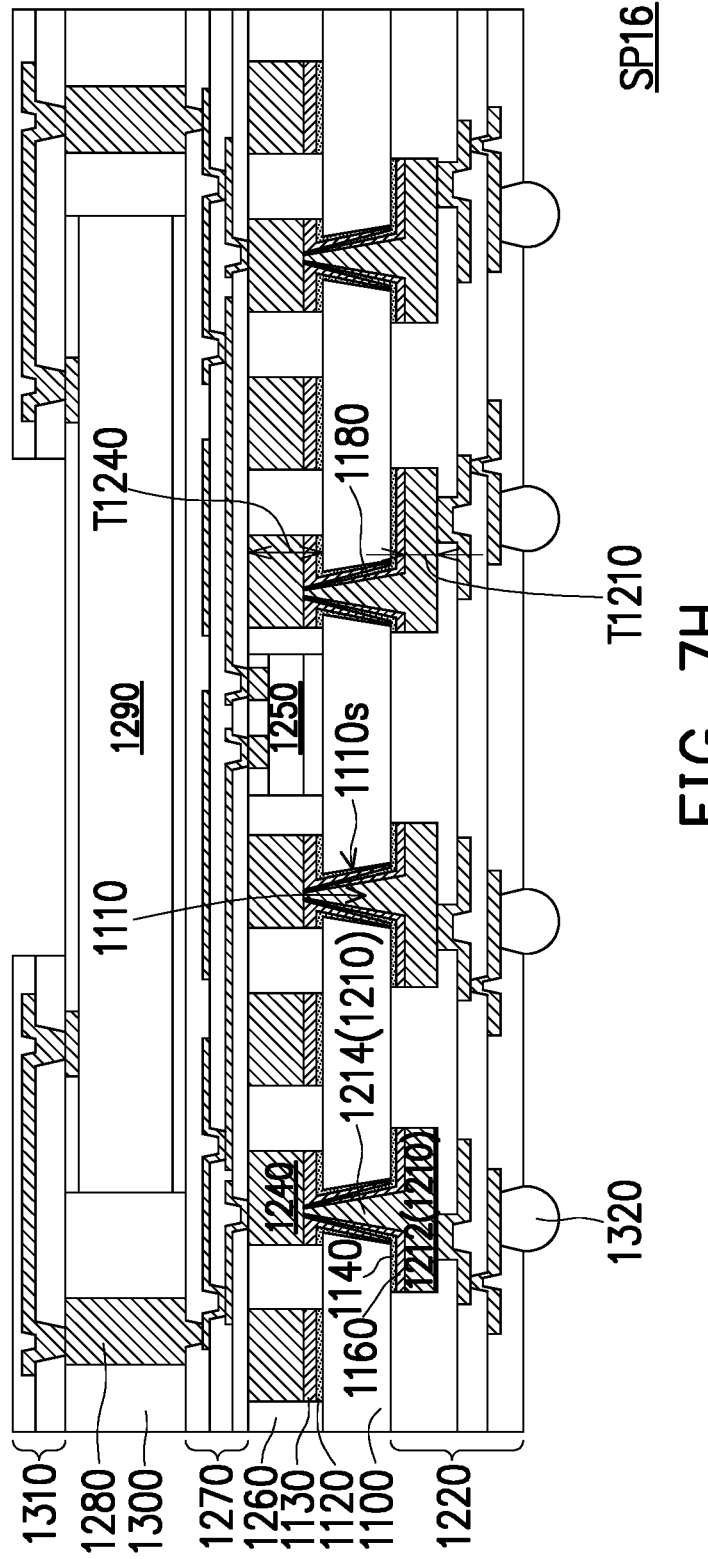

Referring to FIG. 7G and FIG. 7H, in some embodiments, a backside RDL 1270 may be formed on the backside surface 1100b (step S1060 in FIG. 6). In FIG. 7G, conductive blocks 1240 are formed on the backside seed layer 1130 following a similar process as previously described for the conductive blocks 410 with reference to FIG. 2M and FIG. 2N. The portions of backside seed layer 1130 and backside barrier layer 1120 not covered by the conductive blocks 1240 are removed to expose the backside surface 1100b of the substrate 1100, similar to what was previously described with reference to FIG. 2N, while portions of the backside seed layer 1130 and the backside barrier layer 1120 remains at the bottom of the conductive blocks 1240. As illustrated in the inset of FIG. 7G, the conductive blocks 1240 may be routing patterns extending on the backside seed layer 1130, and may be directly connected to the conductive traces 1210 filling the through holes 1110. That is, because the frontside seed layer 1160 and the frontside barrier layer 1140 are formed before the backside film 1190 (illustrated e.g., in FIG. 7E) is installed, no barrier material is disposed between the routing vias 1214 and the conductive blocks 1240, and lower contact resistance may be achieved.

In some embodiments, the semiconductor package SP16 of FIG. 7H may be obtained from the structure illustrated in FIG. 7G following similar processes as previously described with reference to FIG. 2O to FIG. 2T. Briefly, a semiconductor die 1250 may be disposed on the substrate 1100 amongst the conductive blocks 1240, as previously described for the semiconductor die 420. In some embodiments, the semiconductor die 1250 is a logic die, such as a signal processing die. In some embodiments, the conductive blocks 1240 are formed of a thickness T1240 comparable to the semiconductor die 1250, for example greater than 100 micrometers, such as in the range from 100 micrometers to 250 micrometers. In some embodiments, the conductive blocks 1240 may be thicker than the routing patterns 1212 of the patterned conductive traces 1210. For example, the thickness T1212 of the routing patterns 1212 may be in the range from 20 micrometers to 60 micrometers. In some embodiments, the encapsulant 1260 is formed on the substrate 1100 to laterally wrap the conductive blocks 1240 and the semiconductor die 1250. The backside RDL 1270 may then be formed on the encapsulated semiconductor die 1250, electrically contacting the semiconductor die 1250 and connecting the semiconductor die 1250 to the conductive blocks 1240. Through insulator vias 1280 are then formed on the backside RDL 1270, on an opposite side of the backside RDL 1270 with respect to the semiconductor die 1250 and the conductive blocks 1240. A semiconductor die 1290 may be bonded on the backside RDL 1270 amongst the TIVs 1280. The semiconductor die 1290 may be a microelectromechanical system, capable of sensing external stimuli such as radiation, sound waves, touch, pressure, or the like. The semiconductor die 1290 and the TIVs 1280 may be encapsulated in the encapsulant 1300, and the additional RDL 1310 may then be formed. The RDL 1310 may leave exposed a sensing area of the semiconductor die 1290. The semiconductor die 1290 may be connected to the conductive blocks 1240 and the semiconductor die 1250 via the RDLs 1310, 1270 and the TIVs 1280, so that signals generated by the semiconductor die 1290 in response to detected external stimuli may be transmitted to the semiconductor die 1250 for further processing. Conductive terminals 1320 may be installed on the frontside RDL 1220 at an opposite side with respect to the substrate 1100, to integrate the semiconductor package SP16 within larger devices.

Based on the process just described, it is possible to form semiconductor packages SP16 in which the redistribution structures (e.g., the frontside RDL 1220 and the backside RDL 1270 and the conductive blocks 1240) at opposite sides of the substrate 1100 are interconnected by through substrate vias (e.g., the routing vias 1214) formed in through holes 1110 of the substrate 1100. In some embodiments, a composite seed-barrier layer 1180 is formed on the sidewalls 1110s of the through holes 1110, by sputtering the backside barrier layer 1120 and the backside seed layer 1130 from the one side of the substrate 1100, and sputtering the frontside barrier layer 1140 and the frontside seed layer 1160 from the opposite side of the substrate 1100. By doing so, adequate coverage may be achieved even when the through holes 1110 have a high aspect ratio, so that the composite seed-barrier layer 1180 may effectively seed the deposition of the conductive material of the routing vias 1214 while enhancing adhesion to the substrate 1100. Furthermore, out-diffusion of the conductive material to the substrate 1100 may also be prevented or reduced. In some embodiments, by temporarily masking the through holes 1110 as blind holes by way of the backside film 1190 (illustrated, e.g., in FIG. 7E) after sputtering on the composite seed-barrier layer 1180 on the substrate 1100, the plating steps at opposite sides of the substrate 1100 may be performed at different manufacturing stages. This allows not only to build asymmetrical redistribution structures at the opposite sides of the substrate 1100, but also to use, for example, single-side plating tools rather than double-side plating tools. What is more, by bonding the backside film 1190 after the composite seed-barrier layer 1180 has been formed, the two redistribution structures may be directly connected to each other without intervening barrier material, thus lowering the resistance of the electrical connection. In some embodiments, the redistribution structures at opposite sides of the substrate 1100 may be formed through a simple sequence of steps.

In accordance with some embodiments of the disclosure, a semiconductor package includes a substrate, a composite seed-barrier layer, a routing via, and a semiconductor die. The substrate has a through hole formed therethrough. The composite seed-barrier layer extends on sidewalls of the through hole and includes a first barrier layer, a seed layer, and a second barrier layer sequentially stacked on the sidewalls of the through hole. The routing via fills the through hole and is separated from the substrate by the composite seed-barrier layer. The semiconductor die is electrically connected to the routing via. Along the sidewalls of the through holes, at a level height corresponding to half of a total thickness of the substrate, the seed layer is present as inclusions of seed material surrounded by barrier material of the first barrier layer and the second barrier layer.

In accordance with some embodiments of the disclosure, a semiconductor package includes a substrate, a barrier layer, a seed layer, a patterned conductive trace, and a conductive block. The substrate has a frontside surface and a backside surface opposite to the frontside surface and connected to the frontside surface by tapered sidewalls of the substrate. The barrier layer extends on the frontside surface and over the tapered sidewalls of the substrate. The seed layer extends on the barrier layer. The patterned conductive trace includes a routing pattern and a routing via. The routing pattern extends on a section of the seed layer disposed over the frontside surface. The routing via is formed as a single piece with the routing pattern and extends on a section of the seed layer disposed over the tapered sidewalls. The conductive block extends over the backside surface and is electrically connected to the patterned conductive trace. Sections of the barrier layer and the seed layer are disposed between the conductive block and the routing via.

In accordance with some embodiments of the disclosure, a manufacturing method of a semiconductor package includes the following steps. A first barrier material is sputtered on a substrate having through holes extending from a frontside surface to a backside surface. The first barrier material is sputtered towards the frontside surface. A first seed material is sputtered on the sputtered first barrier material towards the frontside surface. A backside film is bonded to a backside surface of the substrate. The through holes are blocked at one end by the backside film. A first conductive material is plated on the sputtered seed material after the backside film is bonded to the substrate. The plated first conductive material is formed in the through holes and over the frontside surface of the substrate. The backside film is removed after the first conductive material is plated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a substrate, having a through hole formed therethrough;
a composite seed-barrier layer, extending on sidewalls of the through hole and comprising a first barrier layer, a seed layer, and a second barrier layer sequentially stacked on the sidewalls of the through hole;
a routing via, filling the through hole and separated from the substrate by the composite seed-barrier layer; and
a semiconductor die, electrically connected to the routing via,
wherein, along the sidewalls of the through hole, at a level height corresponding to half of a total thickness of the substrate, the seed layer is present as inclusions of seed material surrounded by barrier material of the first barrier layer and the second barrier layer.

2. The semiconductor package of claim 1, wherein
the seed material comprises copper, silver, gold, nickel, titanium, alloys thereof, or a combination thereof, and
the barrier material comprises titanium, tantalum, a nitride thereof, or a combination thereof, and has a different composition than the seed material.

3. The semiconductor package of claim 1, wherein the first barrier layer and the seed layer further extend over a first surface of the substrate, and the second barrier layer further extends on a second surface of the substrate opposite to the first surface and connected to the first surface by the sidewalls of the through holes.

4. The semiconductor package of claim 3, wherein the composite seed-barrier layer further comprises another seed layer stacked on the second barrier layer.

5. The semiconductor package of claim 3, further comprising a conductive block extending over the first surface of the substrate and electrically contacting the routing via, wherein the conductive block extends on sections of the seed layer, and a section of the second barrier layer is interposed between the routing via and the conductive block.

6. The semiconductor package of claim 5, wherein the semiconductor die is disposed on the substrate beside the conductive block, and the semiconductor package further comprises:
an encapsulant, laterally wrapping the conductive block and the semiconductor die; and
conductive layers and dielectric layers extending on the encapsulated semiconductor die and conductive block, wherein the conductive layers electrically connect the conductive block to the semiconductor die.

7. The semiconductor package of claim 3, further comprising a routing pattern extending over the second surface of the substrate and being integrally formed with the routing via.

8. A semiconductor package, comprising:
- a substrate, having a frontside surface and a backside surface opposite to the frontside surface and connected to the frontside surface by tapered sidewalls of the substrate;
- a first barrier layer, extending on the frontside surface and over the tapered sidewalls of the substrate;
- a first seed layer, extending on the first barrier layer;
- a second barrier layer, extending on the backside surface of the substrate;
- a second seed layer, extending on the second barrier layer over the backside surface of the substrate;
- a patterned conductive trace, comprising a routing pattern extending on a section of the first seed layer disposed over the frontside surface and a routing via formed as a single piece with the routing pattern and extending on a section of the first seed layer disposed over the tapered sidewalls; and
- a conductive block, extending over the backside surface and electrically connected to the patterned conductive trace,
- wherein between the routing via and the tapered sidewalls are stacked, in order, the first seed layer, the first barrier layer, the second seed layer and the second barrier layer.

9. The semiconductor package of claim 8, wherein the substrate is a ceramic substrate.

10. The semiconductor package of claim 8,
- wherein a section of the first barrier layer directly contacts the second barrier layer.

11. The semiconductor package of claim 10, wherein the section of the first barrier layer directly contacts the second barrier layer at a same level height as the frontside surface of the substrate.

12. The semiconductor package of claim 8, wherein the conductive block is disposed on the second seed layer.

13. The semiconductor package of claim 8, wherein a section of the first barrier layer directly contacts the conductive block.

14. A manufacturing method of a semiconductor package, comprising:
- sputtering a first barrier material on a substrate having through holes extending from a frontside surface to a backside surface, wherein the first barrier material is sputtered towards the frontside surface;
- sputtering a first seed material on the sputtered first barrier material towards the frontside surface;
- sputtering a second barrier material on the substrate towards the backside surface of the substrate, wherein a composite seed-barrier layer comprising a first barrier layer, a seed layer and a second barrier layer sequentially extending on sidewalls of the through holes is formed;
- bonding a backside film to the backside surface of the substrate, whereby the through holes are blocked at one end by the backside film;
- plating a first conductive material on the sputtered seed material after the backside film is bonded to the substrate, whereby the plated first conductive material is formed in the through holes as routing vias and over the frontside surface of the substrate; and
- removing the backside film after the first conductive material is plated.

15. The manufacturing method of claim 14, wherein the backside film is bonded to the substrate before sputtering the first barrier material, whereby the first barrier material is also deposited on the backside film at the one end of the through holes.

16. The manufacturing method of claim 15, further comprising:
- sputtering the second barrier material on the substrate towards the backside surface of the substrate after the backside film is removed;
- sputtering a second seed material on the second barrier material towards the backside surface of the substrate; and
- plating a second conductive material on the sputtered second seed material.

17. The manufacturing method of claim 14, further comprising:
- sputtering the second barrier material on the substrate towards the backside surface of the substrate before sputtering the first barrier material; and
- sputtering a second seed material on the second barrier material towards the backside surface of the substrate before sputtering the first barrier material,
- wherein at least a portion of the first barrier material is sputtered on the second seed material.

18. The manufacturing method of claim 17, further comprising plating a second conductive material on the sputtered second seed material after the backside film is removed.

19. The manufacturing method of claim 18, wherein the backside film is bonded to the substrate after sputtering the first seed material, whereby in correspondence of the through holes, the plated first conductive material directly contacts the plated second conductive material.

20. The manufacturing method of claim 17, wherein the through holes have an aspect ratio in the range of 1.5 to 5.

* * * * *